United States Patent
Eto

(10) Patent No.: US 10,843,275 B2
(45) Date of Patent: Nov. 24, 2020

(54) NUMERICAL CONTROL SYSTEMS AND METHODS FOR DETERMINING RAW MATERIAL SHAPE AND DETERMINING A GRIPPING PART

(71) Applicant: MITSUBISHI HEAVY INDUSTRIES, LTD., Tokyo (JP)

(72) Inventor: Jun Eto, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 150 days.

(21) Appl. No.: 16/313,106

(22) PCT Filed: Jul. 14, 2017

(86) PCT No.: PCT/JP2017/025806
§ 371 (c)(1),
(2) Date: Dec. 24, 2018

(87) PCT Pub. No.: WO2018/037765
PCT Pub. Date: Mar. 1, 2018

(65) Prior Publication Data
US 2019/0160552 A1    May 30, 2019

(30) Foreign Application Priority Data
Aug. 23, 2016  (JP) .................................. 2016-162998

(51) Int. Cl.
G05B 19/4097    (2006.01)
B23B 35/00    (2006.01)
(Continued)

(52) U.S. Cl.
CPC ................ *B23B 35/00* (2013.01); *B23C 3/00* (2013.01); *G05B 19/4097* (2013.01);
(Continued)

(58) Field of Classification Search
None
See application file for complete search history.

(56) References Cited

U.S. PATENT DOCUMENTS

2003/0158621 A1    8/2003  Matsubara et al.
2007/0225847 A1*   9/2007  Pietsch ............ G05B 19/40938
                                            700/98
(Continued)

FOREIGN PATENT DOCUMENTS

EP       2590039 A1    5/2013
JP    2001034318 A    2/2001
(Continued)

OTHER PUBLICATIONS

Partial European Search Report for European Application No. 17843252.2 dated Jun. 25, 2019; 15pp.
(Continued)

*Primary Examiner* — Bernard G Lindsay
(74) *Attorney, Agent, or Firm* — Hauptman Ham, LLP

(57) ABSTRACT

In a method for generating a numerical control program, information related to the shape of a material is acquired, the shape of a flange is categorized on the basis of the acquired information related to the shape of the material, a gripping part for gripping the material during processing of the material is set on the basis of the acquired information related to the shape of the material and flange categorization information, the raw material shape necessary for processing the material is calculated on the basis of the acquired information related to the shape of the material, the flange categorization information, and gripping part setting information.

18 Claims, 38 Drawing Sheets

(51) Int. Cl.
*B23C 3/00* (2006.01)
*G05B 19/4093* (2006.01)
*G06F 30/00* (2020.01)

(52) U.S. Cl.
CPC ....... *G05B 19/40937* (2013.01); *G06F 30/00* (2020.01); *G05B 2219/35012* (2013.01); *G05B 2219/35134* (2013.01); *G05B 2219/49301* (2013.01)

(56) References Cited

U.S. PATENT DOCUMENTS

| | | | |
|---|---|---|---|
| 2009/0302496 A1 | 12/2009 | Lukis et al. | |
| 2010/0032581 A1* | 2/2010 | Grosse | B81C 99/002 250/442.11 |
| 2011/0048097 A1* | 3/2011 | Kobayashi | B21K 23/04 72/377 |
| 2011/0091297 A1 | 4/2011 | Itoh et al. | |
| 2012/0029675 A1* | 2/2012 | Matsubara | G05B 19/184 700/98 |
| 2015/0127131 A1* | 5/2015 | Herrman | G06Q 30/0283 700/98 |
| 2015/0135930 A1* | 5/2015 | Luttwak | G10D 3/04 84/307 |
| 2017/0320159 A1* | 11/2017 | Lloyd | F04D 29/644 |

FOREIGN PATENT DOCUMENTS

| | | |
|---|---|---|
| JP | 2010017769 A | 1/2010 |
| WO | 2010023761 A1 | 3/2010 |
| WO | 2015058152 A1 | 4/2015 |

OTHER PUBLICATIONS

Extended European Search Report for International Application No. PCT/JP2017/025806 dated Nov. 7, 2019; 16pp.

* cited by examiner

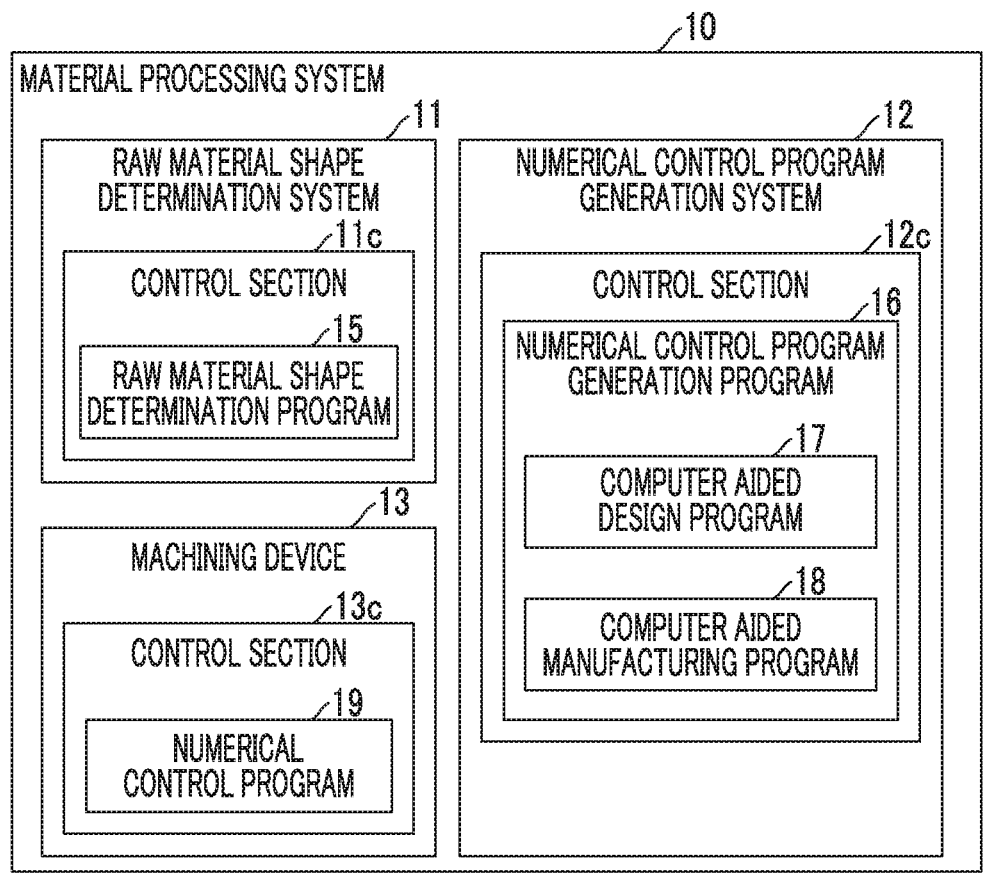
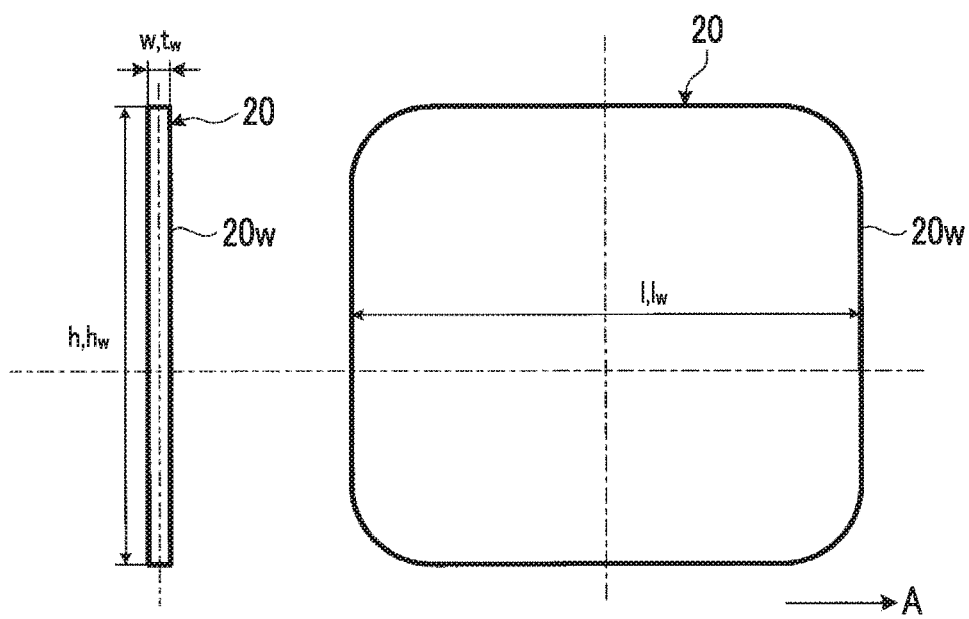

| IDENTIFICATION CONDITION | | NUMBER OF PATTERNS |
|---|---|---|
| FLANGE TYPE | L TYPE, T TYPE, COUNTERCLOCKWISE-T TYPE, "+" TYPE | 4 |
| MATERIAL SIZE | ASSUME ABOUT THREE PATTERNS FOR EACH TYPE | 3 |
| FLANGE ANGLE | 90deg or OBTUSE ANGLE | 2 |
| STEP PORTION OF FLANGE (PLATE THICKNESS CHANGE) | PRESENCE OR ABSENCE OF STEP PORTION WITH R10 (REFERENCE VALUE) OR LESS | 2 |
| MOUSE HOLE | PRESENCE OR ABSENCE OF MOUSE HOLE | 2 |
| | TOTAL | 96 |

ELEMENT DIVISION METHOD          82

| No. | ELEMENT | CUTTING PORTION PROCESSING | BORING ELEMENT |
|---|---|---|---|
| E1 | FOR TOOL PATH | O | – |
| E2 | FOR PROCESSING CONDITION SETTING | O | O |
| E3 | FLANGE END PART PROCESSING | O | O |
| E4 | FLANGE SURFACE PROCESSING | O | – |
| E5 | CROSS PART PROCESSING | O | O |
| E6 | MAIN PLATE PORTION END PART PROCESSING | O | – |
| – | MAIN PLATE PORTION SURFACE PROCESSING | O | – |

FOR ROUGING

83

| TOOL | n | SPINDLE ROTATION SPEED S min⁻¹ | FEED AMOUNT fz PER TOOTH mm/tooth | AXIAL DIRECTION CUTTING AMOUNT Ad mm | RADIAL DIRECTION CUTTING AMOUNT Rd mm |
|---|---|---|---|---|---|
| A | 1 | 15000 | 0.1 | 15 | 10 |
|   | 2 | 10000 | 0.1 | 14 | 10 |
|   | 3 | 7500 | 0.15 | 12 | 10 |
|   | 4 | 6000 | 0.15 | 10 | 10 |
| B | ... | ... | ... | ... | ... |
| ... | ... | ... | ... | ... | ... |
| ... | ... | ... | ... | ... | ... |

FOR FINISHING

84

| TOOL | n | SPINDLE ROTATION SPEED S min⁻¹ | FEED AMOUNT fz PER TOOTH mm/tooth | AXIAL DIRECTION CUTTING AMOUNT Ad mm | RADIAL DIRECTION CUTTING AMOUNT Rd mm |
|---|---|---|---|---|---|
| A | 1 | 15000 | 0.1 | 15 | 2 |
|   | 2 | 10000 | 0.1 | 14 | 2 |
|   | 3 | 7500 | 0.15 | 12 | 2 |
|   | 4 | 6000 | 0.15 | 10 | 2 |
| B | ... | ... | ... | ... | ... |
| ... | ... | ... | ... | ... | ... |
| ... | ... | ... | ... | ... | ... |

PROCESSING CONDITION CALCULATION EXAMPLE

|  | ROUGING | FINISHING |
|---|---|---|
| Rd | 15 | 2.5 |
| Max_Ad | 50 | 25 |

|  | RAW MATERIAL | AFTER ROUGING | MATERIAL |
|---|---|---|---|
| PLATE THICKNESS | 40 | 10 | 5 |
| HEIGHT | 200 | 200 | 200 |

NUMERICAL CONTROL SYSTEMS AND METHODS FOR DETERMINING RAW MATERIAL SHAPE AND DETERMINING A GRIPPING PART

RELATED APPLICATIONS

The present application is a National Phase of International Application Number PCT/JP2017/025806 filed Jul. 14, 2017 and claims priority from Japanese Application Number 2016-162998 filed Aug. 23, 2016.

TECHNICAL FIELD

The present invention relates to a raw material shape determination method, a processing method, a raw material shape determination system, and a raw material shape determination program.

BACKGROUND ART

In order to obtain a thin plate-shaped material through processing, a combination of roughing and finishing is used. A raw material for processing a thin plate-shaped material is supported at both ends, the thin plate-shaped material is divided into a plurality of regions, and the thin plate-shaped material is processed according to the rigidity of the region (refer to PTL 1).

CITATION LIST

Patent Literature

[PTL 1] Japanese Unexamined Patent Application Publication No. 2010-017769

SUMMARY OF INVENTION

Technical Problem

PTL 1 does not disclose a shape of a raw material for processing a thin plate-shaped material. Thus, in the method disclosed in PTL 1, a raw material shape required to process a thin plate-shaped material cannot be set, and a raw material shape is required to be separately set. Therefore, in the method disclosed in PTL 1, it is difficult to provide a raw material shape required to process a thin-plate material and a method of processing a material from a raw material having the shape.

The present invention has been made in light of the above description, and an object thereof is to provide a raw material shape determination method, a raw material shape determination system, and a raw material shape determination program capable of providing a raw material shape required to process a material having a predetermined shape, and a processing method of processing a material from a raw material having the shape.

Solution to Problem

In order to solve the problem, and to achieve the object, there is provided a method for determining a shape of a raw material used for processing of a material having a main plate portion which has a tabular shape, is formed to extend along an axial direction, and includes a surface element including a straight line corresponding to the longest distance between two points, and at least one flange which is formed to extend in the axial direction, and is provided to extend in a direction intersecting the surface element from the main plate portion, the method including a material information acquisition step of acquiring information regarding a shape of the material; a flange classification step of classifying the flange on the basis of the acquired information regarding the shape of the material; a grip portion setting step of setting a grip portion to be gripped during processing of the material at one end part of the main plate portion on the basis of the acquired information regarding the shape of the material and classification information of the flange in the flange classification step; and a raw material shape calculation step of calculating a shape of the raw material on the basis of the information regarding the shape of the material acquired in the material information acquisition step, the classification information of the flange in the flange classification step, and setting information of the grip portion in the grip portion setting step.

According to this configuration, since the flange classification step and the grip portion setting step are performed such that the grip portion is set at an end part of the main plate portion according to the flange, and then a shape of the raw material is calculated in the raw material shape calculation step, it is possible to provide a raw material shape required to process a material having a predetermined shape.

In this configuration, preferably, in the flange classification step, the flange present on one surface side at one end part of the main plate portion is classified as an L type flange, the flange present on both surface sides at one end part of the main plate portion is classified as a T type flange, the flange present on one surface side other than end parts of the main plate portion is classified as a counterclockwise-T flange, and the flange present on both surface sides other than the end parts of the main plate portion is classified as a "+" type flange. According to this configuration, the grip portion can be more accurately set in the subsequent grip portion setting step, and thus it is possible to provide a more accurate raw material shape required to process a material having a predetermined shape.

In the configuration of specifically classifying the flange, preferably, in the grip portion setting step, in a case where the L type flange or the T type flange is provided at both end parts of the main plate portion, the grip portion is set at one end part of the main plate portion; in a case where the L type flange or the T type flange is provided at one end part of the main plate portion, the grip portion is set at an end part of the main plate portion not having the L type flange or the T type flange; and, in a case where the L type flange or the T type flange is not provided, the grip portion is set at an end part of the main plate portion far from the "+" type flange, or at an end part of the main plate portion on a side on which an angle formed between the counterclockwise-T type flange and the main plate portion is a right angle or an obtuse angle. According to this configuration, the grip portion can be set at an end part of the main plate portion farthest from a predetermined flange, and thus it is possible to provide a more accurate raw material shape required to process a material having a predetermined shape.

In this configuration, preferably, in the raw material shape calculation step, a shape of the raw material is calculated on the basis of a height, a width, and a length in the axial direction of the main plate portion, the classification information of the flange, a flange position which is a position of a basal end part of the flange in the main plate portion, a flange angle which is an angle formed between the main plate portion and the flange, a flange height which is a length from the main plate portion to a distal end part of the flange, a width and a length in the axial direction of the flange, and a position where the grip portion is set. According to this configuration, it is possible to provide a raw material shape suitable to process a material with high accuracy.

In the configuration, the raw material shape calculation step preferably includes a main plate portion raw material height calculation step of calculating a main plate portion raw material height which is a length extending in a direction orthogonal to the axial direction along the main plate portion in a main plate raw material portion which is included in the raw material and will be processed to the main plate portion, on the basis of a sum of a height of the main plate portion, a height of an excess margin which is an outer peripheral margin, a height of the grip portion, and a height of a cutting portion provided between an end part of the main plate portion and the grip portion, a main plate portion raw material length calculation step of calculating a main plate portion raw material length which is a length extending in the axial direction along the main plate portion in the main plate raw material portion, on the basis of a sum of a length of the main plate portion in the axial direction and twice the length of the excess margin, a main plate portion raw material plate thickness calculation step of calculating a main plate portion raw material plate thickness which is a length extending in a direction orthogonal to the main plate portion in the main plate raw material portion, as a length equal to or more than a product of a value obtained by subtracting the height of the grip portion from the main plate portion raw material height, and a predetermined ratio determined depending on a substance of the raw material, a flange raw material height calculation step of calculating a flange raw material height which is a length extending in a direction orthogonal to the axial direction along the flange in a flange raw material portion which is included in the raw material and will be processed to the flange, on the basis of a sum of a height of the flange and the height of the excess margin, a flange raw material length calculation step of calculating a flange raw material length which is a length extending in the axial direction along the flange in the flange raw material portion, on the basis of a sum of a length of the flange in the axial direction and twice the length of the excess margin, and a flange raw material plate thickness calculation step of calculating a flange raw material plate thickness which is a length extending in a direction orthogonal to the flange in the flange raw material portion, as a length equal to or more than a product of the flange raw material height and the predetermined ratio. According to this configuration, it is possible to provide a raw material shape suitable to process a material with high accuracy.

In the configuration of finely defining the raw material shape calculation step, the raw material shape calculation step preferably further includes a flange raw material plate thickness correction step of securing the excess margin on an end part side of the main plate portion in the flange by correcting the flange raw material plate thickness in a case where the flange is an L type flange or a T type flange. According to this configuration, it is possible to secure an appropriate excess margin on an end part side of the main plate portion of the raw material.

In the configuration of finely defining the raw material shape calculation step, the raw material shape calculation step preferably further includes a raw material height calculation step of calculating a raw material height which is a height of the raw material on the basis of the main plate portion raw material height, the flange position, a sine product of the flange raw material height and the flange angle, and a cosine product of the flange raw material plate thickness and the flange angle, a raw material length calculation step of calculating a larger length of the main plate portion raw material length and the flange raw material length as a raw material length which is a length of the raw material, and a raw material width calculation step of calculating a raw material width which is a width of the raw material on the basis of the main plate portion raw material plate thickness, a cosine product of the flange raw material height and the flange angle, and a sine product of the flange raw material plate thickness and the flange angle. According to this configuration, it is possible to provide a raw material shape suitable to process a material with higher accuracy.

In this configuration, the raw material shape calculation step preferably further includes a correction step of correcting a shape of the raw material by using a thickness of the thickest portion of the main plate portion or the flange as a width of the main plate portion or the flange in a case where the main plate portion or the flange includes any one of a curved portion, a tapered portion, and a step portion. According to this configuration, even in a case where the main plate portion or the flange includes any one of a curved portion, a tapered portion, and a step portion, it is possible to provide a raw material shape suitable to process a material with high accuracy.

In order to solve the problem, and to achieve the object, there is provided a processing method including a gripping step of gripping the raw material determined in the method for determining a raw material shape according to any one of claims 1 to 8, with the grip portion; and a cutting step of cutting the raw material in an order of a portion close to the grip portion from a portion far from the grip portion. According to this configuration, it is possible to appropriately process a material from a raw material having a raw material shape required to process the material having a predetermined shape.

In this configuration, the cutting step preferably includes a flange processing step of forming the flange by cutting a flange raw material portion which is included in the raw material and is will processed to the flange, a cross part processing step of forming a cross part between the flange and the main plate portion by cutting a cross raw material portion which is a portion where the flange raw material portion crosses a main plate raw material portion which is included in the raw material and is to be processed to the main plate portion after the flange processing step, and a main plate portion processing step of forming the main plate portion by cutting the main plate raw material portion after the cross part processing step. According to this configuration, processing is performed in an order of a portion close to the grip portion from a portion far from the grip portion, an approximate value of static rigidity of a portion closer to the grip portion than a processing region is not reduced during processing, and thus it is possible to perform processing causing a higher yield.

In the configuration of including the flange processing step, the cross part processing step, and the main plate portion processing step, in all of the flange processing step, the cross part processing step, and the main plate portion processing step, end surfaces at both ends in the axial direction are cut, and then a surface along the axial direction is cut. According to this configuration, it is possible to perform processing more quickly and more efficiently.

In the configuration of including the flange processing step, the cross part processing step, and the main plate portion processing step, preferably, in both of the flange processing step and the main plate portion processing step, during processing, a ratio of a plate thickness of the flange raw material portion or the main plate raw material portion to a height of the flange raw material portion or the main plate raw material portion changes depending on a substance of the raw material. According to this configuration, it is possible to more quickly perform processing causing a higher yield.

In the configuration of including the flange processing step, the cross part processing step, and the main plate portion processing step, preferably, in all of the flange processing step, the cross part processing step, and the main plate portion processing step, roughing which is cutting for causing the raw material to be similar to a shape of the material is performed, and finishing in which a rotational speed of a tool, a processing margin, and a processing pitch are all smaller than in the roughing and which is cutting for finishing the raw material to the shape of the material is performed after the roughing. According to this configuration, it is possible to perform processing more efficiently, more quickly, and with higher accuracy.

In the configuration of including roughing and finishing, a ratio of a processing margin in the finishing to a processing margin in the roughing preferably changes depending on a substance of the raw material. According to this configuration, it is possible to perform processing more efficiently, more quickly, and with higher accuracy.

In the configuration of including roughing and finishing, preferably, the processing method further includes a boring step of making a hole in the raw material, and the boring step is performed after performing the roughing on a region in which the hole is made and before performing the finishing on the region in which the hole is made. According to this configuration, in the boring step, boring is not required to be performed on a roughing region, and a surface which may be roughened in the boring step can be finished to a desired shape through finishing on the boring region. Thus, it is possible to perform boring quickly and with high accuracy.

In the configuration of including roughing and finishing, preferably, the processing method further includes a boring step of making a hole in the raw material, and the boring step is performed after performing the finishing on a region farther from the grip portion than a region in which the hole is made and before performing the finishing on the region in which the hole is made. According to this configuration, in the boring step, it is possible to prevent a reduction in the static rigidity during finishing before boring. Therefore, it is possible to also perform processing quickly and with high accuracy with respect to processing on a region farther from the grip portion than a boring region.

In the configuration of including roughing and finishing, preferably, the processing method further includes a depression forming step of forming a depression in the raw material, and the depression forming step is sequentially performed after the finishing in accordance with a processing pitch in the finishing on a region in which the depression is formed. According to this configuration, in the depression forming step, it is possible to prevent a reduction in the static rigidity during finishing before a depression is formed, roughing on a region in which the depression is formed, and finishing on the region in which the depression is formed. Therefore, it is possible to also perform processing quickly and with high accuracy with respect to processing on a region farther from the grip portion than the region in which the depression is formed.

In order to solve the problem, and to achieve the object, there is provided a system for determining a shape of a raw material used for processing of a material having a main plate portion which has a tabular shape, is formed to extend along an axial direction, and includes a surface element including a straight line corresponding to the longest distance between two points, and at least one flange which is formed to extend in the axial direction, and is provided to extend in a direction intersecting the surface element from the main plate portion, the system including a control section, in which the control section executes respective steps including a material information acquisition step of acquiring information regarding a shape of the material, a flange classification step of classifying the flange on the basis of the acquired information regarding the shape of the material, a grip portion setting step of setting a grip portion to be gripped during processing of the material at one end part of the main plate portion on the basis of the acquired information regarding the shape of the material and classification information of the flange in the flange classification step, and a raw material shape calculation step of calculating a shape of the raw material on the basis of the information regarding the shape of the material acquired in the material information acquisition step, the classification information of the flange in the flange classification step, and setting information of the grip portion in the grip portion setting step. According to this configuration, since the flange classification step and the grip portion setting step are performed such that the grip portion is set at an end part of the main plate portion according to the flange, and then a shape of the raw material is calculated in the raw material shape calculation step, it is possible to provide a raw material shape required to process a material having a predetermined shape.

In order to solve the problem, and to achieve the object, there is provided a program for determining a shape of a raw material used for processing of a material having a main plate portion which has a tabular shape, is formed to extend along an axial direction, and includes a surface element including a straight line corresponding to the longest distance between two points, and at least one flange which is formed to extend in the axial direction, and is provided to extend in a direction intersecting the surface element from the main plate portion, the program causing a computer to execute a material information acquisition step of acquiring information regarding a shape of the material; a flange classification step of classifying the flange on the basis of the acquired information regarding the shape of the material; a grip portion setting step of setting a grip portion to be gripped during processing of the material at one end part of the main plate portion on the basis of the acquired information regarding the shape of the material and classification information of the flange in the flange classification step; and a raw material shape calculation step of calculating a shape of the raw material on the basis of the information regarding the shape of the material acquired in the material information acquisition step, the classification information of the flange in the flange classification step, and setting information of the grip portion in the grip portion setting step. According to this configuration, since the flange classification step and the grip portion setting step are performed such that the grip portion is set at an end part of the main plate portion according to the flange, and then a shape of the raw material is calculated in the raw material shape calculation step, it is possible to provide a raw material shape required to process a material having a predetermined shape.

Advantageous Effects of Invention

According to the present invention, it is possible to provide a raw material shape determination method, a raw material shape determination system, and a raw material shape determination program capable of providing a raw material shape required to process a material having a predetermined shape, and a processing method of processing a material from a raw material having the shape.

BRIEF DESCRIPTION OF DRAWINGS

FIG. 1 is a schematic configuration diagram illustrating an example of a material processing system according to an embodiment of the present invention.

FIG. 2 is a side view illustrating an example of a material obtained through processing in the material processing system.

DESCRIPTION OF EMBODIMENTS

Figure 3:
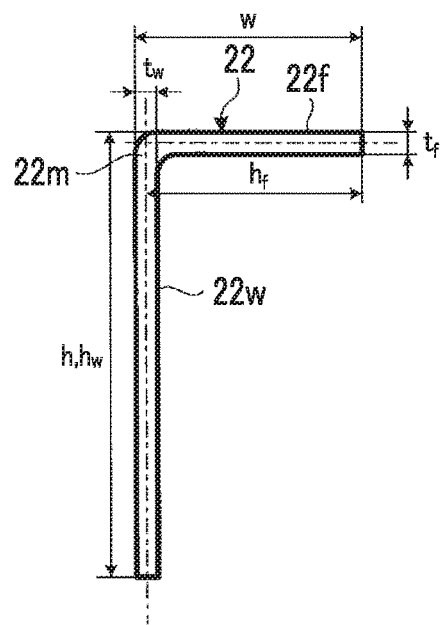
FIG. 3 is a side view illustrating an example of a material obtained through processing in the material processing system.

Hereinafter, an embodiment according to the present invention will be described with reference to the drawings. The invention is not limited to the embodiment. A constituent element in the embodiment includes constituent elements which are replaceable and are easily replaced, or a substantially identical constituent element. Constituent elements described below may be combined with each other as appropriate.

Embodiment

FIG. 1 is a schematic configuration diagram illustrating a material processing system 10 which is an example of a material processing system according to an embodiment of the present invention. As illustrated in FIG. 1, the material processing system 10 includes a raw material shape determination system 11, a numerical control program generation system 12, and a machining device 13.

The raw material shape determination system 11 includes a control section 11c. The control section 11c includes a storage unit and a processing unit. The storage unit includes, for example, storage devices such as a RAM, a ROM, and a flash memory, and stores a software program processed by the processing unit, data referred to by the software program, and the like. Specifically, the storage unit stores a raw material shape determination program 15 causing the processing unit to execute a raw material shape determination method. The storage unit also functions as a storage region in which the processing unit temporarily stores a processing result. The processing unit reads the software program or the like from the storage unit, and processes the software program, so as to realize a function corresponding to the software program. Specifically, the processing unit reads and processes the raw material shape determination program 15 stored in the storage unit, so as to execute a raw material shape determination method. An example of the raw material shape determination system 11 is a computer.

The raw material shape determination program 15 is, for example, a computer aided design (CAD) and a macro-function incorporated into the CAD. The macro-function incorporated into the CAD is, for example, a macro-function of Computer graphics Aided Three dimensional Interactive Application (CATIA) (registered trademark).

The numerical control program generation system 12 includes a control section 12c. The control section 12c includes a storage unit and a processing unit. The storage unit includes, for example, storage devices such as a RAM, a ROM, and a flash memory, and stores a software program processed by the processing unit, data referred to by the software program, and the like. Specifically, the storage unit stores a numerical control program generation program causing the processing unit to execute a numerical control program generation method. The storage unit also functions as a storage region in which the processing unit temporarily stores a processing result. The processing unit reads the software program or the like from the storage unit, and processes the software program, so as to realize a function corresponding to the software program. Specifically, the processing unit reads and processes the numerical control program generation program 16 stored in the storage unit, so as to execute a numerical control program generation method and thus to generate numerical control program (NC program) 19. The numerical control program generation system 12 is, for example, a computer.

The numerical control program generation program 16 includes a computer aided design program 17 and a computer aided manufacturing program 18. The computer aided design program 17 is, for example, a computer aided design (CAD) and a macro-function incorporated into the CAD. The macro-function incorporated into the CAD is, for example, a macro-function of Computer graphics Aided Three dimensional Interactive Application (CATIA) (registered trademark). The computer aided manufacturing program 18 is, for example, computer aided manufacturing (CAM). The numerical control program 19 is a program for controlling a processing operation in machining performed on a material.

The control section 12c is not limited to an integrated one, and may include, for example, a first control unit storing and processing the computer aided design program 17 and a second control unit storing and processing the computer aided manufacturing program 18. In other words, the numerical control program generation program 16 may be divided to be stored and executed by a plurality of control units.

The machining device 13 includes a control section 13c. The control section 13c includes a storage unit and a processing unit. The storage unit includes, for example, storage devices such as a RAM, a ROM, and a flash memory, and stores a software program processed by the processing unit, data referred to by the software program, and the like. Specifically, the storage unit stores the numerical control program 19 causing the processing unit to execute a processing method which is a processing operation in machining performed on a material. The storage unit also functions as a storage region in which the processing unit temporarily stores a processing result. The processing unit reads the software program or the like from the storage unit, and processes the software program, so as to realize a function corresponding to the software program. Specifically, the processing unit reads and processes the numerical control program 19 stored in the storage unit, so as to execute a processing method and thus to process a material. The machining device 13 is, for example, machine tools.

Examples of materials obtained through processing in the material processing system 10 will be described below. FIG. 2 is a side view illustrating a material 20 which is an example of a material 20 obtained through processing in the material processing system 10. The material 20 has a main plate portion 20w as illustrated in FIG. 2. The main plate portion 20w has a tabular shape, and is a portion which is formed to extend along an axial direction A and includes a surface element including a straight line corresponding to the longest distance between two points. The main plate portion 20w is also referred to as a web due to a widely extending shape.

In the main plate portion 20w, a height in a plane along the maximum surface element, that is, a height in a direction orthogonal to the axial direction A is $h_w$. In the main plate portion 20w, a length in the plane along the maximum surface element, that is, a length along the axial direction A is $l_w$. In the main plate portion 20w, a plate thickness in a direction orthogonal to the maximum surface element is $t_w$.

The entire height of the material 20, that is, the entire size of the material 20 along the direction of the height of the main plate portion 20w is h. In a case of the material 20, the entire height h of the material 20 is the same as the height $h_w$ of the main plate portion 20w. The entire length of the material 20, that is, the entire size of the material 20 along the direction of the length of the main plate portion 20w is l. In a case of the material 20, the entire length l of the material 20 is the same as the length $l_w$ of the main plate portion 20w. The entire width of the material 20, that is, the entire size of the material 20 along the direction of the plate thickness of the main plate portion 20w is w. In a case of the material 20, the entire width w of the material 20 is the same as the plate thickness $t_w$ of the main plate portion 20w.

The material 20 does not have a flange. The material 20 is referred to as an I type since a shape of the side surface viewed from the direction orthogonal to the axial direction A is similar to the alphabet character I. The I type material exemplified by the material 20 has a shape used as a reference of a material obtained through processing in the material processing system 10.

In addition to the material 20 illustrated in FIG. 2, in each of all materials described below, a surface element including a straight line corresponding to the longest distance between two points in the material will be referred to as the maximum surface element. Similarly, a portion which has a tabular shape, is formed to extend in the axial direction, and includes the maximum surface element in the materials will be referred to as a main plate portion. Similarly, in the main plate portion, a height in a plane along the maximum surface element, that is, a height in a direction orthogonal to the axial direction will be referred to as a height of the main plate portion. Similarly, in the main plate portion, a length in the plane along the maximum surface element, that is, a length in a direction along the axial direction will be referred to as a length of the main plate portion. Similarly, in the main plate portion, a plate thickness in a direction orthogonal to the maximum surface element will be referred to as a plate thickness of the main plate portion. Similarly, the entire size of a material along the direction of the height of the main plate portion will be referred to as the entire height of the material. Similarly, the entire size of a material along the direction of the length of the main plate portion will be referred to as the entire length of the material. Similarly, the entire size of a material along the direction of the plate thickness of the main plate portion will be referred to as the entire width of the material. Similarly, the main plate portion will be also referred to as a web due to a widely extending shape.

FIG. 3 is a side view illustrating a material 22 which is an example of a material obtained through processing in the material processing system 10. As illustrated in FIG. 3, the material 22 has a main plate portion 22w, a flange 22f, and a cross part 22m. An axial direction in the material 22 is parallel to a direction orthogonal to the drawing surface of FIG. 3. The flange 22f is a portion which is formed to extend in the axial direction, and is provided to extend in a direction intersecting the maximum surface element from the main plate portion 22w. The cross part 22m is a portion where the main plate portion 22w and the flange 22f intersect each other, and includes a circular arc portion in a side view orthogonal to the axial direction.

A height of the main plate portion 22w in the material 22, a length of the main plate portion 22w, and a plate thickness of the main plate portion 22w are given the same reference signs as those of the material 20, and are respectively $h_w$, $l_w$, and $t_w$. The length $l_w$ of the main plate portion 22w is not illustrated in FIG. 3.

In the flange 22f, a distance extending along a surface direction of the flange 22f and a direction orthogonal to the axial direction, that is, a height of the flange 22f which is a distance from the main plate portion 22w to a distal end of the flange 22f is $h_f$. In the flange 22f, a length of the flange 22f which is a distance extending along the surface direction of the flange 22f and along the axial direction is $l_f$. The length $l_f$ corresponds to and is substantially the same as the length l of the main plate portion 22w, and thus not illustrated in FIG. 3. In the flange 22f, a plate thickness of the flange 22f which is a distance along a direction orthogonal to the surface direction of the flange 22f is $t_f$.

The flange 22f is provided at a predetermined inter-surface angle with the main plate portion 22w. The predetermined inter-surface angle formed between the flange 22f and the main plate portion 22w will be referred to as a flange angle of the flange 22f. The flange 22f is provided to be orthogonal to the main plate portion 22w. In other words, a flange angle of the flange 22f is 90 degrees. The flange 22f is provided on one surface side of the main plate portion 22w, specifically, on the right side in the drawing surface of FIG. 3.

The flange 22f is provided at one end part of the main plate portion 22w, specifically, at the upper end part in the drawing surface of FIG. 3. In other words, a flange position which is a position of the flange 22f in the main plate portion 22w is an end part. A flange position in the material 22 is, specifically, a central position in the direction of the plate thickness $t_f$ of the flange 22f in the main plate portion 22w, and is calculated as a value obtained by subtracting a half of the plate thickness $t_f$ of the flange 22f from the height $h_w$ of the main plate portion 22w with the end part of the main plate portion 22w not having the flange 22f, that is, the end part on the lower side in the drawing surface of FIG. 3 as the origin, in a case where the flange 22f is provided at the end part, and a flange angle is 90 degrees.

The material 22 has the above-described configuration, and thus the entire height h of the material 22 is the same as the height $h_w$ of the main plate portion 22w. The entire length l of the material 22 is the same as a larger length of the length $l_w$ of the main plate portion 22w and the length $l_f$ of the flange 22f. The entire width w of the material 22 is the same as a sum of the half of the plate thickness t of the main plate portion 22w and the height $h_f$ of the flange 22f.

The material 22 has the flange 22f of which a flange angle is 90 degrees on one surface side of one end part of the main plate portion 22w. Thus, the material 22 will be referred to as an L type since a shape of the side surface viewed from the direction orthogonal to the axial direction is similar to the alphabet character L. The flange 22f will be referred to as an L type flange.

In addition to the material 22 illustrated in FIG. 3, in each of all materials described below, a portion which is formed to extend in the axial direction, and is provided to extend in a direction intersecting the maximum surface element from the main plate portion will be referred to as a flange. Similarly, a portion where the main plate portion and the flange intersect each other, and includes a circular arc portion in a side view orthogonal to the axial direction will be referred to as a cross part. Similarly, in the flange, a distance extending along a surface direction of the flange and a direction orthogonal to the axial direction, that is, a distance from the main plate portion to a distal end of the flange will be referred to as a height of the flange. Similarly, in the flange, a distance extending along the surface direction of the flange and along the axial direction will be referred to as a length of the flange. Similarly, in the flange, a distance along a direction orthogonal to the surface direction of the flange will be referred to as a plate thickness of the flange. Similarly, a predetermined inter-surface angle formed between the flange and the main plate portion will be referred to as a flange angle. Similarly, a central position in a direction of the plate thickness of the flange in the main plate portion will be referred to as a flange position.

Figure 4:
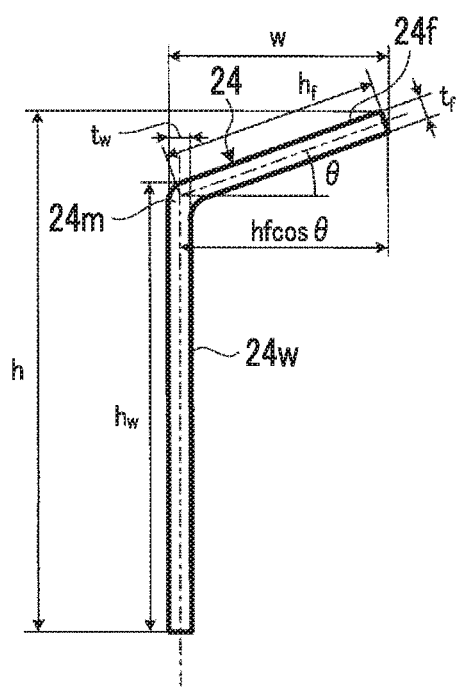
FIG. 4 is a side view illustrating an example of a material obtained through processing in the material processing system.

FIG. 4 is a side view illustrating a material 24 which is an example of a material obtained through processing in the material processing system 10. As illustrated in FIG. 4, the material 24 has a main plate portion 24w, a flange 24f, and a cross part 24m. An axial direction in the material 24 is parallel to a direction orthogonal to the drawing surface of FIG. 4. A height of the main plate portion 24w in the material 24, a length of the main plate portion 24w, and a plate thickness of the main plate portion 24w are given the same reference signs as those of the material 20 and material 22, and are respectively $h_w$, $l_w$, and $t_w$. A height of the flange 24f in the material 24, a length of the flange 24f, and a plate thickness of the flange 24f are given the same reference signs as those of the material 22, and are respectively $h_f$, $l_f$, and $t_f$. The length $l_w$ of the main plate portion 24w and the length $l_f$ of the flange 24f are not illustrated in FIG. 4.

A flange angle of the flange 24f in the material 24 is (90+θ) degrees. Here, θ is a value greater than 0 degrees and smaller than 90 degrees. The flange 24f is provided on one surface side of the main plate portion 24w, specifically, on the right side in the drawing surface of FIG. 4. The flange 24f is provided at one end part of the main plate portion 24w, specifically, at the upper end part in the drawing surface of FIG. 4. In other words, a flange position of the flange 24f is calculated as a value obtained by subtracting a product of a half of the plate thickness $t_f$ of the flange 24f and cos θ corresponding to a cosine component of the flange angle from the height $h_w$ of the main plate portion 24w with the end part of the main plate portion 24w not having the flange 24f, that is, the end part on the lower side in the drawing surface of FIG. 4 as the origin.

The material 24 has the above-described configuration, and thus the entire height h of the material 24 is the same as a sum of the height $h_w$ of the main plate portion 24w, and a product of the height $h_f$ of the flange 24f and sin θ corresponding to a sine component of the flange angle. The entire length l of the material 24 is the same as a larger length of the length $l_w$ of the main plate portion 24w and the length $l_f$ of the flange 24f. The entire width w of the material 24 is the same as a sum of a half of the plate thickness $t_w$ of the main plate portion 24w, a product $h_f$ cos θ of the height $h_f$ of the flange 24f and cos θ corresponding to a cosine component of the flange angle, and a product of a half of the plate thickness $t_f$ of the flange 24f and sin θ corresponding to a sine component of the flange angle.

The material 24 is changed from 90 degrees to (90+θ) degrees in terms of a flange angle with respect to the material 22, and is classified as an L type in the same manner as the material 22. The flange 24f is classified as an L type flange.

Figure 5:
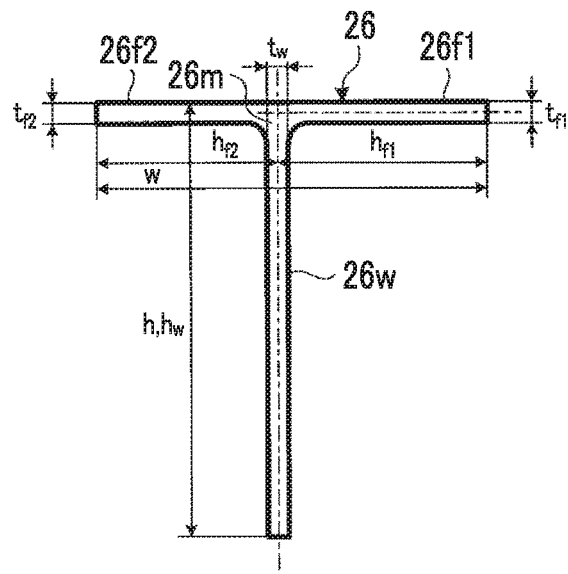
FIG. 5 is a side view illustrating an example of a material obtained through processing in the material processing system.

FIG. 5 is a side view illustrating a material 26 which is an example of a material obtained through processing in the material processing system 10. As illustrated in FIG. 5, the material 26 has a main plate portion 26w, a flange 26f1, a flange 26f2, and a cross part 26m. An axial direction in the material 26 is parallel to a direction orthogonal to the drawing surface of FIG. 5. A height of the main plate portion 26w in the material 26, a length of the main plate portion 26w, and a plate thickness of the main plate portion 26w are given the same reference signs as those of the material 20, the material 22, and the material 24, and are respectively $h_w$, $l_w$, and $t_w$. A height of the flange 26f1 in the material 26, a length of the flange 26f1, and a plate thickness of the flange 26f1 are respectively $h_{f1}$, $l_{f1}$, and $t_{f1}$. A height of the flange 26f2 in the material 26, a length of the flange 26f2, and a plate thickness of the flange 26f2 are respectively $h_{f2}$, $l_{f2}$, and $t_{f2}$. The length $l_w$ of the main plate portion 26w, the length $l_{f1}$ of the flange 26f1, and the length $l_{f2}$ of the flange 26f2 are not illustrated in FIG. 5.

A flange angle of the flange 26f1 in the material 26 is 90 degrees. A flange angle of the flange 26f2 in the material 26 is 90 degrees. The flange 26f1 is provided on one surface side of the main plate portion 26w, specifically, on the right side in the drawing surface of FIG. 5. The flange 26f2 is provided on the other surface side of the main plate portion 26w, specifically, on the left side in the drawing surface of FIG. 5. In other words, in a case where the flange 26f1 and the flange 26f2 are viewed integrally in the material 26, the flange 26f1 and the flange 26f2 are provided on both surface sides of the main plate portion 26w.

Both of the flange 26f1 and the flange 26f2 are provided at one end part of the main plate portion 26w, specifically, at the upper end part in the drawing surface of FIG. 5. In other words, a flange position of the flange 26f1 is calculated as a value obtained by subtracting a half of the plate thickness $t_{f1}$ of the flange 26f1 from the height $h_w$ of the main plate portion 26w with the end part of the main plate portion 26w not having the flange 26f1 and the flange 26f2, that is, the end part on the lower side in the drawing surface of FIG. 5 as the origin. A flange position of the flange 26f2 is calculated as a value obtained by subtracting a half of the plate thickness $t_{f2}$ of the flange 26f2 from the height $h_w$ of the main plate portion 26w with the end part of the main plate portion 26w not having the flange 26f1 and the flange 26f2, that is, the end part on the lower side in the drawing surface of FIG. 5 as the origin. In a case where the plate thickness $t_{f1}$ of the flange 26/1 is the same as the plate thickness $t_{f2}$ of the flange 26/2, a flange position of the flange 26/1 is the same as a flange position of the flange 26/2.

The material 26 has the above-described configuration, and thus the entire height h of the material 26 is the same as the height $h_w$ of the main plate portion 26w. The entire length l of the material 26 is the same as the largest length of the length $l_w$ of the main plate portion 26w, the length $l_{f1}$ of the flange 26/1, and the length $l_{f2}$ of the flange 26/2. The entire width w of the material 26 is the same as a sum of the height $h_{f1}$ of the flange 26/1 and the height $h_{f2}$ of the flange 26/2.

The material 26 has the flange 26/1 and the flange 26/2 of which a flange angle is 90 degrees on both surface sides of one end part of the main plate portion 26w. Thus, the material 26 will be referred to as a T type since a shape of the side surface viewed from the direction orthogonal to the axial direction is similar to the alphabet character T. The flange 26/1 and the flange 26/2 will also be referred to as T type flanges.

Figure 6:
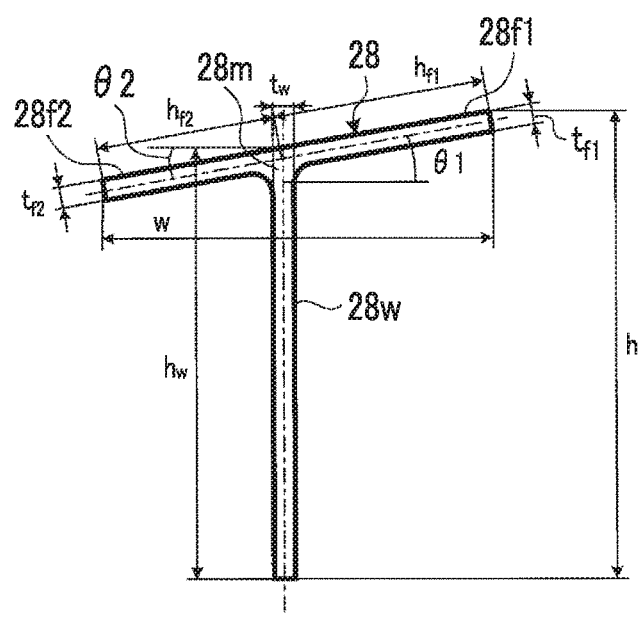
FIG. 6 is a side view illustrating an example of a material obtained through processing in the material processing system.

FIG. 6 is a side view illustrating a material 28 which is an example of a material obtained through processing in the material processing system 10. As illustrated in FIG. 6, the material 28 has a main plate portion 28w, a flange 28/1, a flange 28/2, and a cross part 28m. An axial direction in the material 28 is parallel to a direction orthogonal to the drawing surface of FIG. 6. A height of the main plate portion 28w in the material 28, a length of the main plate portion 28w, and a plate thickness of the main plate portion 28w are given the same reference signs as those of the material 20, the material 22, the material 24, and the material 26, and are respectively $h_w$, $l_w$, and $t_w$. A height of the flange 28/1 in the material 28, a length of the flange 28/1, and a plate thickness of the flange 28/1 are given the same reference signs as those of the material 26, and are respectively $h_{f1}$, $l_{f1}$, and $t_{f1}$. A height of the flange 28/2 in the material 28, a length of the flange 28/2, and a plate thickness of the flange 28/2 are given the same reference signs as those of the material 26, and respectively $h_{f2}$, $l_{f2}$, and $t_{f2}$. The length $l_w$ of the main plate portion 28w, the length $l_{f1}$ of the flange 28/1, and the length $l_{f2}$ of the flange 28/2 are not illustrated in FIG. 6.

A flange angle of the flange 28/1 in the material 28 is (90+θ1) degrees. Here, θ1 is a value greater than 0 degrees and smaller than 90 degrees. A flange angle of the flange 28/2 in the material 28 is (90−θ2) degrees. Here, θ2 is a value greater than 0 degrees and smaller than 90 degrees. The flange 28/1 is provided on one surface side of the main plate portion 28w, specifically, on the right side in the drawing surface of FIG. 6. The flange 28/2 is provided on the other surface side of the main plate portion 28w, specifically, on the left side in the drawing surface of FIG. 6. In other words, in a case where the flange 28/1 and the flange 28/2 are viewed integrally in the material 28, the flange 28/1 and the flange 28/2 are provided on both surface sides of the main plate portion 28w.

Both of the flange 28/1 and the flange 28/2 are provided at one end part of the main plate portion 28w, specifically, at the upper end part in the drawing surface of FIG. 6. In other words, a flange position of the flange 28/1 is calculated as a value obtained by subtracting a product of a half of the plate thickness $t_{f1}$ of the flange 28/1 and cos θ1 corresponding to a cosine component of the flange angle from the height $h_w$ of the main plate portion 28w with the end part of the main plate portion 28w not having the flange 28/1 and the flange 28/2, that is, the end part on the lower side in the drawing surface of FIG. 6 as the origin. In other words, a flange position of the flange 28/2 is calculated as a value obtained by subtracting a product of a half of the plate thickness $t_{f2}$ of the flange 28/2 and cos θ2 corresponding to a cosine component of the flange angle from the height $h_w$ of the main plate portion 28w with the end part of the main plate portion 28w not having the flange 28/1 and the flange 28/2, that is, the end part on the lower side in the drawing surface of FIG. 6 as the origin. In a case where the plate thickness $t_{f1}$ of the flange 28/1 is the same as the plate thickness $t_{f2}$ of the flange 28/2, and the parameter θ1 for determining the flange angle of the flange 28/1 is the same as the parameter θ2 for determining the flange angle of the flange 28/2, a flange position of the flange 28/1 is the same as a flange position of the flange 28/2.

The material 28 has the above-described configuration, and thus the entire height h of the material 28 is the same as a sum of the height $h_w$ of the main plate portion 28w, and a product of the height $h_{f1}$ of the flange 28/1 and sin θ1 corresponding to a sine component of the flange angle. The entire length l of the material 28 is the same as the largest length of the length $l_w$ of the main plate portion 28w, the length $l_{f1}$ of the flange 28/1, and the length $l_{f2}$ of the flange 28/2. The entire width w of the material 28 is the same as a sum of a product of the height $h_{f1}$ of the flange 28/1 and cos θ1 corresponding to a cosine component of the flange angle, a product of a half of the plate thickness $t_{f1}$ of the flange 28/1 and sin θ1 corresponding to a sine component of the flange angle, a product of the height $h_{f2}$ of the flange 28/2 and cos θ2 corresponding to a cosine component of the flange angle, and a product of a half of the plate thickness $t_{f2}$ of the flange 28/2 and sin θ2 corresponding to a sine component of the flange angle.

The material 28 is changed from 90 degrees to (90+θ1) and (90−θ2) degrees in terms of a flange angle with respect to the material 26, and is classified as a T type in the same manner as the material 26. The flange 28/1 and the flange 28/2 are classified as T type flanges.

Figure 7:
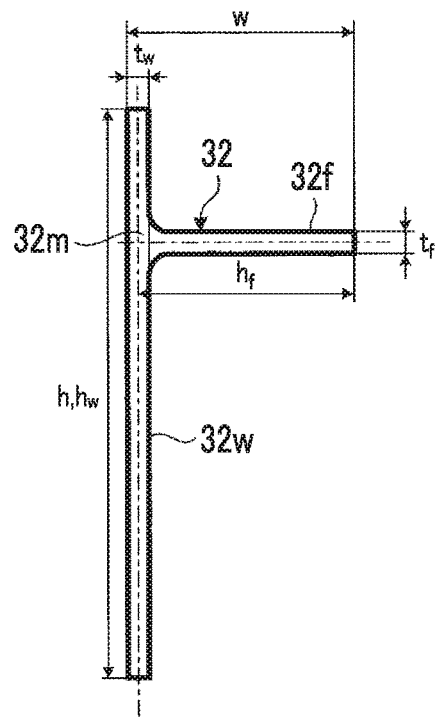
FIG. 7 is a side view illustrating an example of a material obtained through processing in the material processing system.

FIG. 7 is a side view illustrating a material 32 which is an example of a material obtained through processing in the material processing system 10. As illustrated in FIG. 7, the material 32 has a main plate portion 32w, a flange 32f, and a cross part 32m. An axial direction in the material 32 is parallel to a direction orthogonal to the drawing surface of FIG. 7. A height of the main plate portion 32w in the material 32, a length of the main plate portion 32w, and a plate thickness of the main plate portion 32w are given the same reference signs as those of the material 20, the material 22, the material 24, the material 26, and the material 28, and are respectively $h_w$, $l_w$, and $t_w$. A height of the flange 32/1 in the material 32, a length of the flange 32/1, and a plate thickness of the flange 32/1 are given the same reference signs as those of the material 22 and the material 24, and are respectively $h_f$, $l_f$, and $t_f$. The length $l_w$ of the main plate portion 32w, and the length $l_f$ of the flange 32f are not illustrated in FIG. 7.

A flange angle of the flange 32f in the material 32 is 90 degrees. The flange 32f is provided on one surface side of the main plate portion 32w, specifically, on the right side in the drawing surface of FIG. 7. The flange 32f is provided at a position other than an end part of the main plate portion 32w. In other words, a flange position of the flange 32f is calculated as a value smaller than the height $h_w$ of the main plate portion 32w with an end part of the main plate portion 32w far from the flange 32f, that is, the lower end part in the drawing surface of FIG. 7 as the origin.

The material 32 has the above-described configuration, and thus the entire height h of the material 32 is the same as the height $h_w$ of the main plate portion 32w. The entire length l of the material 32 is the same as a larger length of the length $l_w$ of the main plate portion 32w and the length $l_f$ of the flange 32f. The entire width w of the material 32 is the same as a sum of the half of the plate thickness $t_w$ of the main plate portion 32w and the height $h_f$ of the flange 32f.

The material 32 has the flange 32f of which a flange angle is 90 degrees on one surface side other than the end parts of the main plate portion 32w. Thus, the material 32 will be referred to as a counterclockwise-T type since a shape of the side surface viewed from the direction orthogonal to the axial direction is similar to a shape of a T counterclockwise-rotated by 90 degrees (hereinafter, simply referred to as a counterclockwise-T)counterclockwise-T. The flange 32f will be referred to as a counterclockwise-T type flange.

Figure 8:
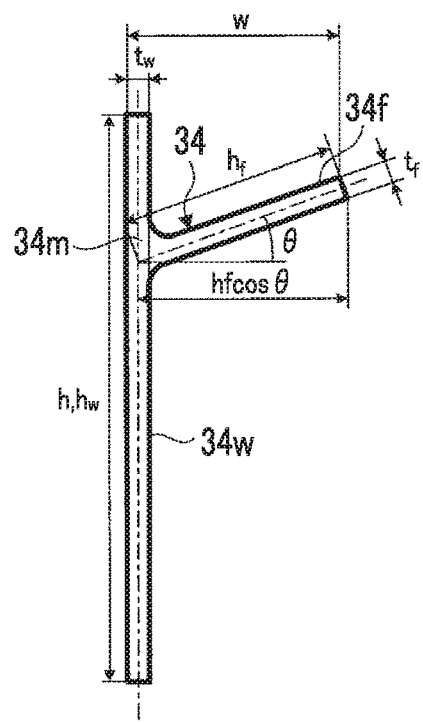
FIG. 8 is a side view illustrating an example of a material obtained through processing in the material processing system.

FIG. 8 is a side view illustrating a material 34 which is an example of a material obtained through processing in the material processing system 10. As illustrated in FIG. 8, the material 34 has a main plate portion 34w, a flange 34f, and a cross part 34m. An axial direction in the material 34 is parallel to a direction orthogonal to the drawing surface of FIG. 8. A height of the main plate portion 34w in the material 34, a length of the main plate portion 34w, and a plate thickness of the main plate portion 34w are given the same reference signs as those of the material 20, the material 22, the material 24, the material 26, the material 28, and the material 32, and are respectively $h_w$, $l_w$, and $t_w$. A height of the flange 34f in the material 34, a length of the flange 34f, and a plate thickness of the flange 34f are given the same reference signs as those of the material 22, the material 24, and the material 32, and are respectively $h_f$, $l_f$, and $t_f$. The length $l_w$ of the main plate portion 34w and the length $l_f$ of the flange 34f are not illustrated in FIG. 8.

A flange angle of the flange 34f in the material 34 is (90+θ) degrees. The flange 34f is provided on one surface side of the main plate portion 34w, specifically, on the right side in the drawing surface of FIG. 8. The flange 34f is provided at a position other than an end part of the main plate portion 34w. In other words, a flange position of the flange 34f is calculated as a value smaller than the height $h_w$ of the main plate portion 34w with an end part of the main plate portion 34w on the side on which an angle formed between the flange 34f and the main plate portion 34w is an obtuse angle, that is, the lower end part in the drawing surface of FIG. 8 as the origin.

The material 34 has the above-described configuration, and thus the entire height h of the material 34 is the same as a greater value of the height $h_w$ of the main plate portion 34w, and a value obtained by adding a product of the height $h_f$ of the flange 34f and sin θ corresponding to a cosine component of the flange angle to a product of a half of the plate thickness $t_f$ of the flange 34f and cos θ corresponding to a cosine component of the flange angle at the flange position. In other words, the entire height h of the material 34 is the same as the height $h_w$ of the main plate portion 34w in a case where the flange 34f does not protrude from one end from the main plate portion 34w in the height direction, and is the same as a value obtained by adding a product of the height $h_f$ of the flange 34f and sin θ corresponding to a sine component of the flange angle to a product of a half of the plate thickness $t_f$ of the flange 34f and cos θ corresponding to a cosine component of the flange angle at the flange position in a case where the flange 34f protrudes from one end from the main plate portion 34w in the height direction.

The entire length l of the material 34 is the same as a larger length of the length $l_w$ of the main plate portion 34w and the length $l_f$ of the flange 34f. The entire width w of the material 34 is the same as a sum of a half of the plate thickness $t_w$ of the main plate portion 34w, a product $h_f$ cos θ of the height $h_f$ of the flange 34f and cos θ corresponding to a cosine component of the flange angle, and a product of a half of the plate thickness $t_f$ of the flange 34f and sin θ corresponding to a sine component of the flange angle.

The material 34 is changed from 90 degrees to (90+θ) degrees in terms of a flange angle with respect to the material 32, and is classified as a counterclockwise-T type in the same manner as the material 32. The flange 34f is classified as a counterclockwise-T type flange.

Figure 9:
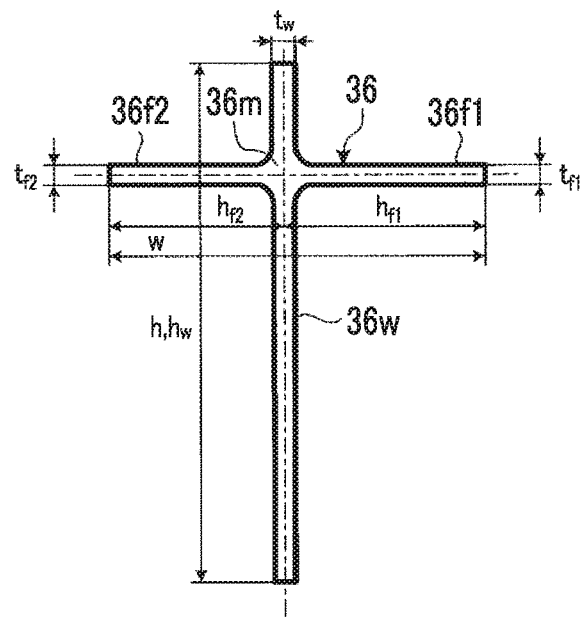
FIG. 9 is a side view illustrating an example of a material obtained through processing in the material processing system.

FIG. 9 is a side view illustrating a material 36 which is an example of a material obtained through processing in the material processing system 10. As illustrated in FIG. 9, the material 36 has a main plate portion 36w, a flange 36f1, a flange 36f2, and a cross part 36m. An axial direction in the material 36 is parallel to a direction orthogonal to the drawing surface of FIG. 9. A height of the main plate portion 36w in the material 36, a length of the main plate portion 36w, and a plate thickness of the main plate portion 36w are given the same reference signs as those of the material 20, the material 22, the material 24, the material 26, the material 28, the material 32, and the material 34, and are respectively $h_w$, $l_w$, and $t_w$. A height of the flange 36f1 in the material 36, a length of the flange 36f1, and a plate thickness of the flange 36f1 are given the same reference signs as those of the material 26 and the material 28, and are respectively $h_{f1}$, $l_{f1}$, and $t_{f1}$. A height of the flange 36f2 in the material 36, a length of the flange 36f2, and a plate thickness of the flange 36f2 are given the same reference signs as those of the material 26 and the material 28, and are respectively $h_{f2}$, $l_{f2}$, and $t_{f2}$. The length $l_w$ of the main plate portion 36w, the length $l_{f1}$ of the flange 36f1, and the length $l_{f2}$ of the flange 36f2 are not illustrated in FIG. 9.

A flange angle of the flange 36f1 in the material 36 is 90 degrees. A flange angle of the flange 36f2 in the material 36 is 90 degrees. The flange 36f1 is provided on one surface side of the main plate portion 36w, specifically, on the right side in the drawing surface of FIG. 9. The flange 36f2 is provided on the other surface side of the main plate portion 36w, specifically, on the left side in the drawing surface of FIG. 9. In other words, in a case where the flange 36f1 and the flange 36f2 are viewed integrally in the material 36, the flange 36f1 and the flange 36f2 are provided on both surface sides of the main plate portion 36w.

Both of the flange 36f1 and the flange 36f2 are provided at positions other than end parts of the main plate portion 36w. In other words, both of flange positions of the flange 36f1 and the flange 36f2 are calculated as values smaller than the height $h_w$ of the main plate portion 36w with an end part of the main plate portion 36w far from the flange 36f1 and the flange 36f2, that is, the lower end part in the drawing surface of FIG. 9 as the origin.

The material 36 has the above-described configuration, and thus the entire height h of the material 36 is the same as the height $h_w$ of the main plate portion 36w. The entire length l of the material 36 is the same as the largest length of the length $l_w$ of the main plate portion 36w, the length $l_{f1}$ of the flange 36f1, and the length $l_{f2}$ of the flange 36f2. The entire width w of the material 36 is the same as a sum of the height $h_{f1}$ of the flange 36f1 and the height $h_{f2}$ of the flange 36f2.

The material 36 has the flange 36f1 and the flange 36f2 of which a flange angle is 90 degrees on both surface sides other than the end parts of the main plate portion 36w. Thus, the material 36 will be referred to as a "+" type since a shape of the side surface viewed from the direction orthogonal to the axial direction is similar to the operator "+". The flange 36f1 and the flange 36f2 will also be referred to as "+" type flanges.

Figure 10:
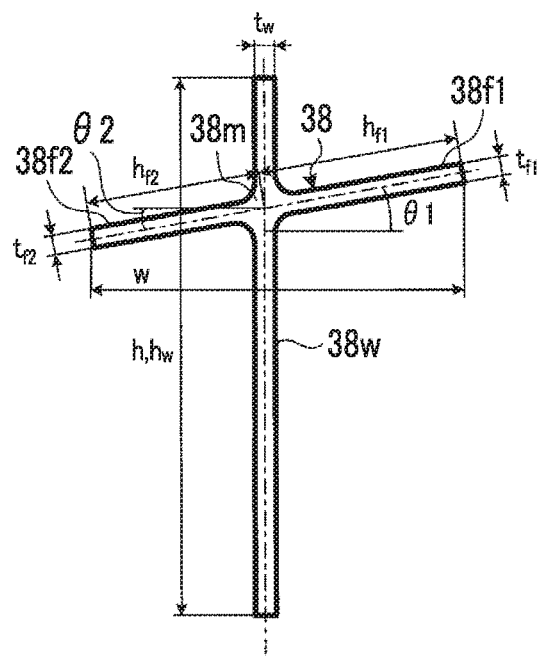
FIG. 10 is a side view illustrating an example of a material obtained through processing in the material processing system.

FIG. 10 is a side view illustrating a material 38 which is an example of a material obtained through processing in the material processing system 10. As illustrated in FIG. 10, the material 38 has a main plate portion 38w, a flange 38f1, a flange 38f2, and a cross part 38m. An axial direction in the material 38 is parallel to a direction orthogonal to the drawing surface of FIG. 10. A height of the main plate portion 38w in the material 38, a length of the main plate portion 38w, and a plate thickness of the main plate portion 38w are given the same reference signs as those of the material 20, the material 22, the material 24, the material 26, the material 28, the material 32, the material 34, and the material 36, and are respectively $h_w$, $l_w$, and $t_w$. A height of the flange 38f1 in the material 38, a length of the flange 38f1, and a plate thickness of the flange 38f1 are given the same reference signs as those of the material 26, the material 28, and the material 36, and are respectively $h_{f1}$, $l_{f1}$, and $t_{f1}$. A height of the flange 38f2 in the material 38, a length of the flange 38f2, and a plate thickness of the flange 38f2 are given the same reference signs as those of the material 26, the material 28, and the material 36, and are respectively $h_{f2}$, $l_{f2}$, and $t_{f2}$. The length $l_w$ of the main plate portion 38w, the length $l_{f1}$ of the flange 38f1, and the length $l_{f2}$ of the flange 38f2 are not illustrated in FIG. 10.

A flange angle of the flange 38f1 in the material 38 is (90+θ1) degrees. Here, θ1 is a value greater than 0 degrees and smaller than 90 degrees. A flange angle of the flange 38f2 in the material 38 is (90−θ2) degrees. Here, θ2 is a value greater than 0 degrees and smaller than 90 degrees. The flange 38f1 is provided on one surface side of the main plate portion 38w, specifically, on the right side in the drawing surface of FIG. 10. The flange 38f2 is provided on the other surface side of the main plate portion 38w, specifically, on the left side in the drawing surface of FIG. 10. In other words, in a case where the flange 38f1 and the flange 38f2 are viewed integrally in the material 38, the flange 38f1 and the flange 38f2 are provided on both surface sides of the main plate portion 38w.

Both of the flange 38f1 and the flange 38f2 are provided at positions other than end parts of the main plate portion 38w. In other words, both of flange positions of the flange 38f1 and the flange 38f2 are calculated as values smaller than the height $h_w$ of the main plate portion 38w with an end part of the main plate portion 38w far from the flange 38f1 and the flange 38f2, that is, the lower end part in the drawing surface of FIG. 10 as the origin.

The material 38 has the above-described configuration, and thus the entire height h of the material 38 is the same as the height $h_w$ of the main plate portion 38w in a case where the flange 38f1 does not protrude in the height direction from one end part of the main plate portion 38w, and the flange 38f2 does not protrude in the height direction from the other end part of the main plate portion 38w. In a case where the flange 38f1 protrudes in the height direction from one end part of the main plate portion 38w, and the flange 38f2 does not protrude in the height direction from the other end part of the main plate portion 38w, the entire height h of the material 38 is the same as a value obtained by adding a product of the height $h_{f1}$ of the flange 38f1 and sin θ1 corresponding to a sine component of the flange angle to a half of the plate thickness $t_{f1}$ of the flange 38f1 and cos θ1 corresponding to a cosine component of the flange angle at the flange position from the end part of the main plate portion 38w on the side on which an angle formed between the flange 38f1 and the main plate portion 38w is an obtuse angle. In a case where the flange 38f1 does not protrude in the height direction from one end part of the main plate portion 38w, and the flange 38f2 protrudes in the height direction from the other end part of the main plate portion 38w, the entire height h of the material 38 is the same as a value obtained by adding a product of the height $h_{f2}$ of the flange 38f2 and sin θ2 corresponding to a sine component of the flange angle to a half of the plate thickness $t_{f2}$ of the flange 38f2 and cos θ2 corresponding to a cosine component of the flange angle at the flange position from the end part of the main plate portion 38w on the side on which an angle formed between the flange 38f2 and the main plate portion 38w is an obtuse angle. Since the main plate portion 38w is a portion including a surface element including a straight line corresponding to the longest distance between two points, there is no case where the flange 38f1 protrudes in the height direction from one end part of the main plate portion 38w, and the flange 38f2 protrudes in the height direction from the other end part of the main plate portion 38w.

The entire length l of the material 38 is the same as the largest length of the length $l_w$ of the main plate portion 38w, the length $l_{f1}$ of the flange 38f1, and the length $l_{f2}$ of the flange 38f2. The entire width w of the material 38 is the same as a sum of a product of the height $h_{f1}$ of the flange 38f1 and cos θ1 corresponding to a cosine component of the flange angle, a product of a half of the plate thickness $t_{f1}$ of the flange 38f1 and sin θ1 corresponding to a sine component of the flange angle, a product of the height $h_{f2}$ of the flange 38f2 and cos θ2 corresponding to a cosine component of the flange angle, and a product of a half of the plate thickness $t_{f2}$ of the flange 38f2 and sin θ2 corresponding to a sine component of the flange angle.

The material 38 is changed from 90 degrees to (90+θ1) and (90−θ2) degrees in terms of a flange angle with respect to the material 36, and is classified as a "+" type in the same manner as the material 36. The flange 38f1 and the flange 38f2 are classified as "+" type flanges.

As mentioned above, the material 20, the material 22, the material 24, the material 26, the material 28, the material 32, the material 34, the material 36, and the material 38 have been described as examples of materials obtained through processing in the material processing system 10 with reference to FIGS. 2 to 10, but materials obtained through processing in the material processing system 10 are not limited thereto, and include any tabular material which is formed to extend along an axial direction, and has a main plate portion including the maximum surface element in the material, and at least one flange which is formed to extend in the axial direction, and is provided to extend in a direction intersecting the maximum surface element from the main plate portion.

Figure 11:
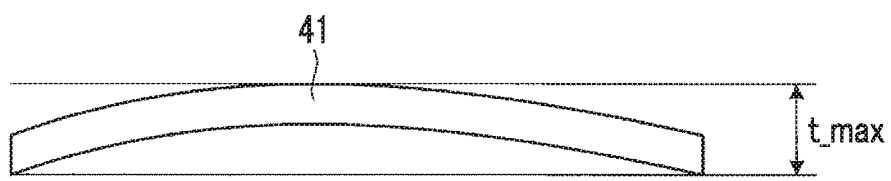
FIG. 11 is a sectional view illustrating an example of a curved portion.
Figure 12:
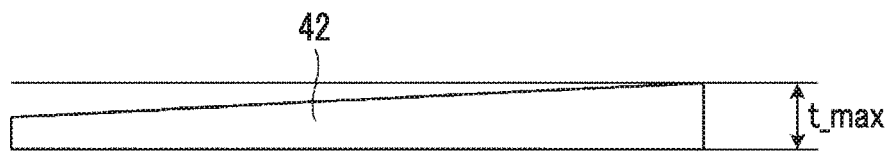
FIG. 12 is a sectional view illustrating an example of a tapered portion.
Figure 13:
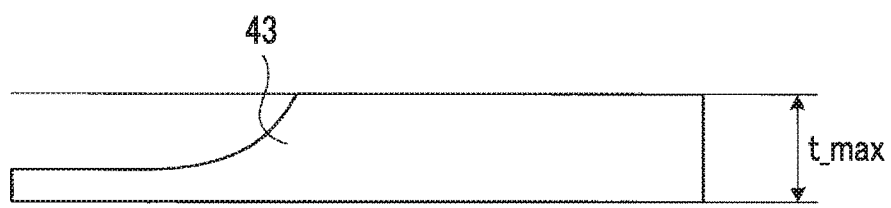
FIG. 13 is a sectional view illustrating an example of a step portion.
Figure 14:
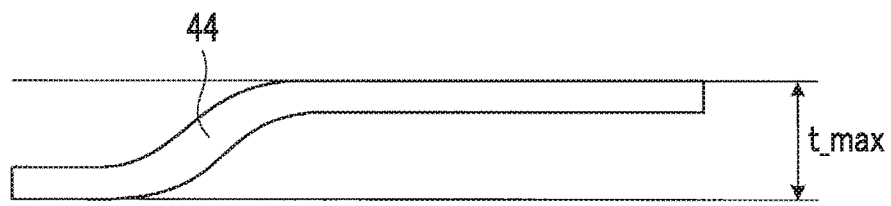
FIG. 14 is a sectional view illustrating an example of a step portion.

FIG. 11 is a sectional view illustrating a curved portion 41 which is an example of a curved portion. FIG. 12 is a sectional view illustrating a tapered portion 42 which is an example of a tapered portion. FIG. 13 is a sectional view illustrating a step portion 43 which is an example of a step portion. FIG. 14 is a sectional view illustrating a step portion 44 which is an example of a step portion. As illustrated in FIG. 11, the curved portion 41 is a portion in which a curve is formed in a plate exemplified by a main plate portion and a flange. In the curved portion 41, a difference between the highest point and the lowest point of the portion in which the curve is formed is t_max. As illustrated in FIG. 12, the tapered portion 42 is a portion in which a region where a plate thickness gradually changes is formed in a plate exemplified by a main plate portion and a flange. In the tapered portion 42, a plate thickness of the thickest portion is t_max. As illustrated in FIG. 13, the step portion 43 is a portion in which a region where a plate thickness suddenly changes is formed in a plate exemplified by a main plate portion and a flange. In the step portion 43, a plate thickness of the thickest portion is t_max. As illustrated in FIG. 14, the step portion 44 is a portion in which a sudden bending is formed in a plate exemplified by a main plate portion and a flange. In the step portion 44, a difference between the highest point and the lowest point of the portion in which the sudden bending is formed is t_max. Hereinafter, t_max in the curved portion 41 illustrated in FIG. 11, the tapered portion 42 illustrated in FIG. 12, the step portion 43 illustrated in FIG. 13, and the step portion 44 illustrated in FIG. 14 will be referred to as a thickness of the thickest part. A material obtained through processing in the material processing system 10 may include not only the above-described materials but also any one or a combination of the curved portion 41 illustrated in FIG. 11, the tapered portion 42 illustrated in FIG. 12, the step portion 43 illustrated in FIG. 13, and the step portion 44 illustrated in FIG. 14. A material obtained through processing in the material processing system 10 may include a change in the height in a direction perpendicular to each surface.

All of the above-described materials obtained through processing in the material processing system 10 may be suitably used for aircraft components exemplified by a stringer, a shear tie, and a frame.

Figure 15:
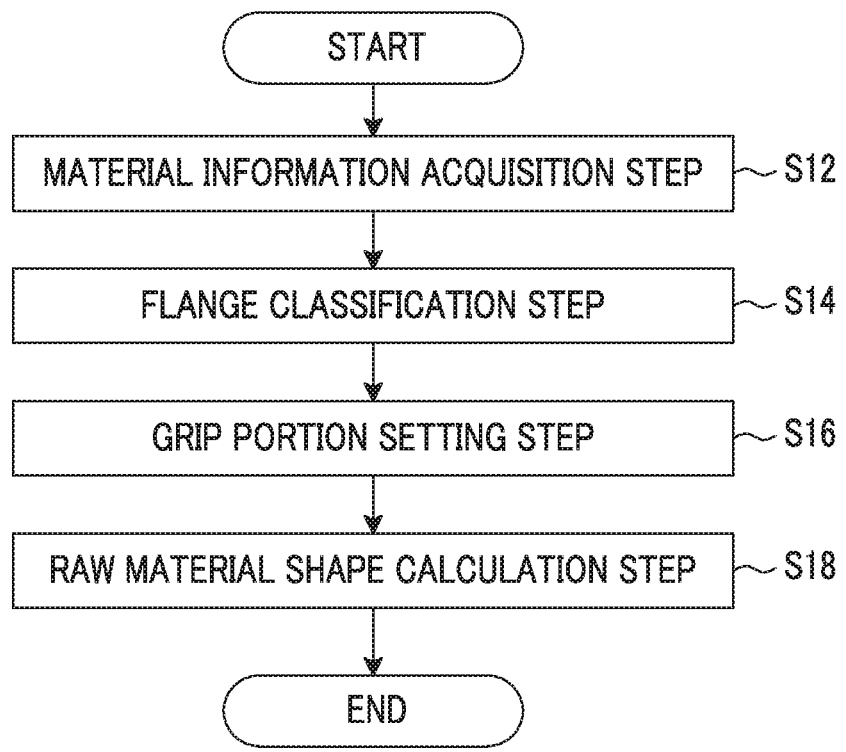
FIG. 15 is a flowchart illustrating an example of a flow of a raw material shape determination method.

Hereinafter, a description will be made of operations of the raw material shape determination system 11 and the raw material shape determination program 15. FIG. 15 is a flowchart illustrating an example of a flow of a raw material shape determination method. The raw material shape determination method is a processing method performed by the control section 11c reading and executing the raw material shape determination program 15 in the raw material shape determination system 11. The raw material shape determination method will be described with reference to FIG. 15. The raw material shape determination method includes, as illustrated in FIG. 15, material information acquisition step S12, flange classification step S14, grip portion setting step S16, and raw material shape calculation step S18. Hereinafter, material information acquisition step S12, flange classification step S14, grip portion setting step S16, and raw material shape calculation step S18 will be respectively simply referred to as step S12, step S14, step S16, and step S18 as appropriate.

First, the control section 11c acquires information regarding a shape of a material (step S12). Specifically, the control section 11c acquires design model information regarding a three-dimensional design model created for the material by using a computer aided design software exemplified by computer aided design (CAD).

Next, the control section 11c classifies a shape of a flange on the basis of the acquired information regarding the shape of the material (step S14). Specifically, for example, the control section 11c classifies the shape of the flange into the above-described L type flange, T type flange, counterclockwise-T type flange, and "+" type flange. In a case where there is no flange, the material is automatically classified as the I type in step S14.

Figure 16:
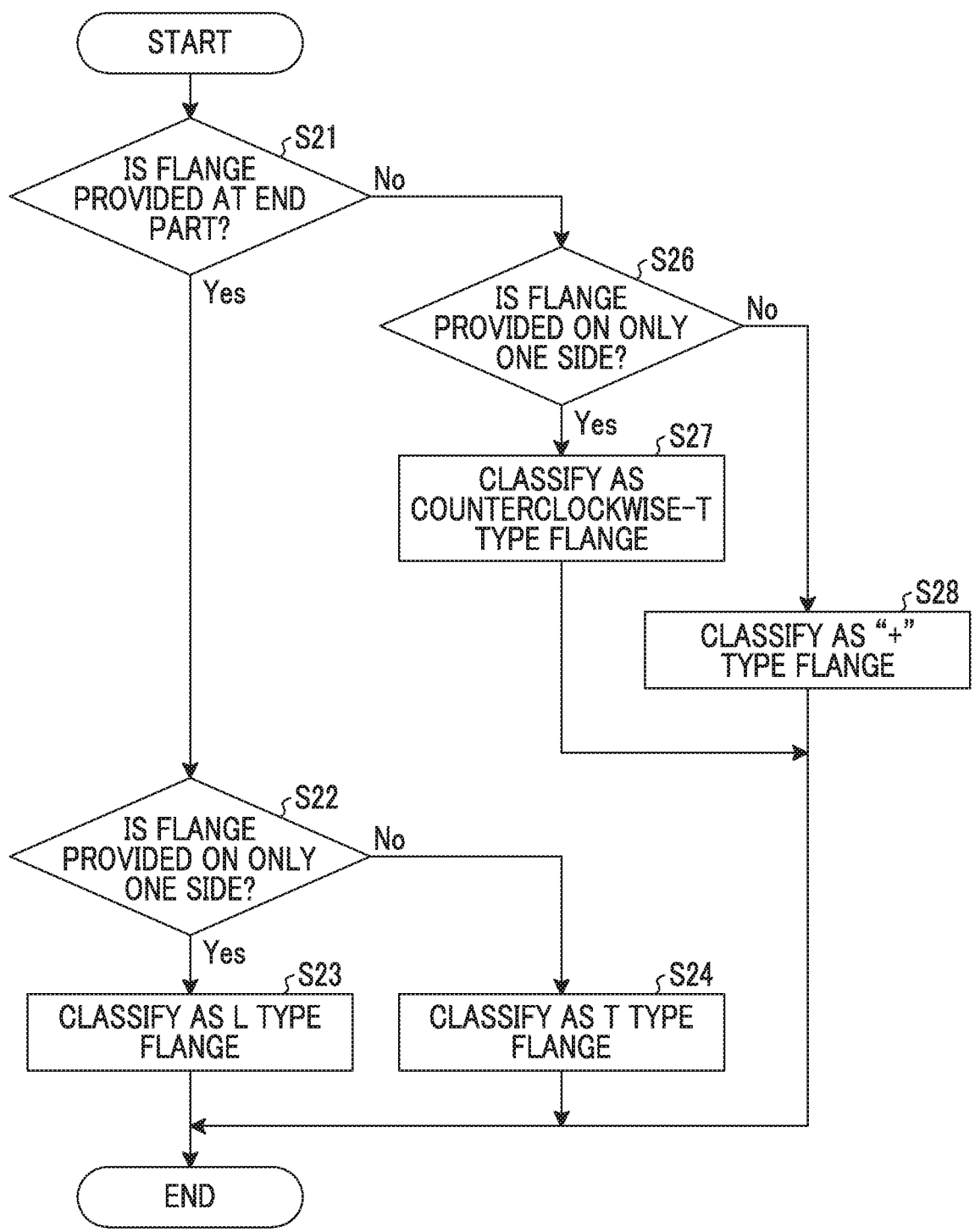
FIG. 16 is a flowchart illustrating an example of a detailed flow of a flange classification step.

The flange classification step S14 will be described below in detail. FIG. 16 is a flowchart illustrating an example of a detailed flow of flange classification step S14. Flange classification step S14 includes, as illustrated in FIG. 16, flange position determination step S21, flange installation surface determination step S22, L type flange classification step S23, T type flange classification step S24, flange installation surface determination step S26, counterclockwise-T type flange classification step S27, and "+" type flange classification step S28. Hereinafter, flange position determination step S21, flange installation surface determination step S22, L type flange classification step S23, T type flange classification step S24, flange installation surface determination step S26, counterclockwise-T type flange classification step S27, and "+" type flange classification step S28 will be respectively simply referred to as step S21, step S22, step S23, step S24, step S26, step S27, and step S28 as appropriate.

In flange classification step S14, first, the control section 11c determines whether or not a flange is provided at an end part with respect to each flange included in the acquired information of the shape of the material (step S21). In a case where the classification target flange is provided at the end part (YES in step S21), the control section 11c determines whether or not the classification target flange is provided on only one side of a main plate portion in a plate thickness direction of the main plate portion (step S22). Here, in step S22, in a case where there is a flange on an opposite side to the classification target flange such that a flange position thereof is adjacent within a predetermined distance, the control section 11c determines that the flanges are provided on both sides, regards the flanges including the classification target flange as a single flange, and performs a process. On the other hand, in step S22, in a case where there is no flange on an opposite side to the classification target flange such that a flange position thereof is adjacent within a predetermined distance, the control section 11c determines that the classification target flange is provided on only one side, and performs a process.

In a case where the classification target flange is provided at the end part (Yes in step S21), and the classification target flange is provided on only one side (Yes in step S22), the control section 11c classifies the classification target flange as an L type flange (step S23). In a case where the classification target flange is provided at the end part (Yes in step S21), and the classification target flanges are provided on both sides (No in step S22), the control section 11c classifies the classification target flange as a T type flange (step S24).

In a case where the classification target flange is not provided at the end part (No in step S21), the control section 11c determines whether or not the classification target flange is provided on only one side (step S26). Step S26 is the same process as step S22.

In a case where the classification target flange is not provided at the end part (No in step S21), and the classification target flange is provided on only one side (Yes in step S26), the control section 11c classifies the classification target flange as a counterclockwise-T type flange (step S27). In a case where the classification target flange is not provided at the end part (No in step S21), and the classification target flanges re provided on both sides (No in step S26), the control section 11c classifies the classification target flange as a "+" type flange (step S28).

In a case where flange shape classification is completed with respect to all flanges included in the acquired information regarding the shape of the material, the control section 11c finishes flange classification step S14.

Details of flange classification step S14 illustrated in FIG. 16 are only examples, and other classification methods may be used. For example, a T type flange may be regarded as two L type flanges, and a "+" type flange may be regarded as two counterclockwise-T type flanges such that flanges are classified into only the L type flange and the counterclockwise-T type flange, and other types of flanges may be separately provided, and classification may be performed.

Next, the control section 11c sets a grip portion which is gripped during processing of the material on the basis of the acquired information regarding the shape of the material and flange classification information in flange classification step S14 (step S16). For example, the control section 11c sets a grip portion to one end part of the main plate portion. In a case where it is determined that the material is of an I type in step S14, a grip portion is automatically set at one end part of the main plate portion in step S16.

Figure 17:
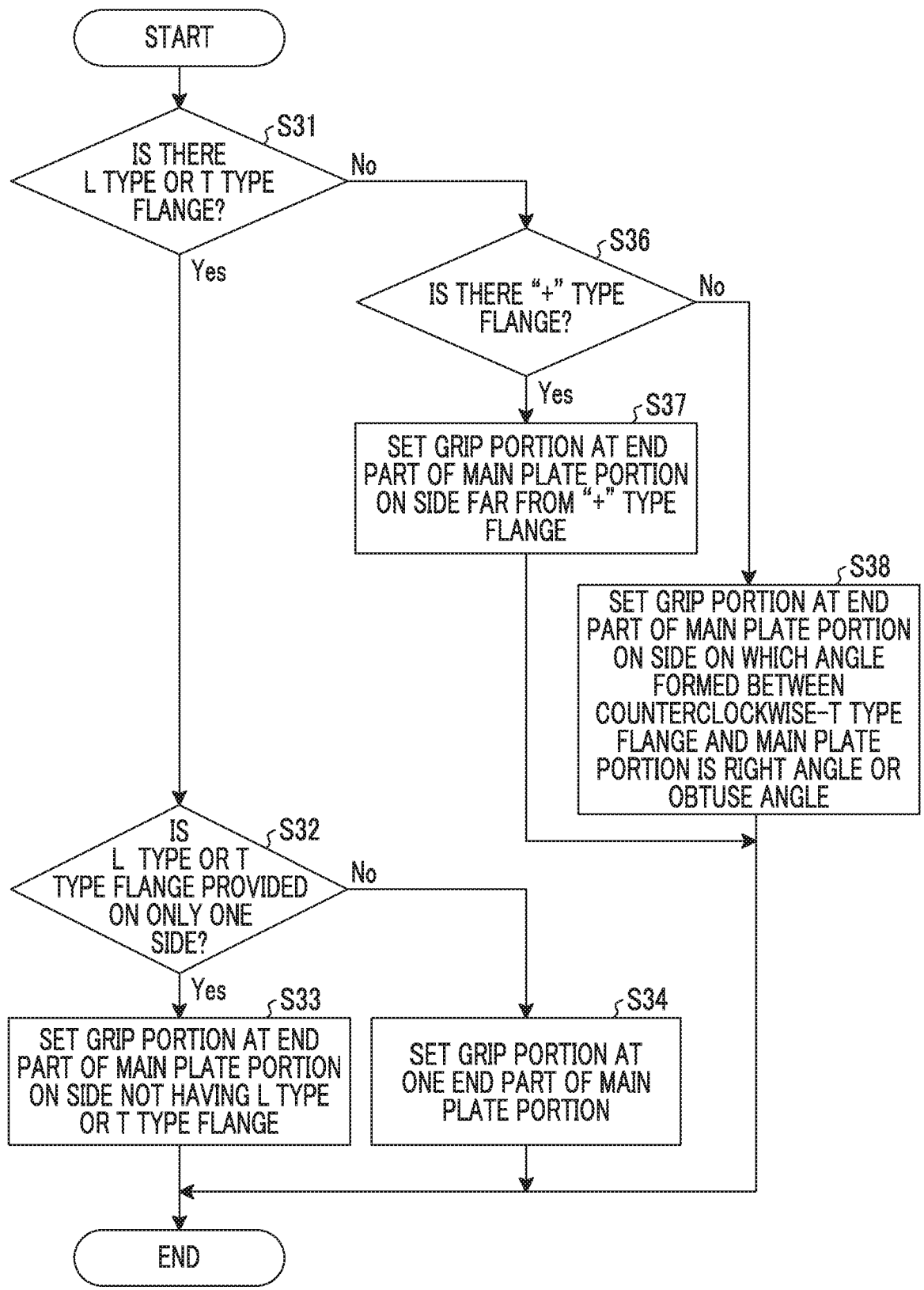
FIG. 17 is a flowchart illustrating an example of a detailed flow of a grip portion setting step.

Grip portion setting step S16 will be described below in detail. FIG. 17 is a flowchart illustrating an example of a detailed flow of grip portion setting step S16. Grip portion setting step S16 includes, as illustrated in FIG. 17, first flange information determination step S31, second flange information determination step S32, first grip portion setting step S33, second grip portion setting step S34, third flange information determination step Switch 36, third grip portion setting step S37, and fourth grip portion setting step S38. Hereinafter, first flange information determination step S31, second flange information determination step S32, first grip portion setting step S33, second grip portion setting step S34, third flange information determination step Switch 36, third grip portion setting step S37, and fourth grip portion setting step S38 will be respectively simply referred to as step S31, step S32, step S33, step S34, step Switch 36, step S37, and step S38 as appropriate.

In grip portion setting step S16, first, the control section 11c determines whether or not the flange classification information in flange classification step S14 includes an L type flange or a T type flange (step S31). In a case where the L type flange or the T type flange is included (Yes in step S31), the control section 11c determines whether or not the L type flange or the T type flange is provided at only one end part of the main plate portion (step S32). In a case where there is no L type flange or T type flange (No in step S31), the control section 11c determines whether or not a "+" type flange is included (step S36).

In a case where there is the L type flange or the T type flange (Yes in step S31), and the L type flange or the T type flange is provided at only one end part of the main plate portion (Yes in step S32), the control section 11c is set a grip portion to an end part of the main plate portion at which the L type flange or the T type flange is not provided (step S33), and finishes grip portion setting step S16. In a case where there is the L type flange or the T type flange (Yes in step S31), and the L type flange or the T type flange is provided at both end parts of the main plate portion (No in step S32), the control section 11c is set a grip portion to one end part of the main plate portion (step S34), and finishes grip portion setting step S16. In step S34, for example, it may be determined at which end part a grip portion is set on the basis of a shape of an L type flange or a T type flange provided at each end part.

In a case where there is no L type flange or T type flange (No in step S31), and there is a "+" type flange (Yes in step S36), the control section 11c sets a grip portion at an end part of the main plate portion far from the "+" type flange (step S37), and finishes grip portion setting step S16. In a case where there is no L type flange or T type flange (No in step S31), and there is no "+" type flange (No in step S36), the control section 11c sets a grip portion at an end part of the main plate portion on the side on which and angle formed between a counterclockwise-T type flange and the main plate portion is a right angle or an obtuse angle (step S38), and finishes grip portion setting step S16.

Next, the control section 11c calculates a shape of a raw material required for processing of the material on the basis of the acquired information regarding the shape of the material, the flange classification information in flange classification step S14, and grip portion setting information in grip portion setting step S16 (step S18). Specifically, the control section 11c determines a shape of a raw material by setting an excess margin which is an outer peripheral margin, a grip portion for gripping, and a cutting portion which is a portion for cutting a gap between the material obtained through processing in the material processing system 10 and a grip portion v, with respect to the shape of the material.

Figure 18:
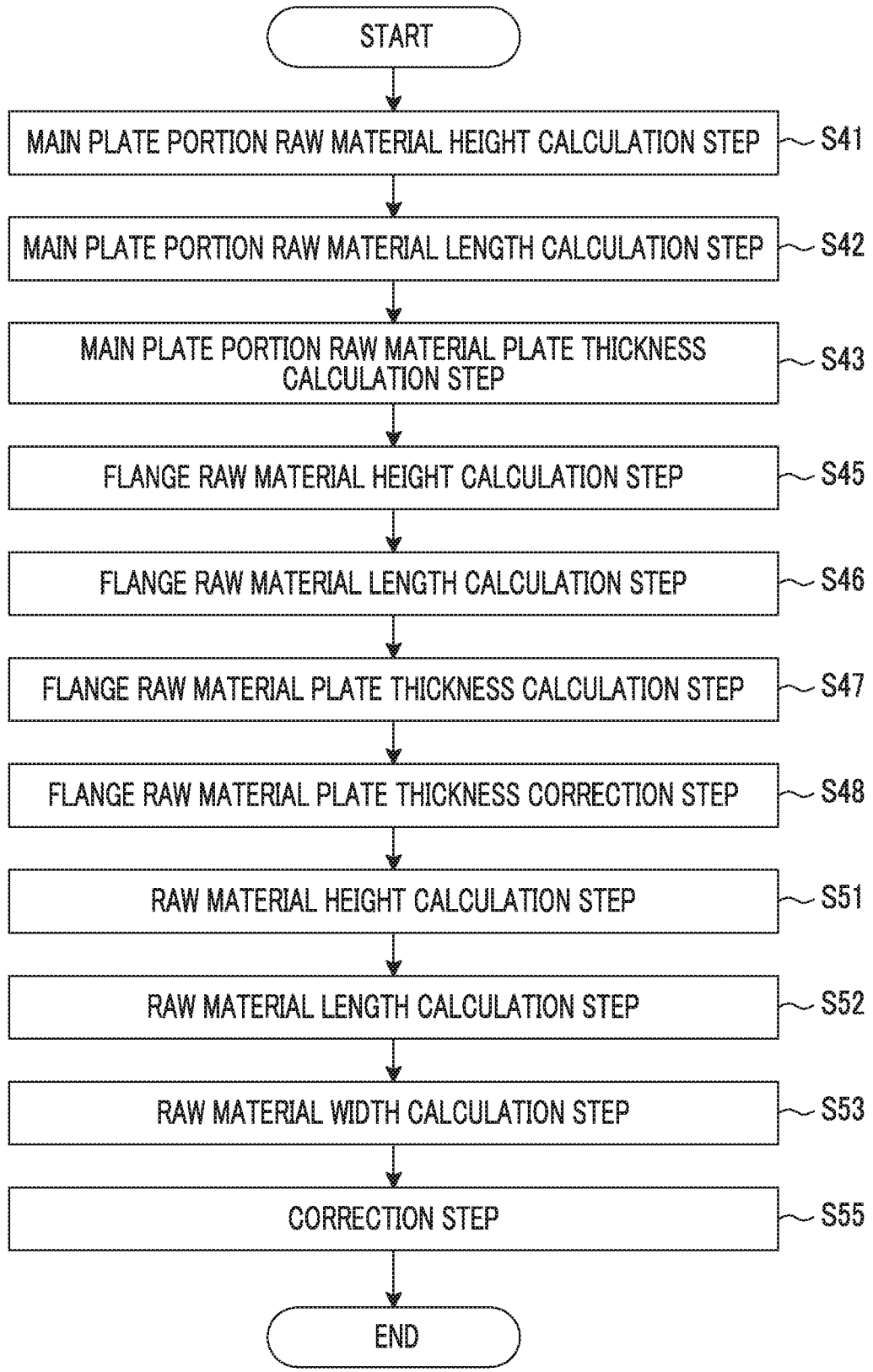
FIG. 18 is a flowchart illustrating an example of a detailed flow of a raw material shape calculation step.

Raw material shape calculation step S18 will be described below in detail. FIG. 18 is a flowchart illustrating an example of a detailed flow of raw material shape calculation step S18. Raw material shape calculation step S18 includes, as illustrated in FIG. 18, main plate portion raw material height calculation step S41, main plate portion raw material length calculation step S42, main plate portion raw material plate thickness calculation step S43, flange raw material height calculation step S45, flange raw material length calculation step S46, flange raw material plate thickness calculation step S47, flange raw material plate thickness correction step S48, raw material height calculation step S51, raw material length calculation step S52, raw material width calculation step S53, and correction step S55. Hereinafter, main plate portion raw material height calculation step S41, main plate portion raw material length calculation step S42, main plate portion raw material plate thickness calculation step S43, flange raw material height calculation step S45, flange raw material length calculation step S46, flange raw material plate thickness calculation step S47, flange raw material plate thickness correction step S48, raw material height calculation step S51, raw material length calculation step S52, raw material width calculation step S53, and correction step S55 will be respectively simply referred to as step S41, step S42, step S43, step S45, step S46, step S47, step S48, step S51, step S52, step S53, and step S55 as appropriate.

In raw material shape calculation step S18, first, the control section 11c calculates a main plate portion raw material height which is a size of the main plate portion along a height direction in a main plate raw material portion which is included in a raw material and will be processed to the main plate portion (step S41). Specifically, the control section 11c calculates the main plate portion raw material height on the basis of the height $h_w$ of the main plate portion, a size of the excess margin, a height of the grip portion, and a height of the cutting portion. For example, the control section 11c calculates the main plate portion raw material height as a sum of the height $h_w$ of the main plate portion, the size of the excess margin, the height of the grip portion, and the height of the cutting portion.

The control section 11c calculates a main plate portion raw material length which is a size of the main plate portion along a length direction in the main plate raw material portion (step S42). Specifically, the control section 11c calculates the main plate portion raw material length on the basis of the length $l_w$ of the main plate portion and the size of the excess margin. For example, the control section 11c calculates the main plate portion raw material length as a sum of the length $l_w$ of the main plate portion, an excess margin provided on one side of the main plate portion in the length direction, and an excess margin provided on the other side of the main plate portion in the length direction, that is, a sum of the length $l_w$ of the main plate portion and twice the size of the excess margin.

The control section 11c calculates a main plate portion raw material plate thickness which is a size of the main plate portion along a plate thickness direction in the main plate raw material portion (step S43). Specifically, the control section 11c calculates a main plate portion raw material plate thickness on the basis of the main plate portion raw material height calculated in step S41, the height of the grip portion, and a parameter based on a substance. For example, the control section 11c calculates the main plate portion raw material plate thickness as a length equal to or more than a product of a value obtained by subtracting the height of the grip portion from the main plate portion raw material height, and the parameter based on the substance. Here, the parameter based on the substance is a value which is predefined according to the rigidity of the substance, and is, for example, ⅕ in a case of aluminum which is suitably used for an aircraft component.

Step S41, step S42, and step S43 are all processes of calculating a size of the main plate raw material portion. In the present embodiment, the processes are performed in an order of step S41, step S42, and step S43, but are not limited thereto, the processes may be performed in an order step S42, step S41, and step S43, and the processes may be performed in an order step S41, step S43, and step S42. However, step S43 is a process using the main plate portion raw material height calculated in step S41, and is thus performed after step S41.

The control section 11c calculates a flange raw material height which is a size of the flange in a height direction along a flange raw material portion which is included in a raw material and will be processed to the flange (step S45). Specifically, the control section 11c calculates the flange raw material height on the basis of the height $h_f$ of the flange, a size of an excess margin, and a flange angle. For example, the control section 11c calculates the flange raw material height as a sum of the height $h_f$ of the flange, and a product of the size of the excess margin and cos θ corresponding to a cosine component of the flange angle.

The control section 11c calculates a flange raw material length which is a size of the flange along a length direction in the flange raw material portion (step S46). Specifically, the control section 11c calculates the flange raw material length on the basis of the length $l_f$ of the flange and a size of an excess margin. For example, the control section 11c calculates the flange raw material length as a sum of the length $l_f$ of the flange, an excess margin provided on one side of the flange in the length direction, and an excess margin provided on the other side of the flange in the length direction, that is, a sum of the length $l_f$ of the flange and twice the size of the excess margin.

The control section 11c calculates a flange raw material plate thickness which is a size of the flange along a plate thickness direction in the flange raw material portion (step S47). Specifically, the control section 11c calculates the flange raw material plate thickness on the basis of the flange raw material height calculated in step S45, the main plate portion raw material plate thickness calculated in step S43, and the parameter based on the substance. For example, the control section 11c calculates the flange raw material plate thickness as a length equal to or more than a product of a value obtained by subtracting a product of a half of the main plate portion raw material plate thickness calculated in step S43 and cos θ corresponding to a cosine component of the flange angle from the flange raw material height calculated in step S45, and the parameter based on the substance.

The control section 11c corrects the flange raw material plate thickness which is a size of the flange along the plate thickness direction in the flange raw material portion (step S48). Specifically, in a case where a size of the flange raw material portion is calculated with respect to the flange classified as an L type flange in step S23 or the flange classified as a T type flange in step S24, the control section 11c secures an excess margin on the end part side of the main plate portion by correcting the outer peripheral margin on the end part side of the main plate portion to a size of the excess margin and correcting the flange raw material plate thickness calculated in step S47 in accordance therewith in the flange raw material portion.

Step S45, step S46, step S47, and step S48 are all processes of calculating a size of the flange raw material portion. In the present embodiment, the processes are performed in an order of step S45, step S46, step S47, and step S48, but are not limited thereto, and step S46 may be performed in any order as long as an order of step S45, step S47, and step S48 is kept. In a case where step S47 and step S48 are performed after step S43, a processing order thereof may be replaced with step S41, step S42, and step S43 as appropriate.

With respect to a cross raw material portion which is included in a raw material and will be processed to a cross part, the control section 11c calculates, as appropriate, a size and a shape thereof causing the main plate raw material portion and the flange raw material portion to be smoothly connected to each other on the basis of the calculated size and shape of the main plate raw material portion and the calculated size and shape of the flange raw material portion.

The control section 11c calculates a raw material height which is a size of the raw material along the height direction of the main plate portion (step S51). Specifically, the control section 11c calculates the raw material height on the basis of the flange position and the flange angle determined in step S21, the main plate portion raw material height calculated in step S41, the flange raw material height calculated in step S45, and the flange raw material plate thickness calculated in step S47 and corrected in step S48. For example, in a case where the flanges do not protrude in the height direction from both end parts of the main plate portion, the control section 11c calculates the raw material height as a value equal to the main plate portion raw material height. In a case where the flange raw material portion protrudes from one end part of the main plate raw material portion in the height direction, the control section 11c calculates the raw material height by adding the height of the grip portion and the height of the cutting portion to a value for a flange which protrude most, for example, a flange causing a sum of the flange position, a product of the main plate portion raw material height and sin θ corresponding to a sine component of the flange angle, and a product of the flange raw material plate thickness and cos θ corresponding to a cosine component of the flange angle, to be the maximum. In a case where flanges protrude from both end parts of the main plate portion in the height direction, the control section 11c calculates the raw material height by calculating a sum of the flange position, a product of the main plate portion raw material height and sin θ corresponding to a sine component of the flange angle, and a product of the flange raw material plate thickness and cos θ corresponding to a cosine component of the flange angle, subtracting the main plate portion raw material height from the sum, and adding the height of the grip portion and the height of the cutting portion to a result thereof, with respect to each flange which protrudes most from one end part side and the other end part side.

The control section 11c calculates a raw material length which is a size along the length direction of the main plate portion in the raw material (step S52). Specifically, the control section 11c calculates the raw material length on the basis of the main plate portion raw material length calculated in step S42 and the flange raw material length calculated in step S46. For example, the control section 11c calculates the raw material length as a larger length of the main plate portion raw material length and the flange raw material length.

The control section 11c calculates a raw material width which is a size along the plate thickness direction of the main plate portion in the raw material (step S53). Specifically, the control section 11c calculates the raw material width on the basis of the flange angle, the main plate portion raw material plate thickness calculated in step S43, the flange raw material height calculated in step S45, and the flange raw material plate thickness calculated in step S47 and corrected in step S48. For example, in a case where a flange is provided on one side of the main plate portion in the plate thickness direction of the main plate portion, the control section 11c calculates the raw material width by adding a half value of the main plate portion raw material plate thickness to a value for a flange which protrude most in the plate thickness direction of the main plate portion, for example, a flange causing a sum of the flange position, a product of the flange raw material height and $\cos\theta$ corresponding to a cosine component of the flange angle, and a product of the flange raw material plate thickness and $\sin\theta$ corresponding to a sine component of the flange angle, to be the maximum. In a case where flanges are provided on both sides of the main plate portion in the plate thickness direction of the main plate portion, the control section 11c calculates a sum of a product of the flange raw material height and $\cos\theta$ corresponding to a cosine component of the flange angle and a product of the flange raw material plate thickness and $\sin\theta$ corresponding to a sine component of the flange angle, and calculates the raw material width as the sum, with respect to for each flange which protrudes most from one end part and the other end part of the main plate portion in the plate thickness direction.

Step S51, step S52, and step S53 are all processes of calculating a size of the raw material. In the present embodiment, the processes are performed in an order of step S51, step S52, and step S53, but are not limited thereto, and the three processes may be performed in any order. However, step S51 is performed after step S41, step S45, step S47, and step S48. Step S52 is performed after step S42 and step S46. Step S53 is performed after step S43, step S45, step S47, and step S48.

In a case where the main plate portion or the flange includes any one or a combination of the curved portion 41 illustrated in FIG. 11, the tapered portion 42 illustrated in FIG. 12, the step portion 43 illustrated in FIG. 13, and the step portion 44 illustrated in FIG. 14, the control section 11c corrects the plate thickness $t_w$ of the main plate portion or the plate thickness $t_f$ of the flange corresponding thereto and corrects the main plate portion raw material plate thickness of the main plate raw material portion or the flange raw material plate thickness of the flange raw material portion corresponding thereto, so as to correct a size and a shape of the raw material (step S55). Specifically, the control section 11c corrects a size and a shape of the raw material by using the thickness t_max of the thickest portion of the main plate portion or the flange including any one or a combination of the curved portion 41, the tapered portion 42, the step portion 43, and the step portion 44 as the plate thickness $t_w$ of the main plate portion or the plate thickness $t_f$ of the flange. In a case where the process in step S55 is performed, raw material shape calculation step S18 is finished, and a series of flows of the raw material shape determination method is finished.

Step S55 is performed last in raw material shape calculation step S18 in the present embodiment, but is not limited thereto, and may be performed as appropriate in main plate portion raw material plate thickness calculation step S43 or flange raw material plate thickness calculation step S47, and may be performed as appropriate during calculation of a size and a shape of a raw material.

In the raw material shape determination system 11, the raw material shape determination program 15, and raw material shape determination method processed thereby according to the present embodiment, the control section 11c performs flange classification step S14 and grip portion setting step S16 such that a grip portion is set at an end part of a main plate portion according to a flange. Thus, in the raw material shape determination system 11, the raw material shape determination program 15, and raw material shape determination method processed thereby, it is possible to provide a raw material shape which is as small as possible, required to process a material, that is, to provide a raw material shape enabling a material to be processed at low cost, compared with the related art.

In the raw material shape determination system 11, the raw material shape determination program 15, and raw material shape determination method processed thereby according to the present embodiment, a grip portion is set at an end part of a main plate portion farthest from a flange, and thus it is possible to provide a single grip portion which is as small as possible, required to process a material, compared with the related art. Thus, in the raw material shape determination system 11, the raw material shape determination program 15, and raw material shape determination method processed thereby, it is possible to provide a raw material shape causing residual stress accumulated in a material to be remarkably reduced during processing of the material. Therefore, in the raw material shape determination system 11, the raw material shape determination program 15, and raw material shape determination method processed thereby, it is possible to provide a raw material shape enabling a material to be processed with high accuracy.

In the raw material shape determination system 11, the raw material shape determination program 15, and raw material shape determination method processed thereby according to the present embodiment, the control section 11c performs flange classification step S14 so as to classify a flange into an L type flange, a T type flange, a counterclockwise-T type flange, and a "+" type flange. Thus, in the raw material shape determination system 11, the raw material shape determination program 15, and raw material shape determination method processed thereby, it is possible to more accurately set a grip portion in the subsequent grip portion setting step S16. Therefore, in the raw material shape determination system 11, the raw material shape determination program 15, and raw material shape determination method processed thereby, it is possible to provide a raw material shape causing a material to be processed at low cost. In the raw material shape determination system 11, the raw material shape determination program 15, and raw material shape determination method processed thereby, it is possible to provide a raw material shape causing residual stress accumulated in a material to be remarkably reduced during processing of the material and thus to provide the raw material shape enabling the material to be processed with higher accuracy.

In the raw material shape determination system 11, the raw material shape determination program 15, and raw material shape determination method processed thereby according to the present embodiment, grip portion setting step S16 is performed such that a grip portion is set at an end part of a main plate portion farthest from a flange. Thus, in the raw material shape determination system 11, the raw material shape determination program 15, and raw material shape determination method processed thereby, it is possible to provide a raw material shape causing residual stress accumulated in a material to be more remarkably reduced during processing of the material and thus to provide the raw material shape enabling the material to be processed with higher accuracy.

In the raw material shape determination system 11, the raw material shape determination program 15, and raw material shape determination method processed thereby according to the present embodiment, a size of a main plate raw material portion is calculated, a size of a flange raw material portion is calculated, and a size of a raw material is calculated, in raw material shape calculation step S18. Thus, it is possible to calculate a raw material shape suitable for processing of a material with high accuracy.

In the raw material shape determination system 11, the raw material shape determination program 15, and raw material shape determination method processed thereby according to the present embodiment, a plate thickness of a main plate raw material portion and a plate thickness of a flange raw material portion are calculated by using a parameter based on a substance, predefined according to the rigidity of the substance. Thus, even in a case where a grip portion to be gripped during processing is small, it is possible to provide a raw material shape causing a material or a raw material to be stably processed with high accuracy.

Hereinafter, a description will be made of a shape of a raw material which is calculated and determined according to the raw material shape determination system 11, the raw material shape determination program 15, and raw material shape determination method processed thereby in the present embodiment, on the basis of information regarding shapes of the material 20, the material 22, the material 24, the material 26, the material 28, the material 32, the material 34, the material 36, and the material 38.

Figure 19:
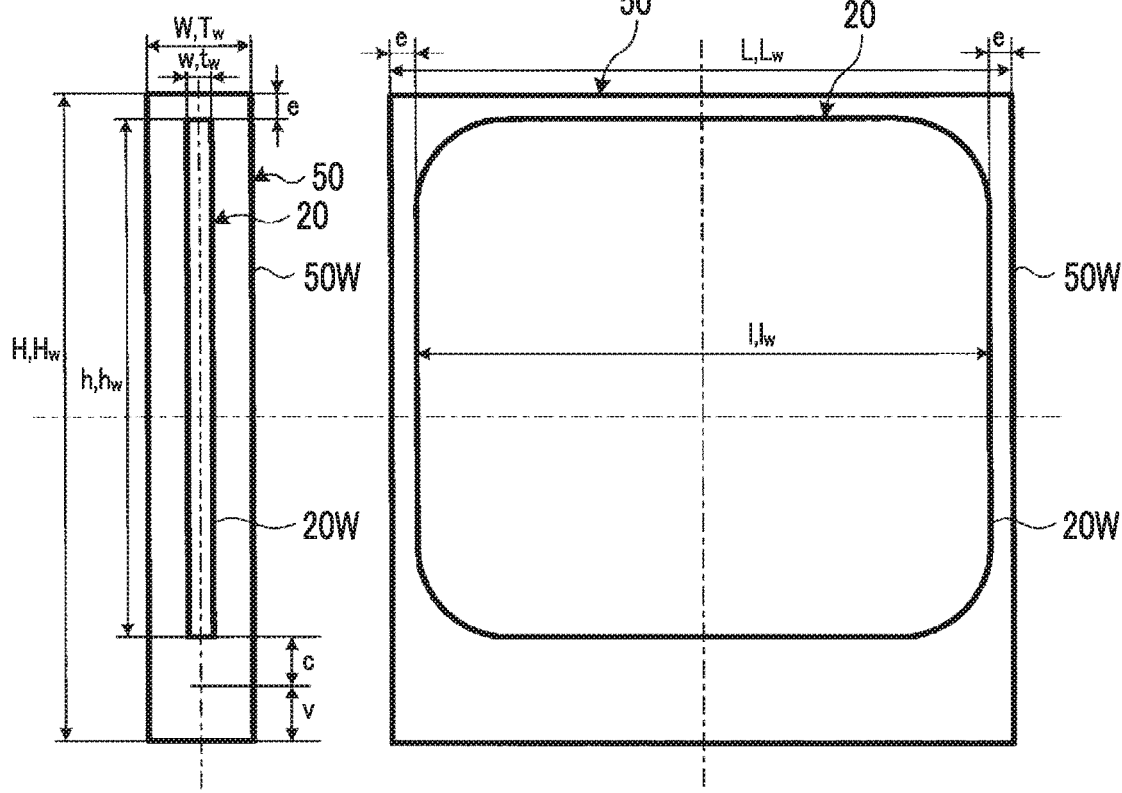
FIG. 19 is a side view illustrating an example of a raw material determined in the raw material shape determination method.

FIG. 19 is a side view illustrating a raw material 50 which is an example of a raw material determined according to the raw material shape determination method. The raw material 50 is calculated and determined on the basis of the information regarding the shape of the material 20. As illustrated in FIG. 19, the raw material 50 has a main plate raw material portion 50W. The main plate raw material portion 50W is a portion to be processed to the main plate portion 20w. A height $H_w$ of the main plate raw material portion 50W, which is the main plate raw material portion height calculated in main plate portion raw material height calculation step S41, is a sum of the height $h_w$ of the main plate portion 20w, a size of an excess margin e, a height of a grip portion v, and a height of a cutting portion c, and is the same as a raw material height H calculated in raw material height calculation step S51. A length $L_w$ of the main plate raw material portion 50W, which is the main plate portion raw material length calculated in main plate portion raw material length calculation step S42, is a sum of the length $l_w$ of the main plate portion 20w and twice the size of the excess margin e, and is the same as a raw material length L calculated in raw material length calculation step S52. A plate thickness $T_w$ of the main plate raw material portion 50W, which is the main plate portion raw material plate thickness calculated in main plate portion raw material plate thickness calculation step S43, is a length equal to or more than a product of a value obtained by subtracting the height of the grip portion v from the height $H_w$ of the main plate raw material portion 50W, and the parameter based on the substance, and is the same as a raw material width W calculated in raw material width calculation step S53.

In addition to the raw material 50 illustrated in FIG. 19, in each of all raw materials described below, the height $H_w$ of a main plate raw material portion is the main plate portion raw material height calculated in main plate portion raw material height calculation step S41, the length $L_w$ of the main plate raw material portion is the main plate portion raw material length calculated in main plate portion raw material length calculation step S42, and the plate thickness $T_w$ of the main plate raw material portion is the main plate portion raw material plate thickness calculated in main plate portion raw material plate thickness calculation step S43. Similarly, the raw material height H is calculated in raw material height calculation step S51, the raw material length L is calculated in raw material length calculation step S52, and the raw material width W is calculated in raw material width calculation step S53.

Figure 20:
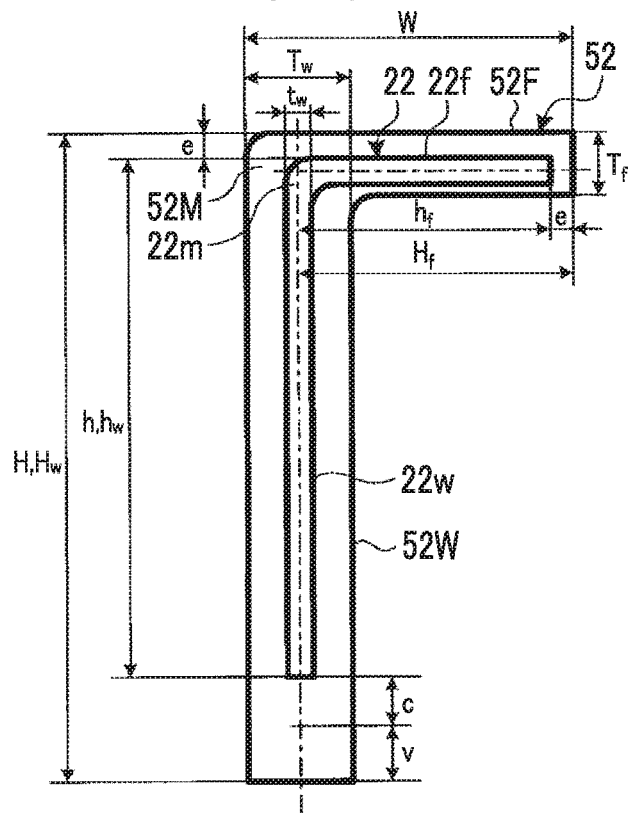
FIG. 20 is a side view illustrating an example of a raw material determined in the raw material shape determination method.

FIG. 20 is a side view illustrating a raw material 52 which is an example of a raw material determined according to the raw material shape determination method. The raw material 52 is calculated and determined on the basis of the information regarding the shape of the material 22. The raw material 52 includes, as illustrated in FIG. 20, a main plate raw material portion 52W, a flange raw material portion 52F, and a cross raw material portion 52M. The main plate raw material portion 52W is a portion to be processed to the main plate portion 22w. The flange raw material portion 52F is a portion to be processed to the flange 22f. The cross raw material portion 52M is a portion to be processed to the cross part 22m.

The height $H_w$ of the main plate raw material portion 52W is a sum of the height $h_w$ of the main plate portion 22w, a size of the excess margin e, a height of the grip portion v, and a height of the cutting portion c. Although not illustrated in FIG. 20, the length $L_w$ of the main plate raw material portion 52W is a sum of the length $l_w$ of the main plate portion 22w and twice the size of the excess margin e. The plate thickness $T_w$ of the main plate raw material portion 52W is a length equal to or more than a product of a value obtained by subtracting the height of the grip portion v from the height $H_w$ of the main plate raw material portion 52W, and the parameter based on the substance.

The height $H_f$ of the flange raw material portion 52F is the flange raw material height calculated in flange raw material height calculation step S45, and is a sum of the height $h_f$ of the flange 22f and the size of the excess margin e. The length $L_f$ of the flange raw material portion 52F is the flange raw material length calculated in flange raw material length calculation step S46, and is a sum of the length $l_f$ of the flange 22f and twice the size of the excess margin e although not illustrated in FIG. 20. The plate thickness $T_f$ of the flange raw material portion 52F is the flange raw material plate thickness which is calculated in flange raw material plate thickness calculation step S47 and is corrected in flange raw material plate thickness correction step S48 as necessary, and is a length equal to or more than a product of a value obtained by subtracting a half of the plate thickness $T_w$ of the main plate raw material portion 52W from the height $H_f$ of the flange raw material portion 52F, and the parameter based on the substance. The flange 22f is provided at the end part of the main plate portion 22w, and thus the plate thickness $T_f$ of the flange raw material portion 52F secures the excess margin e on the end part side of the main plate portion 22w.

The cross raw material portion 52M has a size and a shape causing the size and the shape of the main plate raw material portion 52W to be smoothly connected to the size and the shape of the flange raw material portion 52F.

Since the flange 22f does not protrude in the height direction from both end parts of the main plate portion 22w, the height H of the raw material 52 is the same as the height $H_w$ of the main plate raw material portion 52W. Although not illustrated in FIG. 20, the length L of the raw material 52 is a larger length of the length $L_w$ of the main plate raw material portion 52W and the length $L_f$ of the flange raw material portion 52F. Since the flange 22f is provided on only one side of the main plate portion 22w in the direction of the plate thickness $t_w$ of the main plate portion 22w, the width W of the raw material 52 is a sum of the height $H_f$ of the flange raw material portion 52F and a value of a half of the plate thickness $T_w$ of the main plate raw material portion 52W.

In addition to the raw material 52 illustrated in FIG. 20, in each of all raw materials described below, the height $H_f$ of a flange raw material portion is the flange raw material height calculated in flange raw material height calculation step S45, the length $L_f$ of the flange raw material portion is the flange raw material length calculated in flange raw material length calculation step S46, and the plate thickness $T_f$ of the flange raw material portion is the flange raw material plate thickness which is calculated in flange raw material plate thickness calculation step S47 and is corrected in flange raw material plate thickness correction step S48 as necessary.

Figure 21:
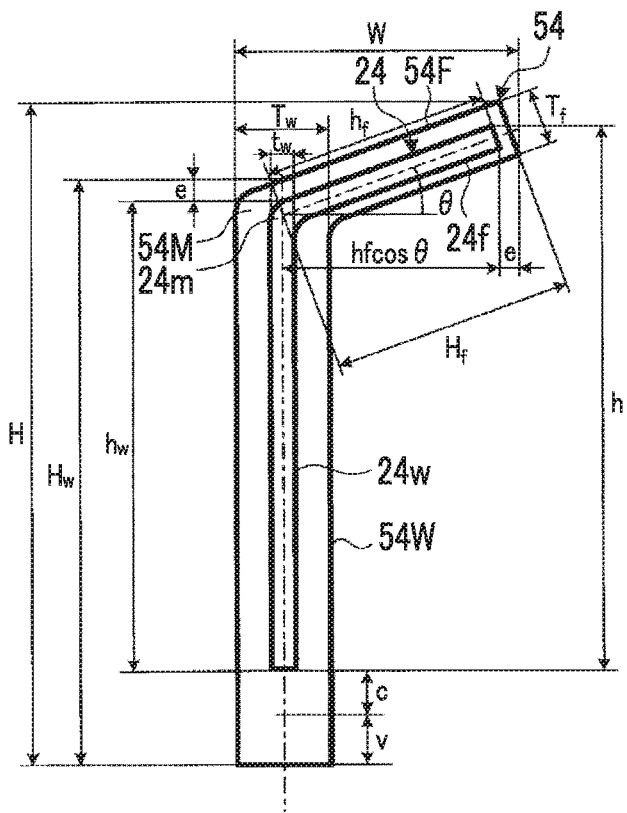
FIG. 21 is a side view illustrating an example of a raw material determined in the raw material shape determination method.

FIG. 21 is a side view illustrating a raw material 54 which is an example of a raw material determined according to the raw material shape determination method. The raw material 54 is calculated and determined on the basis of the information regarding the shape of the material 24. The raw material 54 includes, as illustrated in FIG. 21, a main plate raw material portion 54W, a flange raw material portion 54F, and a cross raw material portion 54M. The main plate raw material portion 54W is a portion to be processed to the main plate portion 24w. The flange raw material portion 54F is a portion to be processed to the flange 24f. The cross raw material portion 54M is a portion to be processed to the cross part 24m.

The height $H_w$ of the main plate raw material portion 54W is a sum of the height $h_w$ of the main plate portion 24w, a size of the excess margin e, a height of the grip portion v, and a height of the cutting portion c. Although not illustrated in FIG. 21, the length $L_w$ of the main plate raw material portion 54W is a sum of the length $l_w$ of the main plate portion 24w and twice the size of the excess margin e. The plate thickness $T_w$ of the main plate raw material portion 54W is a length equal to or more than a product of a value obtained by subtracting the height of the grip portion v from the height $H_w$ of the main plate raw material portion 54W, and the parameter based on the substance.

The height $H_f$ of the flange raw material portion 54F is a sum of the height $h_f$ of the flange 24f, and a product of the size of the excess margin e and cos θ corresponding to a cosine component of the flange angle. The length $L_f$ of the flange raw material portion 54F is a sum of the length lf of the flange 24f and twice the size of the excess margin e although not illustrated in FIG. 21. The plate thickness $T_f$ of the flange raw material portion 54F is a length equal to or more than a product of a value obtained by subtracting a product of a half of the plate thickness $T_w$ of the main plate raw material portion 54W and cos θ corresponding to a cosine component of the flange angle from the height $H_f$ of the flange raw material portion 54F, and the parameter based on the substance. The flange 24f is provided at the end part of the main plate portion 24w, and thus the plate thickness $T_f$ of the flange raw material portion 54F secures the excess margin e on the end part side of the main plate portion 24w.

The cross raw material portion 54M has a size and a shape causing the size and the shape of the main plate raw material portion 54W to be smoothly connected to the size and the shape of the flange raw material portion 54F.

Since the flange 24f protrudes in the height direction from one end part of the main plate portion 24w, the height H of the raw material 54 is a value obtained by adding a height of the grip portion v and a height of the cutting portion c to a sum of a flange position, a product of the height $H_w$ of the main plate raw material portion 54W and sin θ corresponding to a sine component of the flange angle, and a product of the plate thickness $T_f$ of the flange raw material portion 54F and cos θ corresponding to a cosine component of the flange angle. Although not illustrated in FIG. 21, the length L of the raw material 54 is a larger length of the length $L_w$ of the main plate raw material portion 54W and the length $L_f$ of the flange raw material portion 54F. Since the flange 24f is provided on only one side of the main plate portion 24w in the direction of the plate thickness $t_w$ of the main plate portion 24w, the width W of the raw material 54 is a sum of a product of the height $H_f$ of the flange raw material portion 54F and cos θ corresponding to a cosine component of the flange angle, a product of the plate thickness $T_f$ of the flange raw material portion 54F and sin θ corresponding to a sine component of the flange angle, and a value of a half of the plate thickness $T_w$ of the main plate raw material portion 54W.

Figure 22:
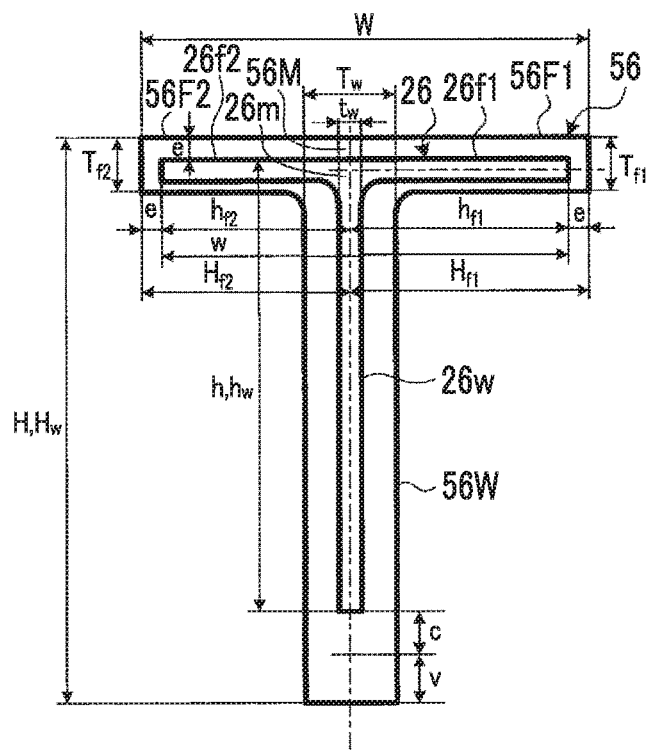
FIG. 22 is a side view illustrating an example of a raw material determined in the raw material shape determination method.

FIG. 22 is a side view illustrating a raw material 56 which is an example of a raw material determined according to the raw material shape determination method. The raw material 56 is calculated and determined on the basis of the information regarding the shape of the material 26. The raw material 56 includes, as illustrated in FIG. 22, a main plate raw material portion 56W, a flange raw material portion 56F1, a flange raw material portion 56F2, and a cross raw material portion 56M. The main plate raw material portion 56W is a portion to be processed to the main plate portion 26w. The flange raw material portion 56F1 is a portion to be processed to the flange 26f1. The flange raw material portion 56F2 is a portion to be processed to the flange 26f2. The cross raw material portion 56M is a portion to be processed to the cross part 26m.

The height $H_w$ of the main plate raw material portion 56W is a sum of the height $h_w$ of the main plate portion 26w, a size of the excess margin e, a height of the grip portion v, and a height of the cutting portion c. Although not illustrated in FIG. 22, the length $L_w$ of the main plate raw material portion 56W is a sum of the length $l_w$ of the main plate portion 26w and twice the size of the excess margin e. The plate thickness $T_w$ of the main plate raw material portion 56W is a length equal to or more than a product of a value obtained by subtracting the height of the grip portion v from the height $H_w$ of the main plate raw material portion 56W, and the parameter based on the substance.

The height $H_{f1}$ of the flange raw material portion 56F1 is a sum of the height $h_{f1}$ of the flange 26f1 and the size of the excess margin e. The length $L_{f1}$ of the flange raw material portion 56F1 is a sum of the length $l_{f1}$ of the flange 26f1 and twice the size of the excess margin e although not illustrated in FIG. 22. The plate thickness $T_{f1}$ of the flange raw material portion 56F1 is a length equal to or more than a product of a value obtained by subtracting a half of the plate thickness $T_w$ of the main plate raw material portion 56W from the height $H_{f1}$ of the flange raw material portion 56F1, and the parameter based on the substance. The flange 26/1 is provided at the end part of the main plate portion 26w, and thus the plate thickness $T_{f1}$ of the flange raw material portion 56F1 secures the excess margin e on the end part side of the main plate portion 26w.

The height $H_{f2}$ of the flange raw material portion 56F2 is a sum of the height $h_{f2}$ of the flange 26/2 and the size of the excess margin e. The length $L_{f2}$ of the flange raw material portion 56F2 is a sum of the length $l_{f2}$ of the flange 26/2 and twice the size of the excess margin e although not illustrated in FIG. 22. The plate thickness $T_{f2}$ of the flange raw material portion 56F2 is a length equal to or more than a product of a value obtained by subtracting a half of the plate thickness $T_w$ of the main plate raw material portion 56W from the height $H_{f2}$ of the flange raw material portion 56F2, and the parameter based on the substance. The flange 26/2 is provided at the end part of the main plate portion 26w, and thus the plate thickness $T_{f2}$ of the flange raw material portion 56F2 secures the excess margin e on the end part side of the main plate portion 26w.

The cross raw material portion 56M has a size and a shape causing the size and the shape of the main plate raw material portion 56W, the size and the shape of the flange raw material portion 56F1, and the size and the shape of the flange raw material portion 56F2 to be smoothly connected to each other.

Since the flange 26/1 and the flange 26/2 do not protrude in the height direction from both end parts of the main plate portion 26w, the height H of the raw material 56 is the same as the height $H_w$ of the main plate raw material portion 56W. Although not illustrated in FIG. 22, the length L of the raw material 56 is the largest length among the length $L_w$ of the main plate raw material portion 56W, the length $L_{f1}$ of the flange raw material portion 56F1, and the length $L_{f2}$ of the flange raw material portion 56F2. Since the flange 26/1 and the flange 26/2 are provided on both sides of the main plate portion 26w in the direction of the plate thickness $t_w$ of the main plate portion 26w, the width W of the raw material 56 is a sum of the height $H_{f1}$ of the flange raw material portion 56F1 and height $H_{f2}$ of the flange raw material portion 56F2.

Figure 23:
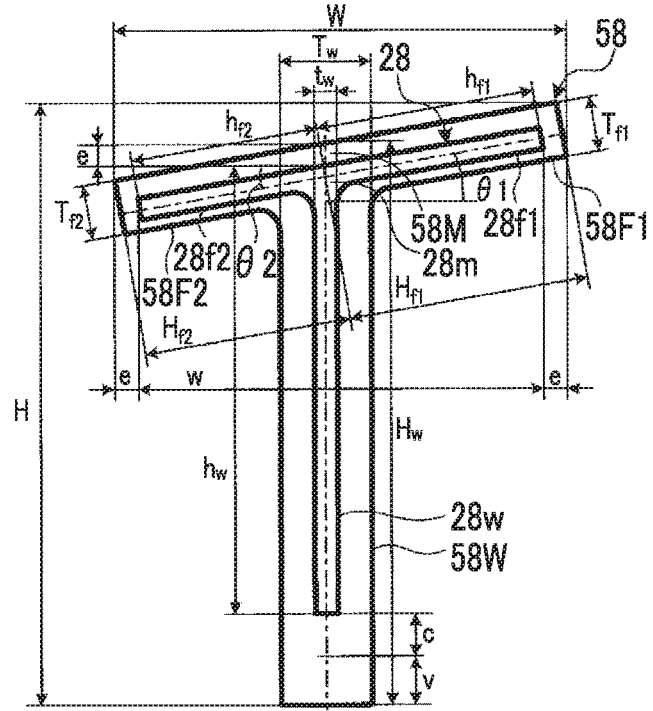
FIG. 23 is a side view illustrating an example of a raw material determined in the raw material shape determination method.

FIG. 23 is a side view illustrating a raw material 58 which is an example of a raw material determined according to the raw material shape determination method. The raw material 58 is calculated and determined on the basis of the information regarding the shape of the material 28. The raw material 58 includes, as illustrated in FIG. 23, a main plate raw material portion 58W, a flange raw material portion 58F1, a flange raw material portion 58F2, and a cross raw material portion 58M. The main plate raw material portion 58W is a portion to be processed to the main plate portion 28w. The flange raw material portion 58F1 is a portion to be processed to the flange 28/1. The flange raw material portion 58F2 is a portion to be processed to the flange 28/2. The cross raw material portion 58M is a portion to be processed to the cross part 28m.

The height $H_w$ of the main plate raw material portion 58W is a sum of the height $h_w$ of the main plate portion 28w, a size of the excess margin e, a height of the grip portion v, and a height of the cutting portion c. Although not illustrated in FIG. 23, the length $L_w$ of the main plate raw material portion 58W is a sum of the length $l_w$ of the main plate portion 28w and twice the size of the excess margin e. The plate thickness $T_w$ of the main plate raw material portion 58W is a length equal to or more than a product of a value obtained by subtracting the height of the grip portion v from the height $H_w$ of the main plate raw material portion 58W, and the parameter based on the substance.

The height $H_{f1}$ of the flange raw material portion 58F1 is a sum of the height $h_{f1}$ of the flange 28/1, and a product of the size of the excess margin e and cos θ1 corresponding to a cosine component of the flange angle. The length $L_{f1}$ of the flange raw material portion 58F1 is a sum of the length $l_{f1}$ of the flange 28/1 and twice the size of the excess margin e although not illustrated in FIG. 23. The plate thickness $T_{f1}$ of the flange raw material portion 58F1 is a length equal to or more than a product of a value obtained by subtracting a product of a half of the plate thickness $T_w$ of the main plate raw material portion 58W and cos θ1 corresponding to a cosine component of the flange angle from the height $H_{f1}$ of the flange raw material portion 58F1, and the parameter based on the substance. The flange 28/1 is provided at the end part of the main plate portion 28w, and thus the plate thickness $T_{f1}$ of the flange raw material portion 58F1 secures the excess margin e on the end part side of the main plate portion 28w.

The height $H_{f2}$ of the flange raw material portion 58F2 is a sum of the height $h_{f2}$ of the flange 28/2, and a product of the size of the excess margin e and cos θ2 corresponding to a cosine component of the flange angle. The length $L_{f2}$ of the flange raw material portion 58F2 is a sum of the length $l_{f2}$ of the flange 28/2 and twice the size of the excess margin e although not illustrated in FIG. 23. The plate thickness $T_{f2}$ of the flange raw material portion 58F2 is a length equal to or more than a product of a value obtained by subtracting a product of a half of the plate thickness $T_w$ of the main plate raw material portion 58W and cos θ2 corresponding to a cosine component of the flange angle from the height $H_{f2}$ of the flange raw material portion 58F2, and the parameter based on the substance. The flange 28/2 is provided at the end part of the main plate portion 28w, and thus the plate thickness $T_{f2}$ of the flange raw material portion 58F2 secures the excess margin e on the end part side of the main plate portion 28w.

The cross raw material portion 58M has a size and a shape causing the size and the shape of the main plate raw material portion 58W, the size and the shape of the flange raw material portion 58F1, and the size and the shape of the flange raw material portion 58F2 to be smoothly connected to each other.

Since the flange 28/1 protrudes in the height direction from one end part of the main plate portion 28w, the height H of the raw material 58 is a value obtained by adding a height of the grip portion v and a height of the cutting portion c to a sum of a flange position of the flange 28/1, a product of the height $H_w$ of the main plate raw material portion 58W and sin θ1 corresponding to a sine component of the flange angle, and a product of the plate thickness $T_{f1}$ of the flange raw material portion 58F1 and cos θ1 corresponding to a cosine component of the flange angle. Although not illustrated in FIG. 23, the length L of the raw material 58 is the largest length among the length $L_w$ of the main plate raw material portion 58W, the length $L_{f1}$ of the flange raw material portion 58F1, and the length $L_{f2}$ of the flange raw material portion 58F2. Since the flange 28/1 and the flange 28/2 are provided on both sides of the main plate portion 28w in the direction of the plate thickness $t_w$ of the main plate portion 28w, the width W of the raw material 58 is a sum of a product of the height $H_{f1}$ of the flange raw material portion 58F1 and cos θ1 corresponding to a cosine component of the flange angle, a product of the plate thickness $T_{f1}$ of the flange raw material portion 58F1 and sin θ1 corresponding to a sine component of the flange angle, a product of the height $H_{f2}$ of the flange raw material portion 58F2 and cos θ2 corresponding to a cosine component of the flange angle, and a product of the plate thickness $T_{f2}$ of the flange raw material portion 58F2 and sin θ2 corresponding to a sine component of the flange angle.

Figure 24:
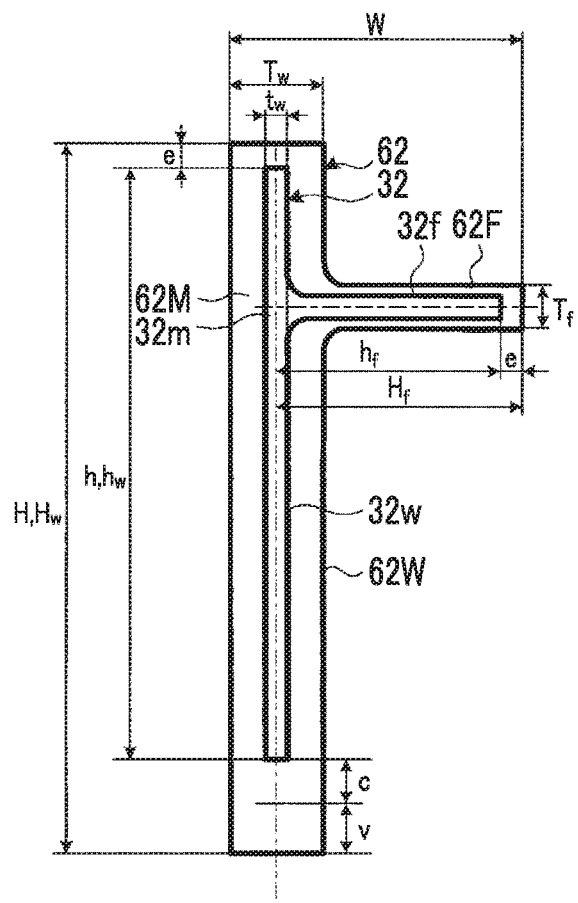
FIG. 24 is a side view illustrating an example of a raw material determined in the raw material shape determination method.

FIG. 24 is a side view illustrating a raw material 62 which is an example of a raw material determined according to the raw material shape determination method. The raw material 62 is calculated and determined on the basis of the information regarding the shape of the material 32. The raw material 62 includes, as illustrated in FIG. 24, a main plate raw material portion 62W, a flange raw material portion 62F, and a cross raw material portion 62M. The main plate raw material portion 62W is a portion to be processed to the main plate portion 32w. The flange raw material portion 62F is a portion to be processed to the flange 32f. The cross raw material portion 62M is a portion to be processed to the cross part 32m.

The height $H_w$ of the main plate raw material portion 62W is a sum of the height $h_w$ of the main plate portion 32w, a size of the excess margin e, a height of the grip portion v, and a height of the cutting portion c. Although not illustrated in FIG. 24, the length $L_w$ of the main plate raw material portion 62W is a sum of the length $l_w$ of the main plate portion 32w and twice the size of the excess margin e. The plate thickness $T_w$ of the main plate raw material portion 62W is a length equal to or more than a product of a value obtained by subtracting the height of the grip portion v from the height $H_w$ of the main plate raw material portion 62W, and the parameter based on the substance.

The height $H_f$ of the flange raw material portion 62F is a sum of the height $h_f$ of the flange 32f and the size of the excess margin e. The length $L_f$ of the flange raw material portion 62F is a sum of the length $l_f$ of the flange 32f and twice the size of the excess margin e although not illustrated in FIG. 24. The plate thickness $T_f$ of the flange raw material portion 62F is a length equal to or more than a product of a value obtained by subtracting a half of the plate thickness $T_w$ of the main plate raw material portion 62W from the height $H_f$ of the flange raw material portion 62F, and the parameter based on the substance.

The cross raw material portion 62M has a size and a shape causing the size and the shape of the main plate raw material portion 62W to be smoothly connected to the size and the shape of the flange raw material portion 62F.

Since the flange 32f does not protrude in the height direction from both end parts of the main plate portion 32w, the height H of the raw material 62 is the same as the height $H_w$ of the main plate raw material portion 62W. Although not illustrated in FIG. 24, the length L of the raw material 62 is a larger length of the length $L_w$ of the main plate raw material portion 62W and the length $L_f$ of the flange raw material portion 62F. Since the flange 32f is provided on only one side of the main plate portion 32w in the direction of the plate thickness $t_w$ of the main plate portion 32w, the width W of the raw material 62 is a sum of the height $H_f$ of the flange raw material portion 62F and a value of a half of the plate thickness $T_w$ of the main plate raw material portion 62W.

Figure 25:
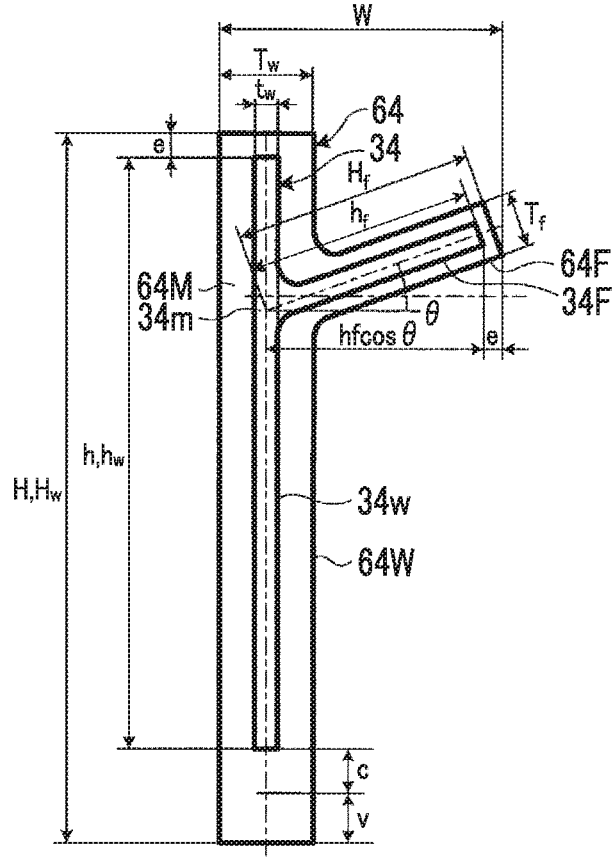
FIG. 25 is a side view illustrating an example of a raw material determined in the raw material shape determination method.

FIG. 25 is a side view illustrating a raw material 64 which is an example of a raw material determined according to the raw material shape determination method. The raw material 64 is calculated and determined on the basis of the information regarding the shape of the material 34. The raw material 64 includes, as illustrated in FIG. 25, a main plate raw material portion 64W, a flange raw material portion 64F, and a cross raw material portion 64M. The main plate raw material portion 64W is a portion to be processed to the main plate portion 34w. The flange raw material portion 64F is a portion to be processed to the flange 34f. The cross raw material portion 64M is a portion to be processed to the cross part 34m.

The height $H_w$ of the main plate raw material portion 64W is a sum of the height $h_w$ of the main plate portion 34w, a size of the excess margin e, a height of the grip portion v, and a height of the cutting portion c. Although not illustrated in FIG. 25, the length $L_w$ of the main plate raw material portion 64W is a sum of the length $l_w$ of the main plate portion 34w and twice the size of the excess margin e. The plate thickness $T_w$ of the main plate raw material portion 64W is a length equal to or more than a product of a value obtained by subtracting the height of the grip portion v from the height $H_w$ of the main plate raw material portion 64W, and the parameter based on the substance.

The height $H_f$ of the flange raw material portion 64F is a sum of the height $h_f$ of the flange 34f, and a product of the size of the excess margin e and cos θ corresponding to a cosine component of the flange angle. The length $L_f$ of the flange raw material portion 64F is a sum of the length $l_f$ of the flange 34f and twice the size of the excess margin e although not illustrated in FIG. 25. The plate thickness $T_f$ of the flange raw material portion 64F is a length equal to or more than a product of a value obtained by subtracting a product of a half of the plate thickness $T_w$ of the main plate raw material portion 64W and cos θ corresponding to a cosine component of the flange angle from the height $H_f$ of the flange raw material portion 64F, and the parameter based on the substance.

The cross raw material portion 64M has a size and a shape causing the size and the shape of the main plate raw material portion 64W to be smoothly connected to the size and the shape of the flange raw material portion 64F.

The height H of the raw material 64 differs depending on whether or not the flange 34f protrudes in the height direction from both end parts of the main plate portion 34w. Specifically, in a case where the flange 34f does not protrude from both end parts of the main plate portion 34w, the height H of the raw material 64 is the same as the height $H_w$ of the main plate raw material portion 64W. On the other hand, in a case where the flange 34f protrudes in the height direction from one end part of the main plate portion 34w, the height H of the raw material 64 is a value obtained by adding a height of the grip portion v and a height of the cutting portion c to a sum of a flange position, a product of the height $H_w$ of the main plate raw material portion 64W and sin θ corresponding to a sine component of the flange angle, and a product of the plate thickness $T_f$ of the flange raw material portion 64F and cos θ corresponding to a cosine component of the flange angle.

Although not illustrated in FIG. 25, the length L of the raw material 64 is a larger length of the length $L_w$ of the main plate raw material portion 64W and the length $L_f$ of the flange raw material portion 64F. Since the flange 34f is provided on only one side of the main plate portion 34w in the direction of the plate thickness $t_w$ of the main plate portion 34w, the width W of the raw material 64 is a sum of a product of the height $H_f$ of the flange raw material portion 64F and cos θ corresponding to a cosine component of the flange angle, a product of the plate thickness $T_f$ of the flange raw material portion 64F and sin θ corresponding to a sine component of the flange angle, and a value of a half of the plate thickness $T_w$ of the main plate raw material portion 64W.

Figure 26:
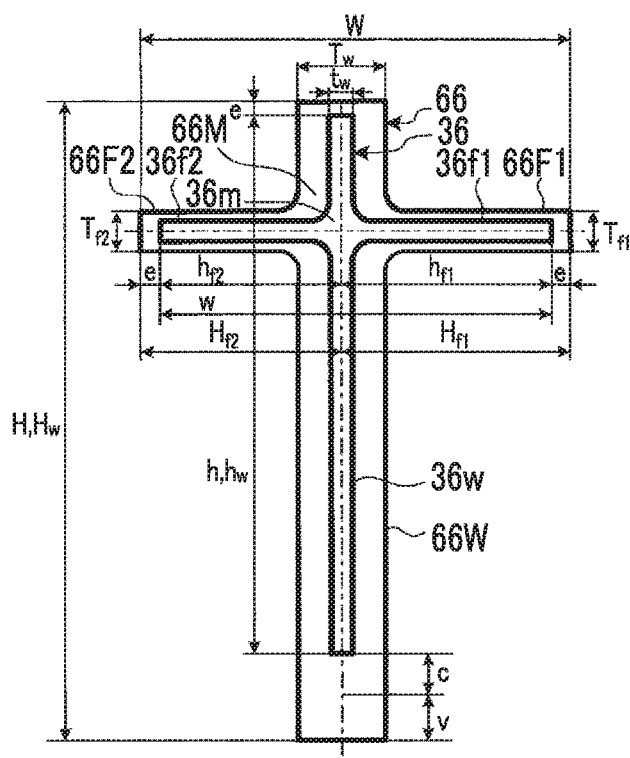
FIG. 26 is a side view illustrating an example of a raw material determined in the raw material shape determination method.

FIG. 26 is a side view illustrating a raw material 66 which is an example of a raw material determined according to the raw material shape determination method. The raw material 66 is calculated and determined on the basis of the information regarding the shape of the material 36. The raw material 66 includes, as illustrated in FIG. 26, a main plate raw material portion 66W, a flange raw material portion 66F1, a flange raw material portion 66F2, and a cross raw material portion 66M. The main plate raw material portion 66W is a portion to be processed to the main plate portion 36w. The flange raw material portion 66F1 is a portion to be processed to the flange 36/1. The flange raw material portion 66F2 is a portion to be processed to the flange 36/2. The cross raw material portion 66M is a portion to be processed to the cross part 36m.

The height $H_w$ of the main plate raw material portion 66W is a sum of the height $h_w$ of the main plate portion 36w, a size of the excess margin e, a height of the grip portion v, and a height of the cutting portion c. Although not illustrated in FIG. 26, the length $L_w$ of the main plate raw material portion 66W is a sum of the length $l_w$ of the main plate portion 36w and twice the size of the excess margin e. The plate thickness $T_w$ of the main plate raw material portion 66W is a length equal to or more than a product of a value obtained by subtracting the height of the grip portion v from the height $H_w$ of the main plate raw material portion 66W, and the parameter based on the substance.

The height $H_{f1}$ of the flange raw material portion 66F1 is a sum of the height $h_{f1}$ of the flange 36/1 and the size of the excess margin e. The length $L_{f1}$ of the flange raw material portion 66F1 is a sum of the length $l_{f1}$ of the flange 36/1 and twice the size of the excess margin e although not illustrated in FIG. 26. The plate thickness $T_{f1}$ of the flange raw material portion 66F1 is a length equal to or more than a product of a value obtained by subtracting a half of the plate thickness $T_w$ of the main plate raw material portion 66W from the height $H_{f1}$ of the flange raw material portion 66F1, and the parameter based on the substance.

The height $H_{f2}$ of the flange raw material portion 66F2 is a sum of the height $h_{f2}$ of the flange 36/2 and the size of the excess margin e. The length $L_{f2}$ of the flange raw material portion 66F2 is a sum of the length $l_{f2}$ of the flange 36/2 and twice the size of the excess margin e although not illustrated in FIG. 26. The plate thickness $T_{f2}$ of the flange raw material portion 66F2 is a length equal to or more than a product of a value obtained by subtracting a half of the plate thickness $T_w$ of the main plate raw material portion 66W from the height $H_{f2}$ of the flange raw material portion 66F2, and the parameter based on the substance.

The cross raw material portion 66M has a size and a shape causing the size and the shape of the main plate raw material portion 66W, the size and the shape of the flange raw material portion 66F1, and the size and the shape of the flange raw material portion 66F2 to be smoothly connected to each other.

Since the flange 36/1 and the flange 36/2 do not protrude in the height direction from both end parts of the main plate portion 36w, the height H of the raw material 66 is the same as the height $H_w$ of the main plate raw material portion 66W. Although not illustrated in FIG. 26, the length L of the raw material 66 is the largest length among the length $L_w$ of the main plate raw material portion 66W, the length $L_{f1}$ of the flange raw material portion 66F1, and the length $L_{f2}$ of the flange raw material portion 66F2. Since the flange 36/1 and the flange 36/2 are provided on both sides of the main plate portion 36w in the direction of the plate thickness $t_w$ of the main plate portion 36w, the width W of the raw material 66 is a sum of the height $H_{f1}$ of the flange raw material portion 66F1 and height $H_{f2}$ of the flange raw material portion 66F2.

Figure 27:
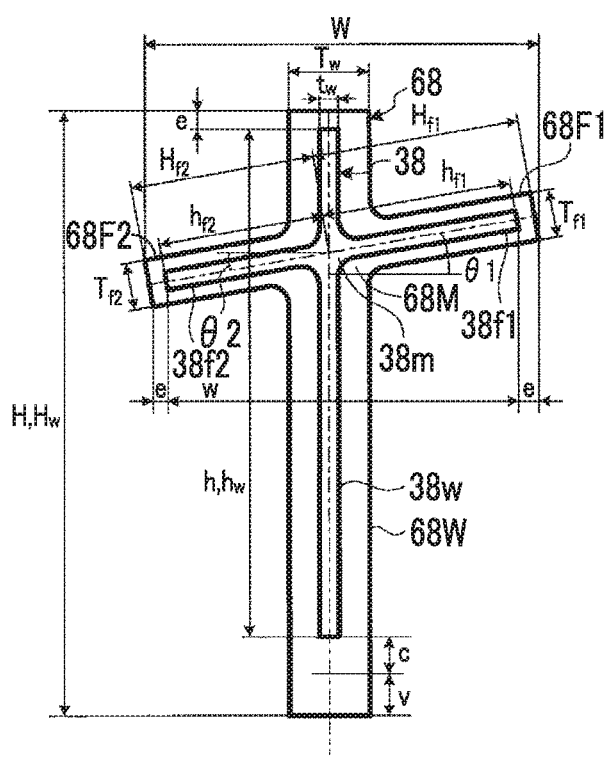
FIG. 27 is a side view illustrating an example of a raw material determined in the raw material shape determination method.

FIG. 27 is a side view illustrating a raw material 68 which is an example of a raw material determined according to the raw material shape determination method. The raw material 68 is calculated and determined on the basis of the information regarding the shape of the material 38. The raw material 68 includes, as illustrated in FIG. 27, a main plate raw material portion 68W, a flange raw material portion 68F1, a flange raw material portion 68F2, and a cross raw material portion 68M. The main plate raw material portion 68W is a portion to be processed to the main plate portion 38w. The flange raw material portion 68F1 is a portion to be processed to the flange 38/1. The flange raw material portion 68F2 is a portion to be processed to the flange 38/2. The cross raw material portion 68M is a portion to be processed to the cross part 38m.

The height $H_w$ of the main plate raw material portion 68W is a sum of the height $h_w$ of the main plate portion 38w, a size of the excess margin e, a height of the grip portion v, and a height of the cutting portion c. Although not illustrated in FIG. 27, the length $L_w$ of the main plate raw material portion 68W is a sum of the length $l_w$ of the main plate portion 38w and twice the size of the excess margin e. The plate thickness $T_w$ of the main plate raw material portion 68W is a length equal to or more than a product of a value obtained by subtracting the height of the grip portion v from the height $H_w$ of the main plate raw material portion 68W, and the parameter based on the substance.

The height $H_{f1}$ of the flange raw material portion 68F1 is a sum of the height $h_{f1}$ of the flange 38/1, and a product of the size of the excess margin e and cos θ1 corresponding to a cosine component of the flange angle. The length $L_{f1}$ of the flange raw material portion 68F1 is a sum of the length $l_{f1}$ of the flange 38/1 and twice the size of the excess margin e although not illustrated in FIG. 27. The plate thickness $T_{f1}$ of the flange raw material portion 68F1 is a length equal to or more than a product of a value obtained by subtracting a product of a half of the plate thickness $T_w$ of the main plate raw material portion 68W and cos θ1 corresponding to a cosine component of the flange angle from the height $H_{f1}$ of the flange raw material portion 68F1, and the parameter based on the substance.

The height $H_{f2}$ of the flange raw material portion 68F2 is a sum of the height $h_{f2}$ of the flange 38/2, and a product of the size of the excess margin e and cos θ2 corresponding to a cosine component of the flange angle. The length $L_{f2}$ of the flange raw material portion 68F2 is a sum of the length $l_{f2}$ of the flange 38/2 and twice the size of the excess margin e although not illustrated in FIG. 27. The plate thickness $T_{f2}$ of the flange raw material portion 68F2 is a length equal to or more than a product of a value obtained by subtracting a product of a half of the plate thickness $T_w$ of the main plate raw material portion 68W and cos θ2 corresponding to a cosine component of the flange angle from the height $H_{f2}$ of the flange raw material portion 68F2, and the parameter based on the substance.

The cross raw material portion 68M has a size and a shape causing the size and the shape of the main plate raw material portion 68W, the size and the shape of the flange raw material portion 68F1, and the size and the shape of the flange raw material portion 68F2 to be smoothly connected to each other.

The height H of the raw material 68 differs depending on whether or not the flange 38f1 and the flange 38f2 protrude in the height direction from both end parts of the main plate portion 38w. Specifically, in a case where the flange 38f1 and the flange 38f2 do not protrude from both end parts of the main plate portion 38w, the height H of the raw material 68 is the same as the height $H_w$ of the main plate raw material portion 68W. On the other hand, in a case where in a case where the flange 38f1 and the flange 38f2 protrude from one end part of the main plate portion 38w, for example, as illustrated in FIG. 27, the flange 38f1 protrudes in the height direction from one end part of the main plate portion 38w, the height H of the raw material 68 is a value obtained by adding a height of the grip portion v and a height of the cutting portion c to a sum of a flange position of the flange 38f1, a product of the height $H_w$ of the main plate raw material portion 68W and sin θ1 corresponding to a sine component of the flange angle, and a product of the plate thickness $T_{f1}$ of the flange raw material portion 68F1 and cos θ1 corresponding to a cosine component of the flange angle.

Although not illustrated in FIG. 27, the length L of the raw material 68 is the largest length among the length $L_w$ of the main plate raw material portion 68W, the length $L_{f1}$ of the flange raw material portion 68F1, and the length $L_{f2}$ of the flange raw material portion 68F2. Since the flange 38f1 and the flange 38f2 are provided on both sides of the main plate portion 38w in the direction of the plate thickness $t_w$ of the main plate portion 38w, the width W of the raw material 68 is a sum of a product of the height $H_{f1}$ of the flange raw material portion 68F1 and cos θ1 corresponding to a cosine component of the flange angle, a product of the plate thickness $T_{f1}$ of the flange raw material portion 68F1 and sin θ1 corresponding to a sine component of the flange angle, a product of the height $H_{f2}$ of the flange raw material portion 68F2 and cos θ2 corresponding to a cosine component of the flange angle, and a product of the plate thickness $T_{f2}$ of the flange raw material portion 68F2 and sin θ2 corresponding to a sine component of the flange angle.

Figure 28:
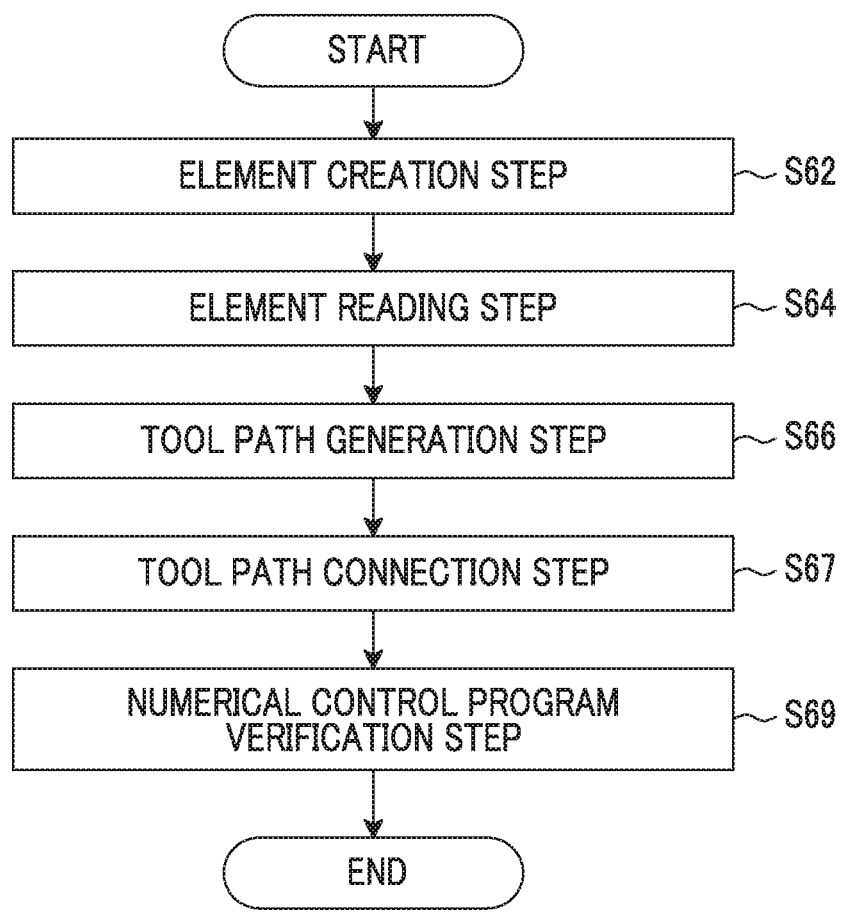
FIG. 28 is a flowchart illustrating an example of a flow of a numerical control program generation method.

Hereinafter, a description will be made of operations of the numerical control program generation system 12 and the numerical control program generation program 16. FIG. 28 is a flowchart illustrating an example of a flow of a numerical control program generation method. The numerical control program generation method is a processing method performed by the control section 12c reading and executing the numerical control program generation program 16 in the numerical control program generation system 12. The numerical control program generation method will be described with reference to FIG. 28. The numerical control program generation method includes, as illustrated in FIG. 28, element creation step S62, element reading step S64, tool path generation step S66, tool path connection step S67, and numerical control program verification step S69. Hereinafter, element creation step S62, element reading step S64, tool path generation step S66, tool path connection step S67, and numerical control program verification step S69 will be respectively simply referred to as step S62, step S64, step S66, step S67, and step S69, as appropriate.

First, the control section 12c creates elements regarding a shape of a material on the basis of information regarding the shape of the material (step S62). The elements regarding the shape of the material include a cutting conduction setting element which is an element for setting a cutting condition and a tool path generation element which is an element for generating a tool path. Elements are created for each surface element included in the shape of the material.

Figure 29:
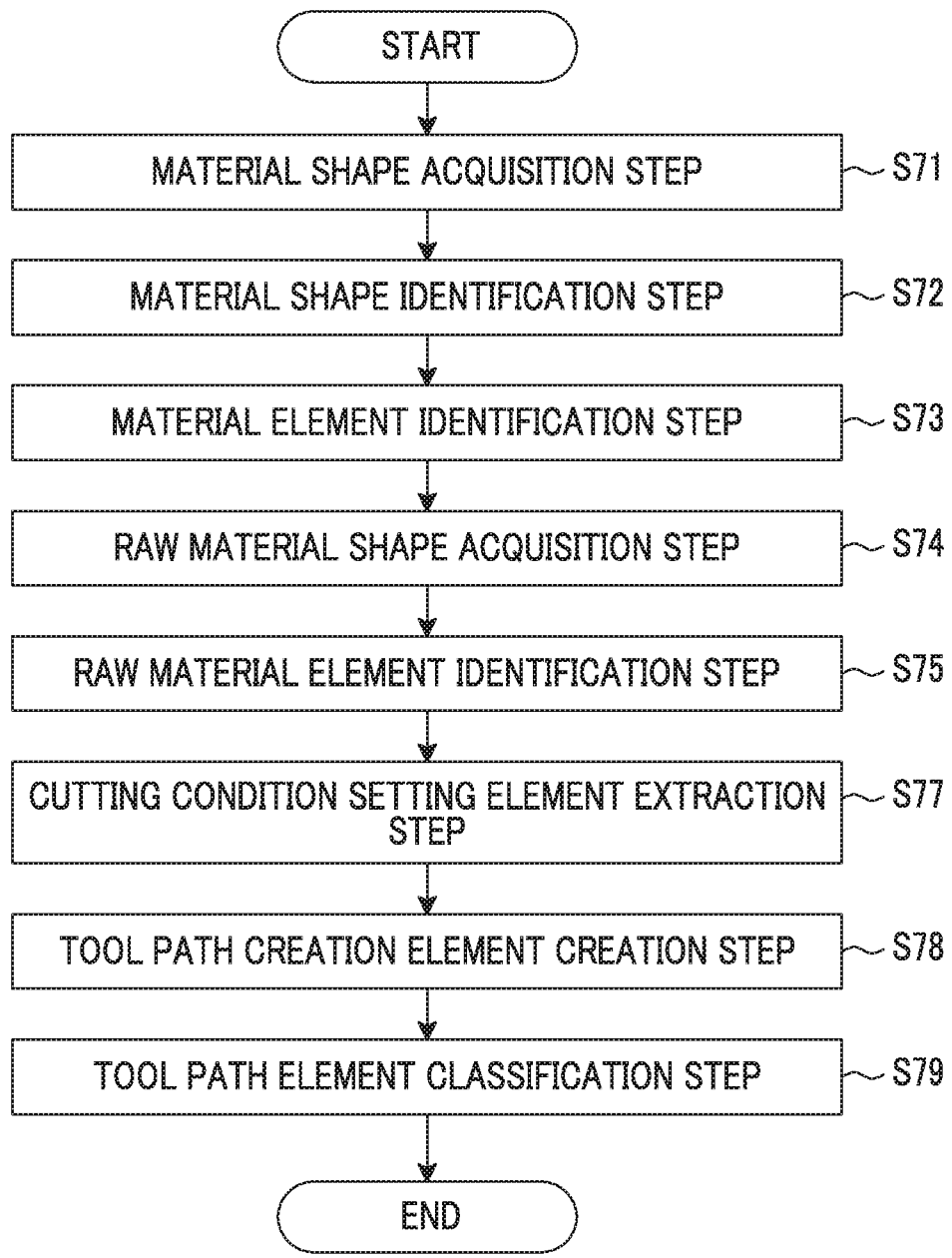
FIG. 29 is a flowchart illustrating an example of a detailed flow of an element creation step.

Element creation step S62 will be described below in detail. FIG. 29 is a flowchart illustrating an example of a detailed flow of element creation step S62. Element creation step S62 includes, as illustrated in FIG. 29, material shape acquisition step S71, material shape identification step S72, material element identification step S73, raw material shape acquisition step S74, raw material element identification step S75, cutting conduction setting element extraction step S77, tool path generation element creation step S78, and tool path element classification step S79. Hereinafter, material shape acquisition step S71, material shape identification step S72, material element identification step S73, raw material shape acquisition step S74, raw material element identification step S75, cutting conduction setting element extraction step S77, tool path generation element creation step S78, and tool path element classification step S79 will be respectively simply referred to as step S71, step S72, step S73, step S74, step S75, step S77, step S78, and step S79, as appropriate.

Figures 30, 31:
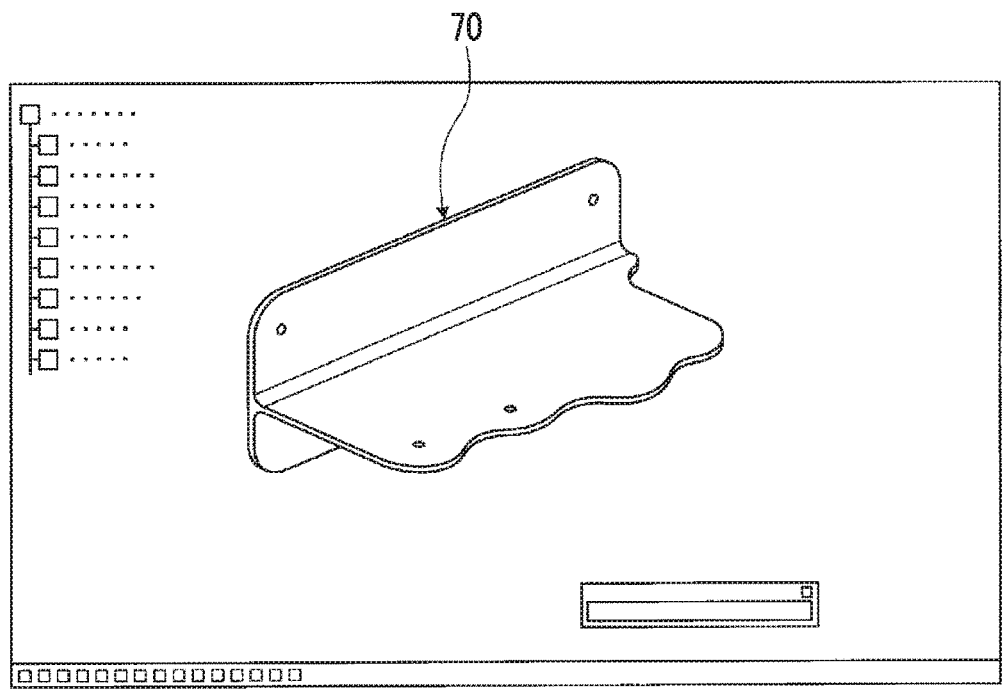
FIG. 30 is a perspective view illustrating a material design model which is an example of a material shape.
FIG. 31 is a diagram illustrating examples of identification conditions for the material design model.

FIG. 30 is a perspective view illustrating a material design model 70 which is an example of a material shape. The material design model 70 is a three-dimensional design model created for a material. In element creation step S62, first, the control section 12c acquires information regarding a shape of a material in the same manner as in the above step S12 (step S71). Specifically, the control section 12c acquires data of a three-dimensional design model created for the material, for example, the material design model 70 illustrated in FIG. 30, by executing the computer aided design program 17. Hereinafter, as an embodiment, a description will be made of an example of handling the material design model 70.

FIG. 31 is a diagram illustrating identification conditions 72 which are examples of identification conditions for the material design model 70. After step S71, the control section 12c identifies the shape of the material on the basis of the information regarding the shape of the material acquired in step S71 (step S72).

Specifically, the control section 12c identifies the material design model 70 according to the identification conditions 72 illustrated in FIG. 31.

Figure 32:
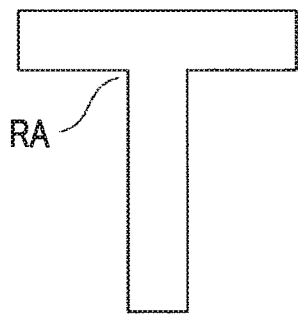
FIG. 32 is a sectional view illustrating an example of a flange angle of 90 degrees.
Figure 33:
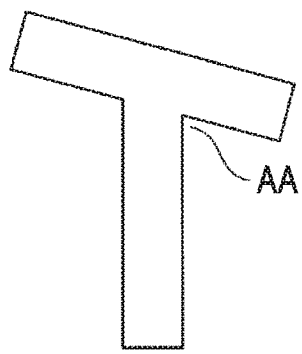
FIG. 33 is a sectional view illustrating an example of a flange angle of an acute angle.
Figure 34:
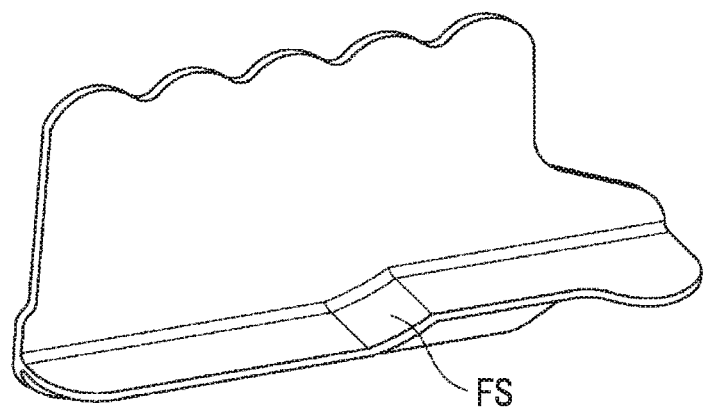
FIG. 34 is a perspective view illustrating an example of a step portion of a flange.
Figure 35:
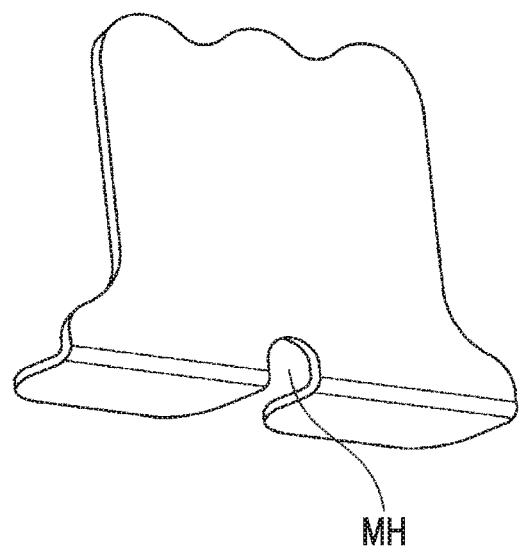
FIG. 35 is a perspective view illustrating an example of a mouse hole.

FIG. 32 is a sectional view illustrating a flange angle RA which is an example of a flange angle of 90 degrees. FIG. 33 is a sectional view illustrating a flange angle AA which is an example of a flange angle of an acute angle. FIG. 34 is a perspective view illustrating a flange step portion FS which is an example of a step portion in a flange. FIG. 35 is a perspective view illustrating a mouse hole MH which is an example of a mouse hole. The identification conditions 72 include the type of flange, a size of a material, a flange angle, the presence or absence of a step portion in a flange, and the presence or absence of a mouse hole. The type of flange includes, for example, four kinds such as an L type flange, a T type flange, a counterclockwise-T type flange, and a "+" type flange classified in the above step S14. The size of a material includes, for example, about three kinds. The flange angle includes, for example, two kinds such as the flange angle RA illustrated in FIG. 32 in which a flange angle is 90 degrees and the flange angle AA illustrated in FIG. 33 in which a flange angle is an acute angle or an obtuse angle. The presence or absence of a step portion in a flange includes, for example, two kinds such as a case where the flange step portion FS having a predetermined size, for example, a size equal to or less than R10 illustrated in FIG. 34, and a case where the flange step portion FS is not provided. The presence or absence of a step portion in a flange may be regarded as the presence or absence of a plate thickness change. The presence or absence of a mouse hole includes, for example, two kinds such as a case where the mouse hole MH illustrated in FIG. 35 is provided and a case where the mouse hole MH is not provided. In this case, the identification conditions 72 include a total of 96 kinds of identification conditions. Specifically, in step S72, the control section 12c identifies the material design model 70 illustrated in FIG. 30 as the kind that the flange type is a T type flange, a material size is medium, a flange angle is 90 degrees, a flange step portion is absent, and a mouse hole is absent.

Figure 36:
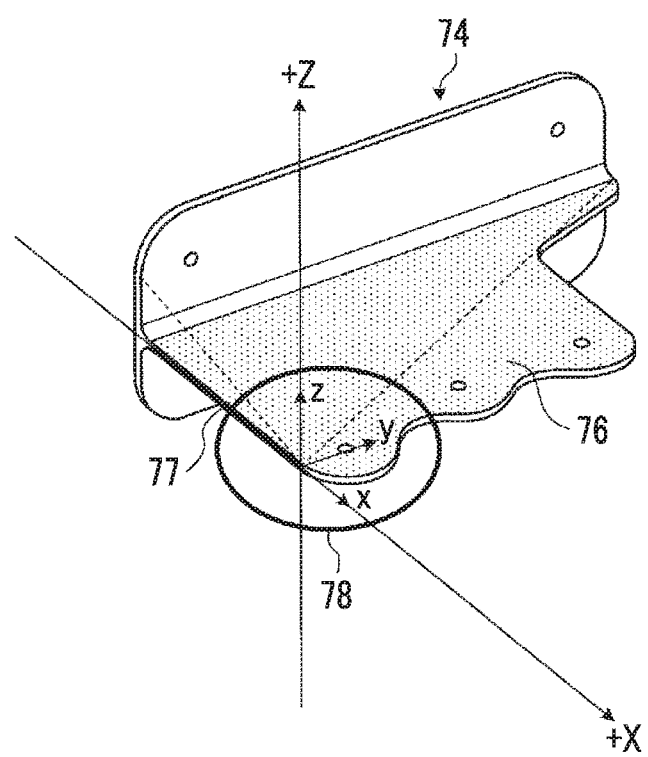
FIG. 36 is a perspective view illustrating a similar material design model which is an example of an existing material design model and of which a shape is closest to a material shape.

After step S72, the control section 12c identifies an element of the material design model 70 (step S73). FIG. 36 is a perspective view illustrating a similar material design model 74 which is an example of an existing material design model and of which a shape is closest to a material shape, that is, which is of the same kind as the material design model 70. In step S73, in the present embodiment, the control section 12c identifies an element of the material design model 70 through comparison with an element of the similar material design model 74 and by correlating associated portions of the material design model 70 and the similar material design model 74 with each other so as to set a correlation. Step S73 is not limited thereto, and other methods may be used, such as a method not using the similar material design model 74.

Figure 37:
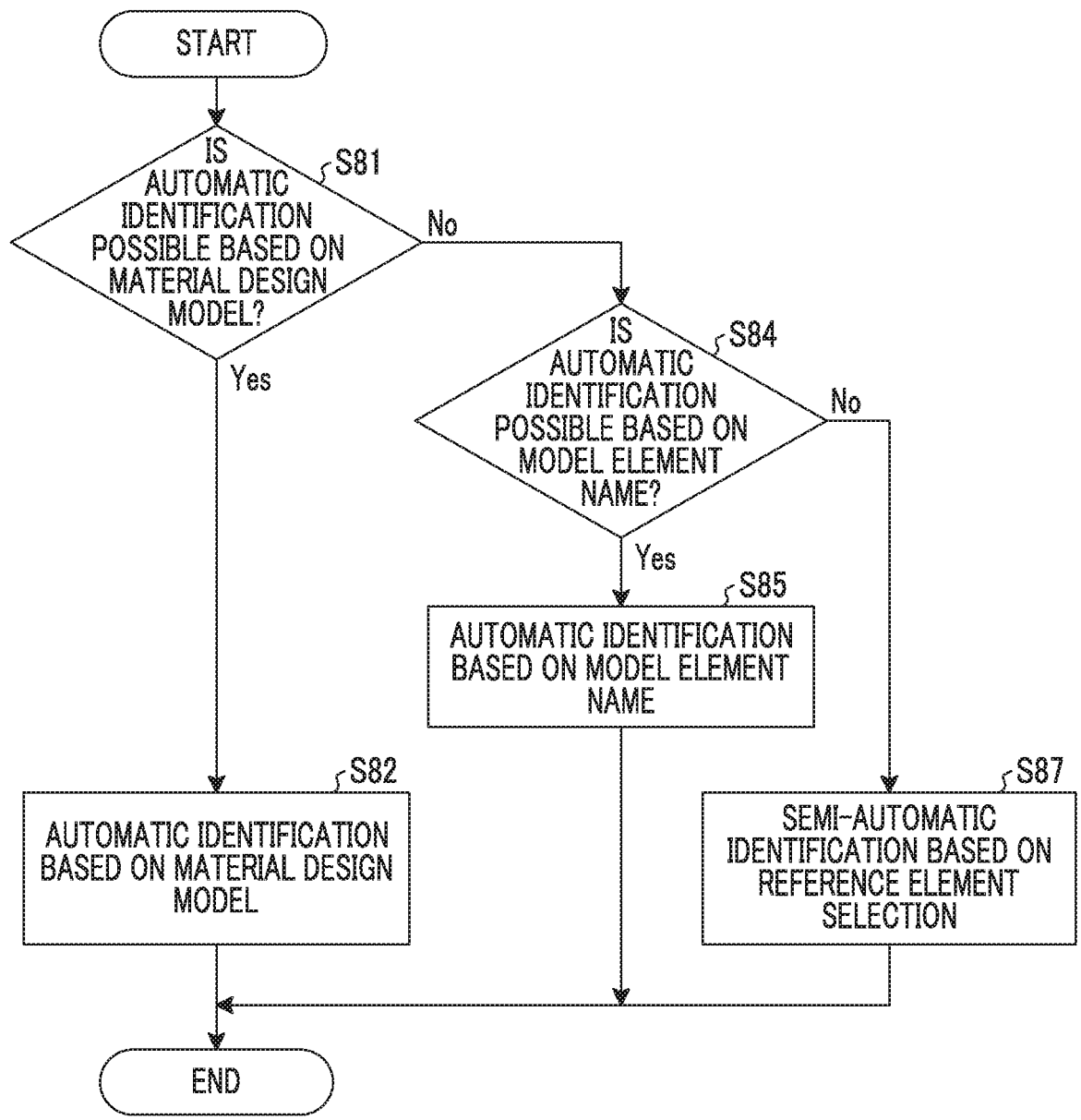
FIG. 37 is a flowchart illustrating an example of a detailed flow of a material element identification step.

Hereinafter, material element identification step S73 processed by using the similar material design model 74 will be described in detail. FIG. 37 is a flowchart illustrating an example of a detailed flow of material element identification step S73. Material element identification step S73 includes, as illustrated in FIG. 37, automatic identification possibility determination step S81, automatic identification step S82, model element name possibility determination step S84, model element name identification step S85, and semi-automatic identification step S87. Hereinafter, automatic identification possibility determination step S81, automatic identification step S82, model element name possibility determination step S84, model element name identification step S85, and semi-automatic identification step S87 will be respectively simply referred to as step S81, step S82, step S84, step S85, and step S87 as appropriate.

In material element identification step S73, first, the control section 12c performs a partial process of automatic identification step S82 on the material design model 70 and the similar material design model 74, so as to determine whether or not an element of the material design model 70 can be automatically identified (step S81). In a case where it is determined that an element of the material design model 70 can be automatically identified (Yes in step S81), the control section 12c performs a remaining process of automatic identification step S82 on the material design model 70 so as to automatically identify the element of the material design model 70 (step S82). On the other hand, in a case where it is determined that an element of the material design model 70 cannot be automatically identified (No in step S81), the control section 12c stops the process of automatic identification step S82 on the material design model 70, and causes the process to proceed to step S84.

Figure 38:
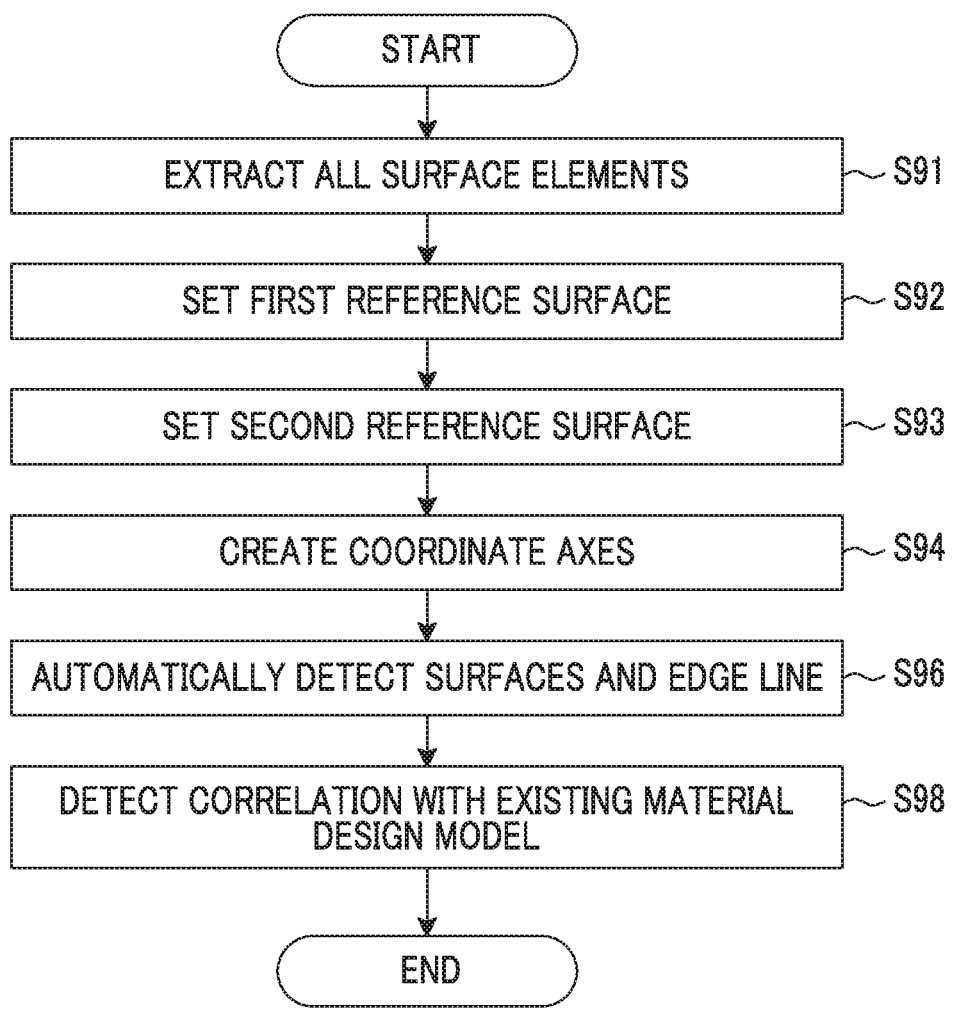
FIG. 38 is a flowchart illustrating an example of a detailed flow in a case where an element of the material design model is automatically identified.

Automatic identification step S82 will be described below in detail. FIG. 38 is a flowchart illustrating an example of a detailed flow in a case where an element of the material design model 70 is automatically identified. Automatic identification step S82 includes, as illustrated in FIG. 38, surface element extraction step S91, first reference surface setting step S92, second reference surface setting step S93, coordinate axis creation step S94, surface edge line automatic detection step S96, and automatic comparison detection step S98. Hereinafter, surface element extraction step S91, first reference surface setting step S92, second reference surface setting step S93, coordinate axis creation step S94, surface edge line automatic detection step S96, and automatic comparison detection step S98 will be respectively simply referred to as step S91, step S92, step S93, step S94, step S96, and step S98 as appropriate.

In automatic identification step S82, first, the control section 12c extracts all surface elements of the material design model 70 and the similar material design model 74 (step S91). In step S91, a reference regarding whether or not a plurality of surface elements are regarded as a single surface element is, for example, the curved portion 41, the tapered portion 42, the step portion 43, and the step portion 44, or whether or not a change in a height in a direction perpendicular to a surface is equal to or less than a predetermined threshold value.

After the process of step S91, among the all of extracted surface elements, the control section 12c sets a surface element including a straight line corresponding to the longest distance between two points as a first reference surface in each of the material design model 70 and the similar material design model 74 (step S92). For example, the control section 12c sets a surface element satisfying the above-described conditions as a first reference surface 76 in the similar material design model 74 as illustrated in FIG. 36.

After the process of step S92, among surface elements orthogonal to the first reference surface set in step S92, the control section 12c sets a surface element including a straight line corresponding to the longest distance between two points as a second reference surface in each of the material design model 70 and the similar material design model 74 (step S93). For example, the control section 12c sets a surface element satisfying the above-described conditions as a second reference surface 77 in the similar material design model 74 as illustrated in FIG. 36.

After the process of step S93, the control section 12c creates coordinate axes having an intersection line between the first reference surface set in step S92 and the second reference surface set in step S93 as an X axis and one straight line orthogonal to the first reference surface as a Z axis in each of the material design model 70 and the similar material design model 74 (step S94). For example, as illustrated in FIG. 36, in the similar material design model 74, the control section 12c creates coordinate axes 78 having an intersection line between the first reference surface 76 and the second reference surface 77 as an X axis and one straight line orthogonal to the first reference surface 76 as a Z axis in the similar material design model 74, as illustrated in FIG. 36.

After the process of step S94, the control section 12c automatically detects an edge line which is a boundary between surface elements in each of the material design model 70 and the similar material design model 74 (step S96). In this case, the control section 12c also detects information regarding the surface elements and the edge line.

After the process of step S96, the control section 12c compares the material design model 70 with the similar material design model 74, and detects and sets correlations between the surface elements and the edge line of the material design model 70 and the surface elements and the edge line of the similar material design model 74 automatically detected in step S96 (step S98). In this case, the control section 12c detects the correlations by regarding that portions having close coordinate information are corresponding portions on the basis of the coordinate axes of each of the material design model 70 and the similar material design model 74.

In a case where the processes of step S91 to step S98 can be smoothly performed, and correlations can be set between the material design model 70 and the similar material design model 74, the control section 12c determines that an element of the material design model 70 can be automatically identified (Yes in step S81), and can thus identify an element of the material design model 70 which is an identification target for each surface element (step S82).

In a case where the processes of step S91 to step S98 cannot be smoothly performed, the control section 12c determines that an element of the material design model 70 cannot be automatically identified (No in step S81), stops the process of automatic identification step S82 on the material design model 70, and causes the process to proceed to step S84.

Figure 39:
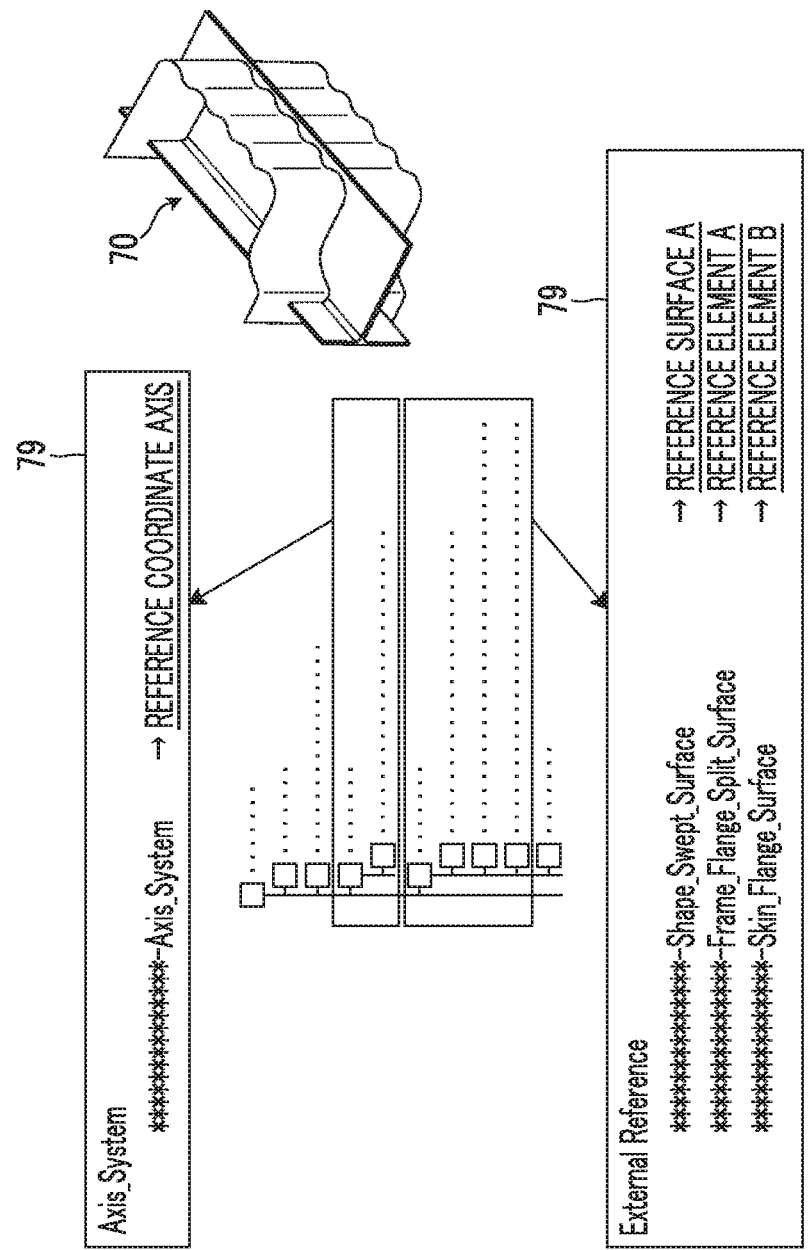
FIG. 39 is a diagram illustrating an example of an automatic identification state in a case where automatic identification is performed on the basis of a model element name.

FIG. 39 is a diagram illustrating an example of an automatic identification state in a case where automatic identification is performed on the basis of a model element name. In a case where the process proceeds to step S84, the control section 12c determines whether or not an element of the material design model 70 can be automatically identified on the basis of model element names 79 illustrated in FIG. 39 in the material design model 70 (step S84). In a case where the model element name 79 used in the material design model 70 matches a model element name used in the similar material design model 74, for example, the model element name 79 such as a reference coordinate axis, a reference surface A, a reference element A, or a reference element B illustrated in FIG. 39 is used in common to the material design model 70 and the similar material design model 74, the control section 12c determines that an element of the material design model 70 can be automatically identified on the basis of the model element name 79 in the material design model 70 (Yes in step S84). In a case where it is determined that an element of the material design model 70 can be automatically identified on the basis of the model element name 79 in the material design model 70 (Yes in step S84), the control section 12c sets a correlation between the model element name 79 in the material design model 70 and a model element name in the similar material design model 74, so as to detect and set correlations between the surface elements and the edge line of the material design model 70 and the surface elements and the edge line of the similar material design model 74 (step S85).

In a case where an element of the material design model 70 cannot be automatically identified, and the model element name 79 used in the material design model 70 does not match a model element name used in the similar material design model 74, the control section 12c determines that an element of the material design model 70 can be automatically identified on the basis of the model element name 79 in the material design model 70 (No in step S84), and causes the process to proceed to step S87.

Figure 40:
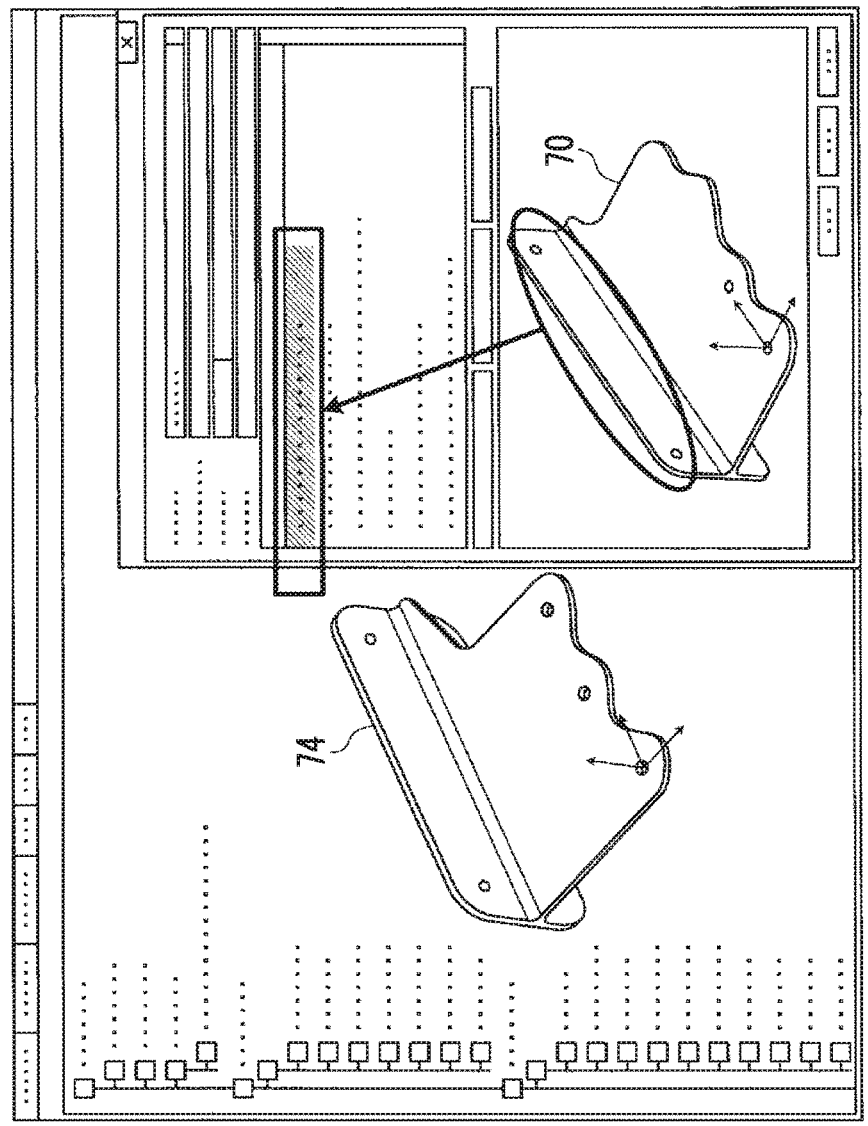
FIG. 40 is a diagram illustrating an example of a reference element selection state in a case where semi-automatic identification is performed on the basis of reference element selection.

FIG. 40 is a diagram illustrating an example of a reference element selection state in a case where semi-automatic identification is performed on the basis of reference element selection. In a case where the process proceeds to step S87, the control section 12c temporarily stops the process of automatically identifying an element of the material design model 70, and receives input of correlations between the material design model 70 and the similar material design model 74. As illustrated in FIG. 40, in a case where surface elements and an edge line of the material design model 70 are selected on a right window in FIG. 40 with, for example, a mouse, surface elements and an edge line of the similar material design model 74 are selected on the whole window including the right window in FIG. 40, and some correlations therebetween are input, the control section 12c can automatically detect remaining correlations between the material design model 70 and the similar material design model 74 by using mutual coordinate axes and positional relationships on the basis of the input correlations. Consequently, the control section 12c detects and sets correlations between the surface elements and the edge line of the material design model 70 and the surface elements and the edge line of the similar material design model 74 (step S87).

The control section 12c detects and sets correlations between the surface elements and the edge line of the material design model 70 and the surface elements and the edge line of the similar material design model 74 in automatic identification step S82, model element name identification step S85, and semi-automatic identification step S87. In other words, the control section 12c matches the material design model 70 with the similar material design model 74 in automatic identification step S82, model element name identification step S85, and semi-automatic identification step S87. Specifically, the control section 12c generates information in which the surface elements and the edge line of the material design model 70 and the surface elements and the edge line of the similar material design model 74 are correlated with each other, that is, material correlation information, and information regarding similarities and differences between correlated portions. The control section 12c performs a division process on an element on the basis of the correlation information and the information regarding similarities and differences between correlated portions. Consequently, the control section 12c finishes the process of material element identification step S73, and causes the process to proceed to raw material shape acquisition step S74.

Figures 41, 42:
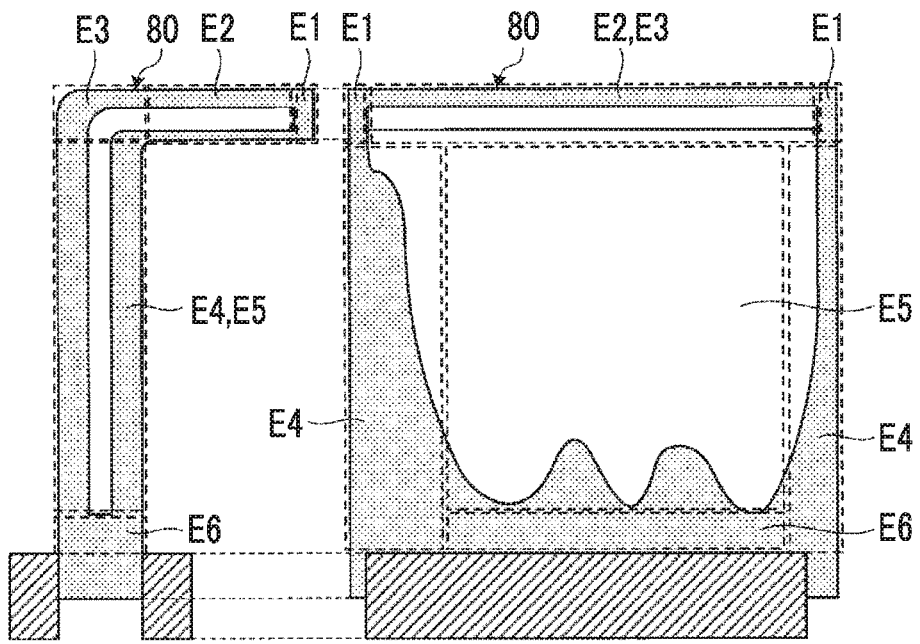
FIG. 41 is a diagram illustrating an example of a raw material design model.
FIG. 42 is a diagram illustrating an example of an element division method in the raw material design model.

Referring to FIG. 29 again, the control section 12c acquires information regarding the shape of the raw material calculated and determined in the raw material shape determination system 11 on the basis of the shape of the material which is a target (step S74). FIG. 41 is a diagram illustrating a raw material design model 80 which is an example of a raw material design model. Specifically, in step S74, the control section 12c acquires the raw material design model 80 as illustrated in FIG. 41, including the information regarding the shape of the raw material which is a target, from the raw material shape determination system 11. Consequently, the control section 12c is in a state of acquiring the information regarding the shape of the raw material corresponding to a shape at a processing start point as the raw material design model 80, and acquiring the information regarding the shape of the material corresponding to a shape at a processing end point as the material design model 70.

After the process of step S74, the control section 12c identifies an element of the raw material design model 80 on the basis of the material correlation information, and the information regarding similarities and differences between correlated portions generated in step S73 and information regarding the raw material design model 80 acquired in step S74 (step S75). Specifically, first, the control section 12c sets correlations between elements of the raw material design model 80 and the surface elements and the edge line of the raw material design model 80 by using information regarding a correlation of each element between the material and the raw material included in the raw material design model 80. Next, the control section 12c sets correlations between the surface elements and the edge line of the material design model 70 and the surface elements and the edge line of the similar material design model 74 by using the material correlation information, and the information regarding similarities and differences between correlated portions, and identifies an element of the raw material design model 80 for each kind of cutting condition on the basis of information regarding cutting conditions preset for the surface elements and the edge line of the similar material design model 74.

FIG. 42 is a diagram illustrating an element division method 82 which is an example of an element division method in the raw material design model. For example, through the process of step S75, as illustrated in FIGS. 41 and 42, the raw material design model 80 is identified into a flange end part processing element E1, a flange surface processing element E2, a cross part processing element E3, a main plate portion end part processing element E4, a main plate portion surface processing element E5, a cutting portion processing element E6, and several boring elements. A tool path generation element is created for all of the processing elements, and thus "O" is added to tool path fields of all of the processing elements in the element division method illustrated in FIG. 42. Since the flange surface processing element E2, the cross part processing element E3, and the main plate portion surface processing element E5 are influenced by the rigidity of a raw material or a material during processing, and thus a cutting conduction setting element is required to be created, cutting condition setting fields in such processing elements are added with "O" in the element division method 82. On the other hand, since the flange end part processing element E1, the main plate portion end part processing element E4, the cutting portion processing element E6, and several boring elements are not influenced by the rigidity of a raw material or a material during processing, and thus a cutting conduction setting element is not required to be created, cutting condition setting fields in such processing elements are added with "–" in the element division method 82.

Figure 43:
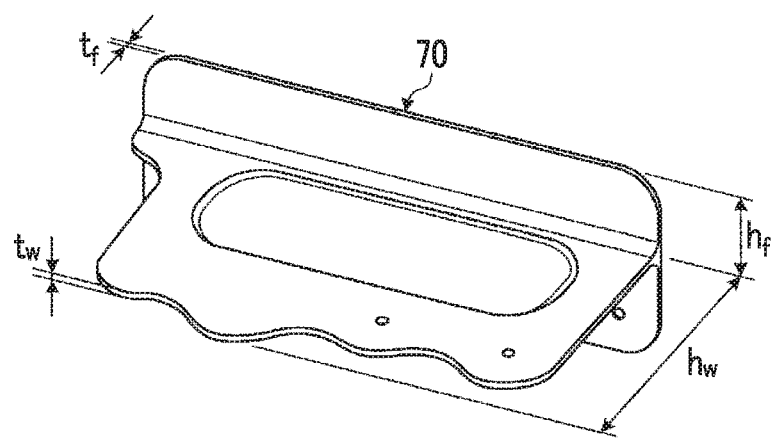
FIG. 43 is a diagram illustrating examples of cutting conduction setting elements.

Referring to FIG. 29 again, after the process of step S75, the control section 12c extracts a cutting conduction setting element for processing the material shown in the material design model 70 from the raw material shown in the raw material design model 80 (step S77). In step S77, specifically, the control section 12c extracts various values required to easily calculate static rigidity of the raw material or the material during processing in order to set cutting conditions. FIG. 43 is a diagram illustrating examples of cutting conduction setting elements. Cutting conduction setting elements extracted by the control section 12c in step S77 include, for example, not only the height $h_w$ and the plate thickness $t_w$ of the main plate portion in the material design model 70 illustrated in FIG. 43 and the height $h_f$ and the plate thickness $t_f$ of the flange in the material design model 70 illustrated in FIG. 43, but also the length $l_w$ of the main plate portion and the length $l_f$ of the flange in the material design model 70, the height $H_w$ and the plate thickness $T_w$ of the main plate raw material portion in the raw material design model 80, the height $H_f$ and the plate thickness $T_f$ of the flange raw material portion in the raw material design model 80, the length $L_w$ of the main plate raw material portion and the length $L_f$ of the flange raw material portion in the raw material design model 80, Young's moduli E of substances of the raw material and the material, and parameters based on substances predefined according to rigidities of the substances of the raw material and the material.

Figure 44:
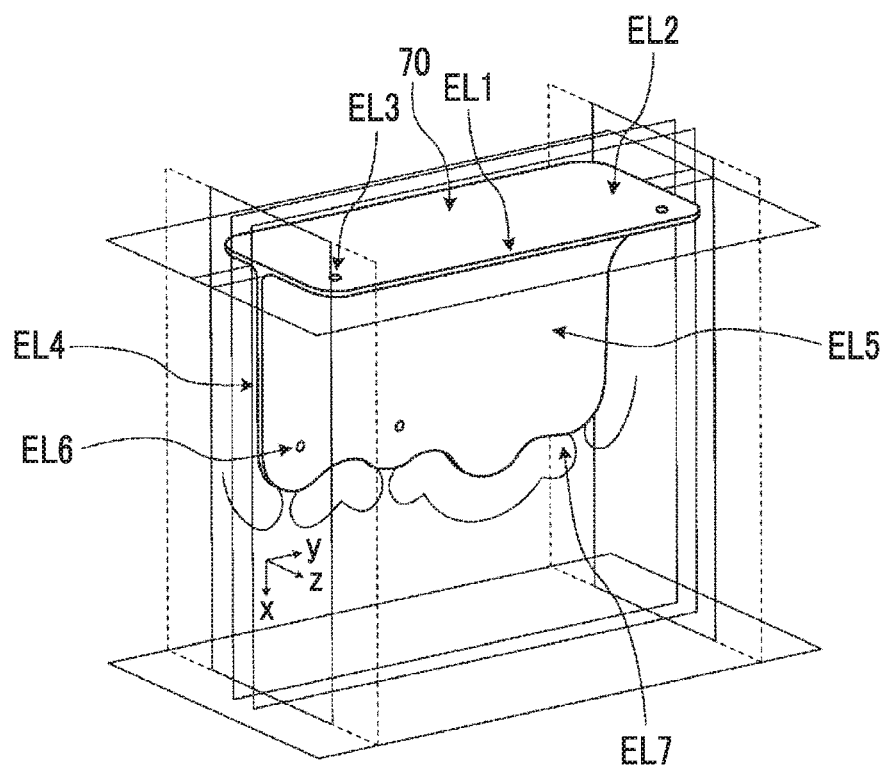
FIG. 44 is a diagram illustrating examples of tool path generation elements.

Referring to FIG. 29 again, after the process of step S77, the control section 12c creates a tool path generation element for processing the material shown in the material design model 70 on the basis of the raw material shown in the raw material design model 80 (step S78). In the process of step S78, the control section 12c creates a tool path generation element which is an element for generating a tool path in which a route of a processing operation is coded for each element identified in step S75. Specifically, the control section 12c sets a surface element, an end part element, and a cross part element where two or more surface elements cross each other, and sets some surface elements and cross part elements influenced by the rigidity of the raw material or the material, as elements for generating a tool path by using the cutting conduction setting elements. FIG. 44 is a diagram illustrating examples of tool path generation elements. For example, tool path generation elements created in step S78 include, as illustrated in FIG. 44, a flange outer periphery finishing element EL1, a flange surface processing element EL2, a flange boring element EL3, a length direction end part processing element EL4, a main plate portion surface processing element EL5, a main plate portion boring element EL6, and a cutting element EL7.

Each element includes information regarding a processing order and information regarding setting of processing conditions. Specifically, since the flange outer periphery finishing element EL1 is a surface element orthogonal to the height direction of the flange at a location farthest from the grip portion v, the flange outer periphery finishing element EL1 is set next to the length direction end part processing element EL4 corresponding to processing of end surfaces at both ends in the axial direction in a processing order, is not related to processing on a surface element or a cross part, and is thus set as an element for generating a tool path in which processing is performed once without using a cutting conduction setting element. Since the flange surface processing element EL2 is a surface element along the axial direction and the height direction of the flange at a location farthest from the grip portion v, the flange surface processing element EL2 is set next to the flange outer periphery finishing element EL1 in a processing order, is related to processing on a surface element or a cross part, and is thus set as an element for generating a tool path in which processing is divided into roughing and finishing and is performed a plurality of times by using a cutting conduction setting element. Since the flange boring element EL3 is a boring element, the flange boring element EL3 is set after predetermined roughing in the flange surface processing element EL2 and before predetermined finishing in the flange surface processing element EL2 in a processing order, and is set as an element for generating a tool path in which processing is performed on the basis of a predetermined boring method without using a cutting conduction setting element.

The roughing is processing in which a rotation speed of a tool is high, a processing margin which is a depth processed by the tool is large, and a processing pitch which is a region processed by the tool is large, and is processing in which a processing speed is prioritized to the accuracy of processing and a reduction of the influence exerted on the raw material and the material during processing. The roughing is processing for making the raw material close to the shape of the material, for example, cutting. On the other hand, the finishing is processing in which a rotation speed of a tool is lower than in the roughing, a processing margin which is a depth processed by the tool is small, and a processing pitch which is a region processed by the tool is small, and is processing in which the accuracy of processing and a reduction of the influence exerted on the raw material and the material during processing are prioritized to a processing speed. The finishing is processing for finishing the raw material to the shape of the material, for example, cutting. Thus, the roughing is appropriate for processing of end surfaces at both ends in the axial direction and processing of a surface element orthogonal to the height direction since the accuracy of processing is not required to be taken into great consideration, and the influence exerted on the raw material and the material during processing is not required to be taken into consideration. On the other hand, the finishing is appropriate for processing of a surface element along the axial direction and the height direction since the accuracy of processing is required to be taken into great consideration, and the influence exerted on the raw material and the material during processing is required to be taken into consideration. Thus, the roughing is preferably used for processing of a surface element along the axial direction and the height direction up to a stage in which the influence exerted on the raw material and the material during processing may not be taken into consideration, and the finishing is used in the subsequent stage.

Since the length direction end part processing element EL4 is related to processing of end surfaces at both ends in the axial direction, the length direction end part processing element EL4 is set first in a processing order, is not related to processing on a surface element or a cross part, and is thus set as an element for generating a tool path in which processing is performed once without using a cutting conduction setting element. Since the main plate portion surface processing element EL5 is a surface element along the axial direction and the height direction of the flange at a location close to the grip portion v, the main plate portion surface processing element EL5 is set after flange outer periphery finishing element EL1, the flange surface processing element EL2, and the flange boring element EL3 in a processing order, is related to processing on a surface element or a cross part, and is thus set as an element for generating a tool path in which processing is divided into roughing and finishing and is performed a plurality of times by using a cutting conduction setting element. Since the main plate portion boring element EL6 is a boring element, the main plate portion boring element EL6 is set after predetermined roughing in main plate portion surface processing element EL5 and before predetermined finishing in main plate portion surface processing element EL5 in a processing order, and is set as an element for generating a tool path in which processing is performed on the basis of a boring method without using a cutting conduction setting element.

The cutting element EL7 is related to processing of separating the material from the grip portion v at the cutting portion c, and is thus set last in a processing order, and is set as an element for generating a tool path in which the cutting element EL7 is processed to a plurality of tab shapes corresponding to a cutout shape so as to be easily separated.

Referring to FIG. 29 again, after the process of step S78, the control section 12c classifies the tool path generation elements created in step S78 (step S79). Specifically, the control section 12c sorts processing layers for each tool path generation element created in step S78. For example, the control section 12c sorts layers so as to sort colors to be displayed on a display for each tool path generation element created in step S78. Consequently, the control section 12c finishes the process of element creation step S62 illustrated in FIG. 28, and causes the process to proceed to element reading step S64.

Referring to FIG. 28 again, the control section 12c performs a process of reading elements regarding the shape of the material created in step S62, that is, elements including the cutting conduction setting elements and the tool path generation elements, generated for each surface element included in the shape of the material, from a region in which the computer aided design program 17 is executed to a region in which the computer aided manufacturing program 18 is executed (step S64). Processes in the control section 12c after step S64 are performed by executing the computer aided manufacturing program 18.

After step S64, the control section 12c generates a tool path for each element read in step S64 (step S66). In a case where a tool path is generated for an element for generating the tool path without using a cutting conduction setting element, for example, in a case where a tool path is generated for each of the flange outer periphery finishing element EL1, the flange boring element EL3, the length direction end part processing element EL4, the main plate portion boring element EL6, and the cutting element EL7 in the above example, the control section 12c selects tools used for machining on the basis of tool path generation elements set for the elements, and generates the tool path by selecting values of a database of the tools, or a tool path generated by using predetermined cutting conditions defined in the computer aided manufacturing program 18.

Even in a case where a tool path is generated by using a cutting conduction setting element, the control section 12c may use a tool path which has been generated by using the similar material design model 74, with respect to a completely matching element between the material design model 70 and the similar material design model 74. In a case where a tool path is generated by using a cutting conduction setting element, the control section 12c preferably generates a tool path which is changed according to a difference for a tool path which has been generated on the basis of the similar material design model 74 with respect to elements having a similarity and a difference between the material design model 70 and the similar material design model 74. Thus, in the present embodiment, the control section 12c performs a process of each step by using, as a reference, a tool path which has been generated on the basis of the similar material design model 74, in tool path generation step S66 in a case where a tool path is generated by using a cutting conduction setting element.

Figure 45:
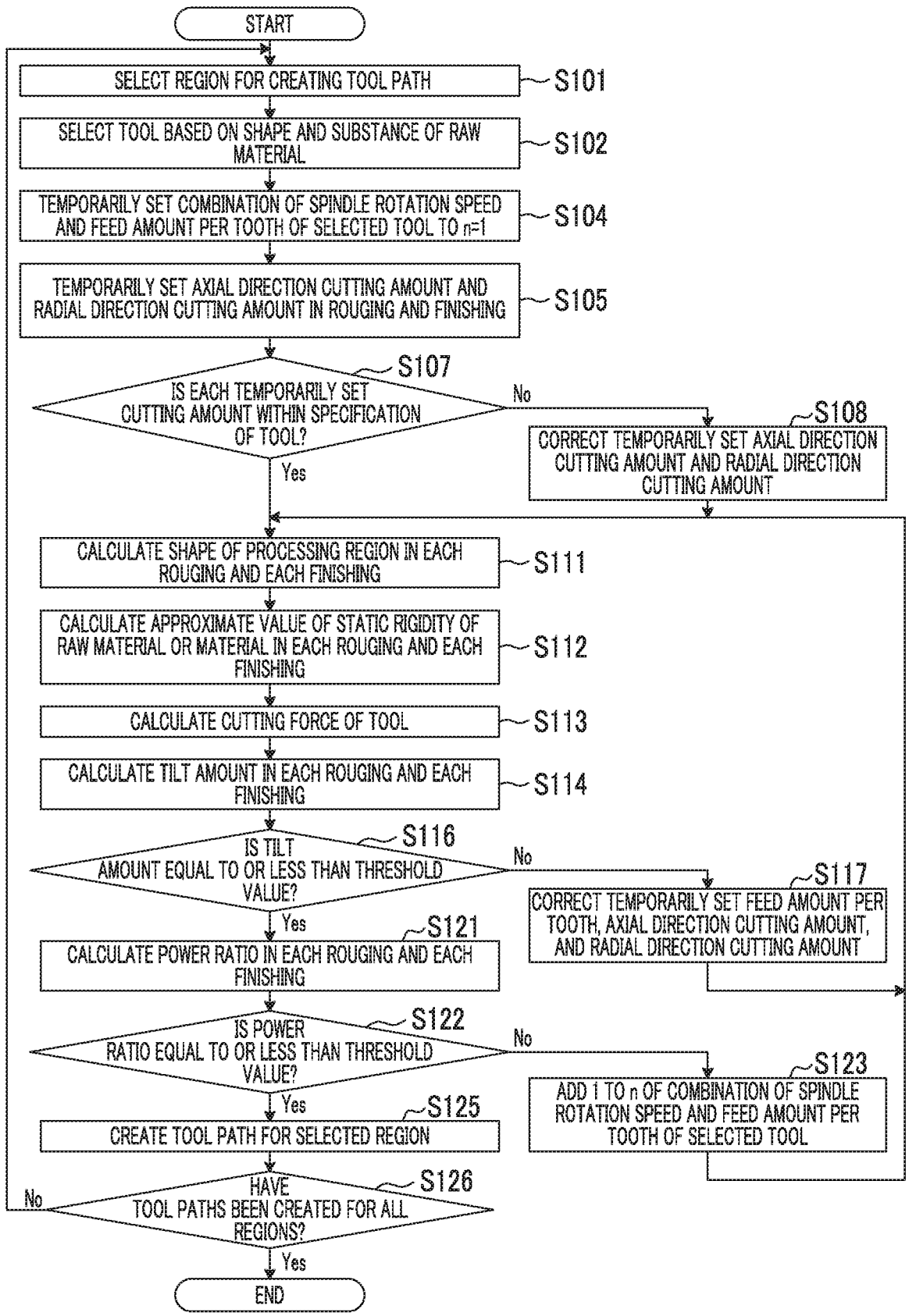
FIG. 45 is a flowchart illustrating an example of a detailed flow of a tool path generation step.

Hereinafter, a description will be made of details of tool path generation step S66 in a case where a tool path is generated by using a cutting conduction setting element, for example, a tool path for each of the flange surface processing element EL2 and the main plate portion surface processing element EL5 in the above example is generated. FIG. 45 is a flowchart illustrating an example of a detailed flow of tool path generation step S66 in this case. Tool path generation step S66 includes, as illustrated in FIG. 45, tool path generation region selection step S101, tool selection step S102, tool rotation speed/feed amount temporary setting step S104, cutting-amount-during-processing temporary step S105, cutting-amount-within-tool-specification determination step S107, temporarily-set-cutting-amount correction step S108, processing region shape calculation step S111, processing region static rigidity calculation step S112, tool cutting force calculation step S113, tilt amount calculation step S114, tilt-amount-within-threshold-value determination step S116, temporarily-set-feed amount/cutting amount correction step S117, power ratio calculation step S121, power-ratio-within-threshold-value determination step S122, tool temporary setting change step S123, selected region tool path generation step S125, and all-regions tool path generation determination step S126. Hereinafter, tool path generation region selection step S101, tool selection step S102, tool rotation speed/feed amount temporary setting step S104, cutting-amount-during-processing temporary step S105, cutting-amount-within-tool-specification determination step S107, temporarily-set-cutting-amount correction step S108, processing region shape calculation step S111, processing region static rigidity calculation step S112, tool cutting force calculation step S113, tilt amount calculation step S114, tilt-amount-within-threshold-value determination step S116, temporarily-set-feed amount/cutting amount correction step S117, power ratio calculation step S121, power-ratio-within-threshold-value determination step S122, tool temporary setting change step S123, selected region tool path generation step S125, and all-regions tool path generation determination step S126 will be respectively simply referred to as step S101, step S102, step S104, step S105, step S107, step S108, step S111, step S112, step S113, step S114, step S116, step S117, step S121, step S122, step S123, step S125, and step S126, as appropriate.

In tool path generation step S66 in a case where a tool path is generated by using a cutting conduction setting element, first, the control section 12c selects a region for generating a tool path (step S101). Specifically, the control section 12c selects elements for which tool paths are generated by using a cutting conduction setting element, from a first element one by one among from the elements read in step S64.

Next, the control section 12c selects a tool used for machining on the basis of the shape and the substance of the material design model 70 or the raw material design model 80 included in the cutting conduction setting element (step S102). Specifically, the control section 12c selects a tool suitable for a combination of the shape and the substance of the material design model 70 or the raw material design model 80 by using a database of combinations of the shape and the substance of the material design model 70 or the raw material design model 80 and tools suitable therefor. In step S102, an identical tool is preferably selected to be used for roughing and finishing performed on an identical element. In step S102, an identical tool is preferably selected to be used for all elements. In step S102, in a case where an identical tool is selected to be used, a tool is not changed for a selected portion, and thus it is possible to perform quick processing.

Figures 46, 47:
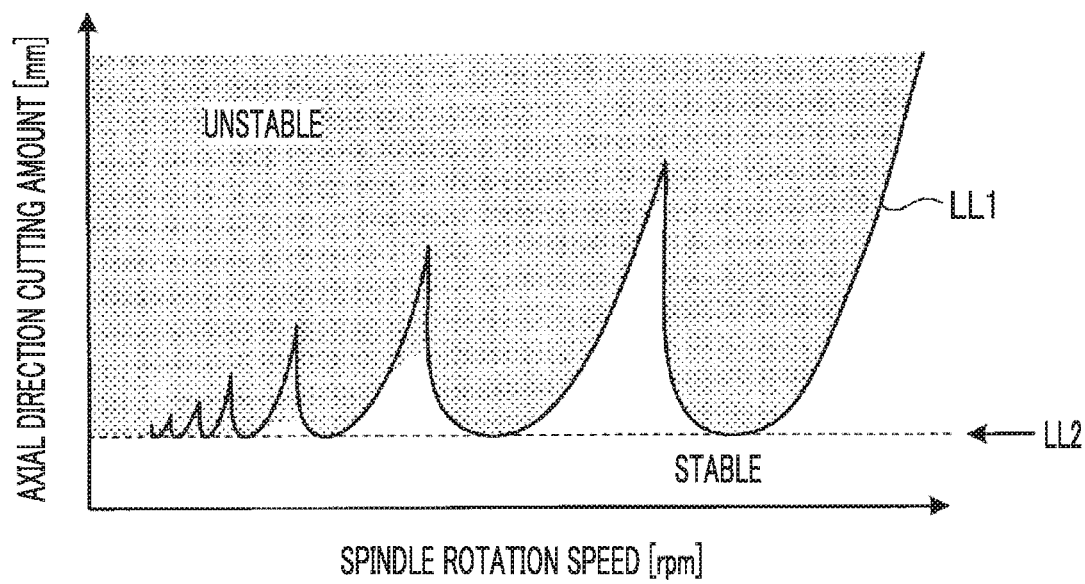
FIG. 46 is a diagram illustrating an example of a stable region of a tool.
FIG. 47 is a diagram illustrating roughing tool conditions which are examples of a combination of a spindle rotation speed of a tool and a feed amount per tooth in roughing.

Hereinafter, details of the database of combinations with suitable tools will be described. FIG. 46 is a diagram illustrating an example of a stable region of a tool. As illustrated in FIG. 46, a curve LL1 is a boundary between a region in which a tool is stable and a region in which the tool is unstable during processing. As illustrated in FIG. 46, a lower region of the curve LL1 is a region in which a tool is stable during, and an upper region of the curve LL1 a region in which the tool is unstable during processing. The stable region under the curve LL1 has a region called a stable packet in which an upper limit of an axial direction cutting amount is great according to a spindle rotation speed. The curve LL1 is obtained by solving a determinant formed of a matrix component of cutting force during processing, and a transfer function of a tool, a raw material, or a material. Measurement of a transfer function of a tool side and calculation of a matrix component of cutting force are possible by using dedicated programs. On the other hand, measurement of a transfer function of a raw material side or a material side and calculation of a matrix component of cutting force are difficult since the rigidity or the weight of the raw material side or the material side is changed during processing, and thus an eigenfrequency changes, in a case where a shape of the raw material side or the material side is complex.

Therefore, in the present embodiment, a straight line LL2 showing an unconditional stability limit which does not depend on a spindle rotation speed is used in order to generate a tool path for stable processing by simply taking into consideration a raw material side or a material side. As illustrated in FIG. 46, a region under the straight line LL2 is a region in which a tool is stable during processing regardless of a spindle rotation speed, and a region over the straight line LL2 is a region in which a tool may possibly be unstable during processing depending on a spindle rotation speed. The straight line LL2 showing an unconditional stability limit is required to be calculated analytically on the basis of the maximum negative real part of the transfer function.

Thus, in the present embodiment, an approximate value of the static rigidity of a raw material side or a material side, and cutting power or cutting force calculated on the basis of cutting conditions are obtained, a power ratio which is a ratio between the cutting power of a tool and the approximate value of the static rigidity of the raw material side and the material side, and a tilt amount which is a ratio between the cutting force of the tool and the approximate value of the static rigidity of the raw material side and the material side are calculated, conditions in which the tool is stable during processing are set on the basis of the power ratio and the tilt amount, and cutting conditions are set on the basis of the conditions.

Figures 48, 49:
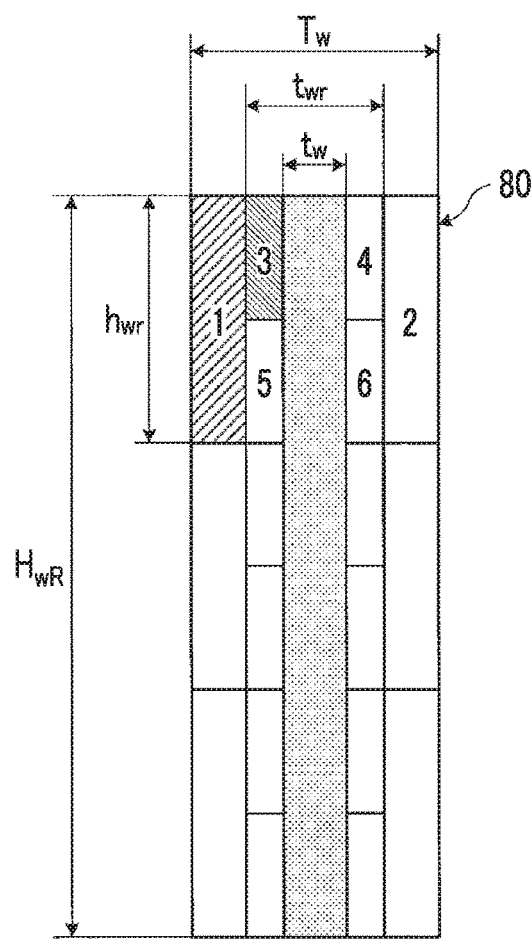
FIG. 48 is a diagram illustrating finishing tool conditions which are examples of a combination of a spindle rotation speed of a tool and a feed amount per tooth in finishing.
FIG. 49 is a diagram illustrating an example of an order of processing of a main plate raw material portion.

FIG. 47 is a diagram illustrating roughing tool conditions 83 which are examples of a combination of a spindle rotation speed of a tool and a feed amount per tooth in roughing. FIG. 48 is a diagram illustrating finishing tool conditions 84 which are example of a combination of a spindle rotation speed of a tool and a feed amount per tooth in finishing. As illustrated in FIG. 47, the roughing tool conditions 83 include a plurality of combinations of the kind of tool in roughing, a condition serial number n, a spindle rotation speed S (unit: $min^{-1}$), a feed amount fz per tooth (unit: mm/tooth), an axial direction cutting amount Ad (unit: mm), a radial direction cutting amount Rd (unit: mm). As illustrated in FIG. 48, the finishing tool conditions 84 include a plurality of combinations of the kind of tool in roughing, a condition serial number n, a spindle rotation speed S (unit: $min^{-1}$), a feed amount fz per tooth (unit: mm/tooth), an axial direction cutting amount Ad (unit: mm), a radial direction cutting amount Rd (unit: mm).

The kind of tool is included in the combinations of the roughing tool conditions 83 and the finishing tool conditions 84, as symbols such as A, B, . . . added to tools. The condition serial number n is a serial number added to each condition, such as 1, 2, 3, 4, . . . . The condition serial number n is added in an order of the spindle rotation speed S being higher in the same kind of tool. The spindle rotation speed S is a rotation speed of a spindle of a tool per minute. The spindle rotation speed S is set to a predefined value including a stable packet in the roughing tool conditions 83 and the finishing tool conditions 84 from the viewpoint of stability of processing. Specifically, the spindle rotation speed S is set to each value obtained by dividing 30000 $min^{-1}$ by an integer of 2 or greater in the roughing tool conditions 83 and the finishing tool conditions 84. The feed amount fz per tooth is a feed amount of a tool in a radial direction from contact of a certain tooth with a raw material or a material to contact of the next tooth with the raw material or the material. The axial direction cutting amount Ad is a processing amount (processing length) in a direction parallel to an axial direction of a tool in processing performed once. The radial direction cutting amount Rd is a processing amount (processing length) in a direction parallel to a radial direction of a tool in processing performed once.

The control section 12c temporarily sets a combination of the spindle rotation speed S and the feed amount fz per tooth of the tool used for machining, selected in step S102 in each of roughing and finishing (step S104). Specifically, in a case where the tool A is selected in step S102, the control section 12c temporarily sets, for example, a combination of the spindle rotation speed S and the feed amount fz per tooth in a combination with the lowest condition serial number n. In a case where the roughing tool conditions 83 and the finishing tool conditions 84 are used, the control section 12c temporarily sets the combination in a combination with the condition serial number n of 1, that is, a combination of the spindle rotation speed S of 15000 min$^{-1}$ and the feed amount fz per tooth of 0.1 mm/tooth.

Figure 50:
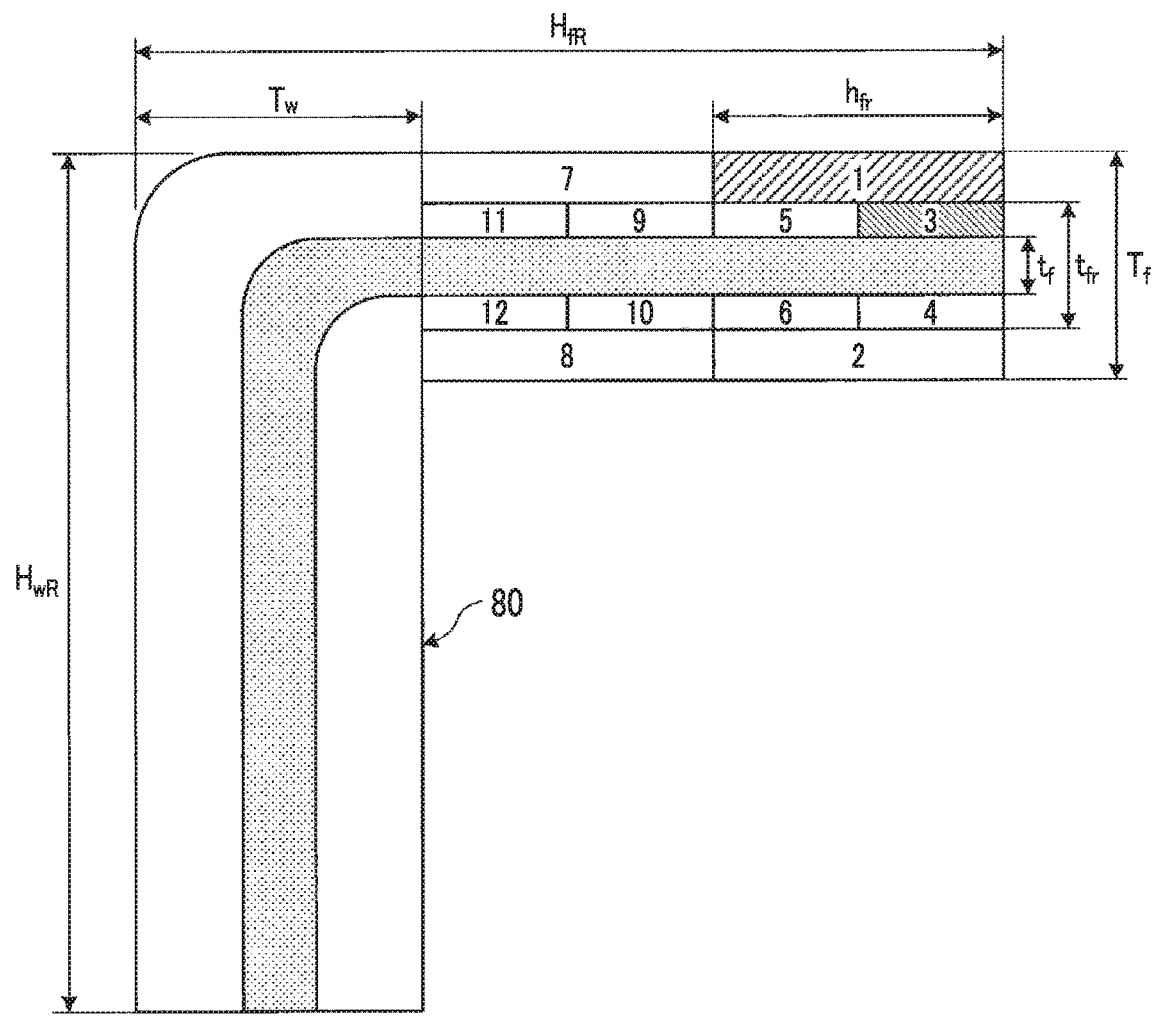
FIG. 50 is a diagram illustrating an example of an order of processing of a flange raw material portion.

After step S104, the control section 12c temporarily sets the axial direction cutting amount Ad and the radial direction cutting amount Rd in roughing and finishing by using information regarding the shape and information regarding the substance of the material design model 70 or the raw material design model 80 included in the cutting conduction setting element (step S105). Hereinafter, a specific method of temporarily setting the axial direction cutting amount Ad and the radial direction cutting amount Rd will be described in detail by using an example of processing the raw material design model 80. FIG. 49 is a diagram illustrating an example of an order of processing of the main plate raw material portion in the raw material design model 80. FIG. 50 is a diagram illustrating an example of an order of processing of the flange raw material portion in the raw material design model 80. In FIGS. 49 and 50, although not illustrated, the grip portion v is provided on the lower side in the drawing surface. In processing of the main plate raw material portion, the control section 12c temporarily sets a processing order to be a processing order corresponding to numerical values illustrated in FIG. 49 such that processing is performed from a farther side from the grip portion v toward a closer side thereto, that is, from the upper side in the drawing surface toward the lower side. In processing of the flange raw material portion, the control section 12c temporarily sets a processing order to be a processing order corresponding to numerical values illustrated in FIG. 50 such that processing is performed from a farther side from the main plate portion toward a closer side thereto, that is, from a distal end side of the flange raw material portion toward a basal end side thereof.

Specifically, the control section 12c temporarily sets a processing order in the main plate raw material portion of the raw material design model 80 such that roughing is performed on both surfaces of the main plate raw material portion as indicated by Nos. 1 and 2 in FIG. 49, and then finishing is performed twice on each of both of the surfaces of the main plate raw material portion from the farther side from the grip portion v toward the closer side thereto as indicated by Nos. 3, 4, 5, and 6 in FIG. 49. The control section 12c temporarily sets a processing order in the main plate raw material portion of the raw material design model 80 such that roughing and finishing are also performed on a location closer to the grip portion v than Nos. 1 to 6 in FIG. 49 in the same conditions and order than those of Nos. 1 to 6 in FIG. 49. As illustrated in FIG. 49, in the main plate raw material portion of the raw material design model 80, the control section 12c temporarily sets the axial direction cutting amount Ad in roughing to a height $h_{wr}$ in a direction parallel to the height direction of the main plate raw material portion, and the radial direction cutting amount Rd in roughing to a thickness $((T_w-t_{wr})/2)$ along the plate thickness direction of the main plate raw material portion. As illustrated in FIG. 49, in the main plate raw material portion of the raw material design model 80, the control section 12c temporarily sets the axial direction cutting amount Ad in finishing to a height $h_{wr}/2$ in the direction parallel to the height direction of the main plate raw material portion, and the radial direction cutting amount Rd in finishing to a thickness $((t_{wr}-t_w)/2)$ along the plate thickness direction of the main plate raw material portion. Consequently, the control section 12c temporarily sets a tool path until the main plate raw material portion of the raw material design model 80 is processed to have the same thickness as the plate thickness $t_w$ of the main plate portion of the material design model 70.

In the present embodiment, the control section 12c divides processing of the main plate raw material portion of the raw material design model 80 into two stages such as roughing and finishing in the direction parallel to the plate thickness direction of the main plate raw material portion as illustrated in FIG. 49, and temporarily sets a plate thickness of the main plate raw material portion after the roughing to the plate thickness $t_{wr}$, but is not limited thereto, and may divide the processing into three or more stages. In a case where processing is divided into two stages as in the present embodiment, the control section 12c preferably temporarily sets the plate thickness $t_{wr}$ such that a ratio between the thickness $((T_w-t_{wr})/2)$ which is the radial direction cutting amount Rd in roughing and the thickness $((t_{wr}-t_w)/2)$ which is the radial direction cutting amount Rd in finishing is an inverse number of a parameter based on a substance, which is predefined according to the rigidity of the substance. For example, in a case where the substance is aluminum, the control section 12c preferably temporarily sets the plate thickness $t_{wr}$ such that a ratio between the thickness $((T_w-t_{wr})/2)$ and the thickness $((t_{wr}-t_w)/2)$ is 5 which is an inverse number of 1/5. In this case, it is possible to increase a yield of processing, and also to quickly perform processing.

In the present embodiment, the control section 12c divides processing of the main plate raw material portion of the raw material design model 80 into three stages in the direction along the main plate raw material portion as illustrated in FIG. 49, but is not limited thereto, and the control section 12c may not divide the processing, may divide the processing into two stages, and may divide the processing into four or more stages. In a case of the present embodiment, the control section 12c preferably temporarily sets the height $h_{wr}$ and the plate thickness $t_{wr}$ such that a ratio between the height $h_{wr}$ which is a height along the main plate raw material portion in a processing region during roughing and the plate thickness $t_{wr}$ which is a thickness along the plate thickness direction of the main plate raw material portion in the processing region after the roughing is an inverse number of a parameter based on a substance, which is predefined according to the rigidity of the substance. The control section 12c preferably temporarily sets the height $h_{wr}$ such that a ratio between the height $h_{wr}/2$ which is a height along the main plate raw material portion in a processing region during finishing and the plate thickness $t_w$ which is a thickness along the plate thickness direction of the main plate raw material portion in the processing region during the finishing is an inverse number of a parameter based on a substance, which is predefined according to the rigidity of the substance. Also in this case, for example, in a case where the substance is aluminum, the control section

12c preferably temporarily sets the plate thickness $t_{wr}$ such that a ratio between the thickness $((T_w-t_{wr})/2)$ and the thickness $((t_{wr}-t_w)/2)$ is 5 which is an inverse number of ⅕. In this case, it is possible to increase a yield of processing, and also to quickly perform processing.

Alternatively, in a case where a division stage number of finishing in the direction along the main plate raw material portion for roughing is indicated by X, the control section 12c preferably temporarily sets X such that a ratio between the height $h_{wr}/X$ which is a height along the main plate raw material portion in a processing region during finishing and the plate thickness $t_w$ which is a thickness along the plate thickness direction of the main plate raw material portion in the processing region after the finishing is an inverse number of a parameter based on a substance, which is predefined according to the rigidity of the substance. Also in this case, for example, in a case where the substance is aluminum, the control section 12c preferably temporarily sets X such that a ratio between the thickness $((T_w-t_{wr})/2)$ and the thickness $((t_{wr}-t_w)/2)$ is 5 which is an inverse number of ⅕. In this case, it is possible to increase a yield of processing, and also to quickly perform processing.

The control section 12c temporarily sets a processing order in the flange raw material portion of the raw material design model 80 such that roughing is performed on both surfaces of the flange raw material portion as indicated by Nos. 1 and 2 in FIG. 50, and then finishing is performed twice on each of both of the surfaces of the main plate raw material portion from the farther side from the main plate raw material portion toward the closer side thereto as indicated by Nos. 3, 4, 5, and 6 in FIG. 50. The control section 12c temporarily sets a processing order in the flange raw material portion of the raw material design model 80 such that roughing and finishing are also performed on a location closer to the main plate raw material portion than Nos. 1 to 6 in FIG. 50, for example, Nos. 7 to 12 in FIG. 50 in the same conditions and order than those of Nos. 1 to 6 in FIG. 50. As illustrated in FIG. 50, in the flange raw material portion of the raw material design model 80, the control section 12c temporarily sets the axial direction cutting amount Ad in roughing to a height $h_{fr}$ in a direction parallel to the height direction of the flange raw material portion, and the radial direction cutting amount Rd in roughing to a thickness $((T_f-t_{fr})/2)$ along the plate thickness direction of the flange raw material portion. As illustrated in FIG. 50, in the flange raw material portion of the raw material design model 80, the control section 12c temporarily sets the axial direction cutting amount Ad in finishing to a height $h_{fr}/2$ in the direction parallel to the height direction of the flange raw material portion, and the radial direction cutting amount Rd in finishing to a thickness $((t_{fr}-t_f)/2)$ along the plate thickness direction of the flange raw material portion. Consequently, the control section 12c temporarily sets a tool path until the flange raw material portion of the raw material design model 80 is processed to have the same thickness as the plate thickness $t_f$ of the flange of the material design model 70.

In the present embodiment, the control section 12c divides processing of the flange raw material portion of the raw material design model 80 into two stages such as roughing and finishing in the direction parallel to the plate thickness direction of the flange raw material portion as illustrated in FIG. 50, and temporarily sets a plate thickness of the flange raw material portion after the roughing to the plate thickness $t_{fr}$, but is not limited thereto, and may divide the processing into three or more stages. In a case where processing is divided into two stages as in the present embodiment, the control section 12c preferably temporarily sets the plate thickness $t_{fr}$ such that a ratio between the thickness $((T_f-t_{fr})/2)$ which is the radial direction cutting amount Rd in roughing and the thickness $((t_{fr}-t_f)/2)$ which is the radial direction cutting amount Rd in finishing is an inverse number of a parameter based on a substance, which is predefined according to the rigidity of the substance. For example, in a case where the substance is aluminum, the control section 12c preferably temporarily sets the plate thickness $t_{fr}$ such that a ratio between the thickness $((T_f-t_{fr})/2)$ and the thickness $((t_{fr}-t_f)/2)$ is 5 which is an inverse number of ⅕. In this case, it is possible to increase a yield of processing, and also to quickly perform processing.

In the present embodiment, the control section 12c divides processing of the flange raw material portion of the raw material design model 80 into three stages in the direction along the flange raw material portion as illustrated in FIG. 50, but is not limited thereto, and the control section 12c may not divide the processing, may divide the processing into two stages, and may divide the processing into four or more stages. In a case of the present embodiment, the control section 12c preferably temporarily sets the height $h_{fr}$ and the plate thickness $t_{fr}$ such that a ratio between the height $h_{fr}$ which is a height along the flange raw material portion in a processing region during roughing and the plate thickness $t_{fr}$ which is a thickness along the plate thickness direction of the flange raw material portion in the processing region after the roughing is an inverse number of a parameter based on a substance, which is predefined according to the rigidity of the substance. The control section 12c preferably temporarily sets the height $h_{fr}$ such that a ratio between the height $h_{fr}/2$ which is a height along the flange raw material portion in a processing region during finishing and the plate thickness $t_f$ which is a thickness along the plate thickness direction of the flange raw material portion in the processing region during the finishing is an inverse number of a parameter based on a substance, which is predefined according to the rigidity of the substance. Also in this case, for example, in a case where the substance is aluminum, the control section 12c preferably temporarily sets the plate thickness $t_f$ and X such that a ratio between the thickness $((T_f-t_{fr})/2)$ and the thickness $((t_{fr}-t_f)/2)$ is 5 which is an inverse number of ⅕. In this case, it is possible to increase a yield of processing, and also to quickly perform processing.

Alternatively, in a case where a division stage number of finishing in the direction along the flange raw material portion for roughing is indicated by X, the control section 12c preferably temporarily sets X such that a ratio between the height $h_{fr}/X$ which is a height along the flange raw material portion in a processing region during finishing and the plate thickness $t_f$ which is a thickness along the plate thickness direction of the flange raw material portion in the processing region after the finishing is an inverse number of a parameter based on a substance, which is predefined according to the rigidity of the substance. Also in this case, for example, in a case where the substance is aluminum, the control section 12c preferably temporarily sets X such that a ratio between the thickness $((T_f-t_{fr})/2)$ and the thickness $((t_{fr}-t_f)/2)$ is 5 which is an inverse number of ⅕. In this case, it is possible to increase a yield of processing, and also to quickly perform processing.

After the process of step S105, the control section 12c determines whether or not the axial direction cutting amount Ad and the radial direction cutting amount Rd which are temporarily set in step S105 are within a specification of the tool which is temporarily set in step S104 (step S107).

Specifically, the control section 12c determines whether or not the axial direction cutting amount Ad and the radial direction cutting amount Rd in each of roughing and finishing which are temporarily set in step S105 are respectively equal to or smaller than the axial direction cutting amount Ad and the radial direction cutting amount Rd combined with the spindle rotation speed S and the feed amount fz per tooth which are temporarily set in step S104. In a case where the temporarily set axial direction cutting amount Ad and radial direction cutting amount Rd are within the specification of the tool (Yes in step S107), the control section 12c causes the process to proceed to step S111. On the other hand, in a case where the temporarily set axial direction cutting amount Ad and radial direction cutting amount Rd exceeds the specification of the tool (No in step S107), the control section 12c corrects the temporarily set axial direction cutting amount Ad and radial direction cutting amount Rd to values within the specification of the tool (step S108), and causes the process to proceed to step S111. In a case where the process of step S108 is performed, the control section 12c may correct the temporarily set axial direction cutting amount Ad and radial direction cutting amount Rd to values within the specification of the tool by increasing the number of stages into which processing is divided.

In the tool path for roughing and the tool path for finishing which are temporarily set in step S105, the control section 12c calculates shapes of processing regions in each roughing and each finishing by using the information regarding the shape and the information regarding the substance of the material design model 70 or the raw material design model 80 included in the cutting conduction setting element (step S111). Specifically, in a case where the processing region is included in the main plate raw material portion, the control section 12c calculates a height along the main plate raw material portion from a front end of the processing region to the grip portion v. For example, in a case where any one of Nos. 1, 2, 3, and 4 illustrated in FIG. 49 is a processing region, the control section 12c calculates $H_{wR}$ corresponding to the height. In a case where the processing region is included in the flange raw material portion, the control section 12c calculates a height along the flange raw material portion from a front end of the processing region to an end opposite side the processing region of the main plate raw material portion. For example, in a case where any one of Nos. 1, 2, 3, and 4 illustrated in FIG. 50 is a processing region, the control section 12c calculates $H_{fR}$ corresponding to the height.

After the process of step S111, the control section 12c calculates an approximate value of the static rigidity in each roughing and each finishing, that is, an approximate value of the static rigidity of the raw material or the material when the processing region is processed, by using the information regarding the shape and the information regarding the substance of the material design model 70 or the raw material design model 80 included in the cutting conduction setting element, on the basis of the shapes of the processing regions in each roughing and each finishing which are calculated in step S111 (step S112). In the process of step S112, the control section 12c calculates an approximate value of the static rigidity of an element which may be influenced during processing in the raw material or the material when the processing region is processed. Hereinafter, details of a method of calculating an approximate value of the static rigidity of the raw material or the material when the processing region is processed in the process of step S112 will be described by using an example of processing a first processing region of the raw material design model 80 illustrated in FIG. 49 and an example of processing a first processing region of the raw material design model 80 illustrated in FIG. 50.

In a case of processing the first processing region of the raw material design model 80 illustrated in FIG. 49, a sectional secondary moment $I_{wr}$ regarding an axial direction in roughing is obtained according to the following Equation 1 by using the length l of the main plate portion of the material design model 70 and the plate thickness $T_w$ of the main plate raw material portion of the raw material design model 80.

$$I_{wr}=lT_w^3/12 \tag{1}$$

In a case where the first processing region of the raw material design model 80 illustrated in FIG. 49 is processed, an approximate value $k_{wr}$ of the static rigidity in roughing is obtained according to the following Equation 2 by using the Young's modulus E of the raw material, $H_{wR}$ calculated in step S111, and the sectional secondary moment $I_{wr}$ obtained according to Equation 1.

$$k_{wr}=3EI_{wr}/H_{wR}^3 \tag{2}$$

In a case of processing the first processing region of the raw material design model 80 illustrated in FIG. 49, a sectional secondary moment $I_{wf}$ regarding an axial direction in finishing is obtained according to the following Equation 3 by using the length l of the main plate portion of the material design model 70 and the plate thickness $t_{wr}$ of the main plate raw material portion of the raw material design model 80 after roughing.

$$I_{wf}=lt_{wr}^3/12 \tag{3}$$

In a case where the first processing region of the raw material design model 80 illustrated in FIG. 49 is processed, an approximate value $k_{wf}$ of the static rigidity in finishing is obtained according to the following Equation 4 by using the Young's modulus E of the raw material, $H_{wR}$ calculated in step S111, $h_{wr}$ set in step S105, the sectional secondary moment $I_{wr}$ obtained according to Equation 1, and the sectional secondary moment $I_{wf}$ obtained according to Equation 3.

$$k_{wf}=3EI_{wr}I_{wf}/(I_{wr}H_{wR}^3-I_{wr}h_{wr}^3+I_{wf}h_{wr}^3) \tag{4}$$

In a case of processing the first processing region of the raw material design model 80 illustrated in FIG. 50, a sectional secondary moment $I_{fw}$ regarding the axial direction of the main plate raw material portion in roughing and finishing is obtained according to the following Equation 5 by using the length l of the main plate portion of the material design model 70 and the plate thickness $T_w$ of the main plate raw material portion of the raw material design model 80.

$$I_{fw}=lT_w^3/12 \tag{5}$$

In a case of processing the first processing region of the raw material design model 80 illustrated in FIG. 50, a sectional secondary moment $I_{fr}$ regarding the axial direction of the flange raw material portion in roughing is obtained according to the following Equation 6 by using the length l of the main plate portion of the material design model 70, and the plate thickness $T_f$ of the flange raw material portion of the raw material design model 80.

$$I_{fr}=lT_f^3/12 \tag{6}$$

In a case where the first processing region of the raw material design model 80 illustrated in FIG. 50 is processed, an approximate value $k_{fr}$ of the static rigidity in roughing is obtained according to the following Equation 7 by using the Young's modulus E of the raw material, $H_{wR}$ calculated in step S111, $H_{fR}$ calculated in step S111, the sectional secondary moment $I_{fw}$ obtained according to Equation 5, and the sectional secondary moment $I_{fr}$ obtained according to Equation 6.

$$k_{fr}=3EI_{fw}I_{fr}/(H_{fR}^2(3I_{fr}H_{wR}+I_{fw}H_{fR})) \tag{7}$$

In a case of processing the first processing region of the raw material design model 80 illustrated in FIG. 50, a sectional secondary moment $I_{ff}$ regarding the axial direction of the flange raw material portion in finishing is obtained according to the following Equation 8 by using the length l of the main plate portion of the material design model 70, and the plate thickness $t_{fr}$ of the flange raw material portion of the raw material design model 80 after roughing.

$$I_{ff}=lt_{fr}^3/12 \tag{8}$$

In a case where the first processing region of the raw material design model 80 illustrated in FIG. 50 is processed, an approximate value $k_{ff}$ of the static rigidity in finishing is obtained according to the following Equation 9 by using the Young's modulus E of the raw material, $H_{wR}$ calculated in step S111, $h_{fr}$ set in step S105, $H_{fR}$ calculated in step S111, the sectional secondary moment $I_{fw}$ obtained according to Equation 5, the sectional secondary moment $I_{fr}$ obtained according to Equation 6, and the sectional secondary moment $I_{ff}$ obtained according to Equation 8.

$$k_{ff}=3EI_{fr}I_{ff}I_{fw}/(3H_{fR}^2H_{wR}I_{fr}I_{ff}+H_{fR}^3I_{ff}I_{fw}-h_{fr}^3I_{ff}I_{fw}+h_{fr}^3I_{fr}I_{fw}) \tag{9}$$

As mentioned above, in the process of step S112, the control section 12c can calculate the approximate value $k_{wr}$ of the static rigidity in roughing and the approximate value $k_{wf}$ of the static rigidity in finishing in a case where the first processing region of the raw material design model 80 illustrated in FIG. 49 is processed, and the approximate value $k_{fr}$ of the static rigidity in roughing and the approximate value $k_{ff}$ of the static rigidity in finishing in a case where the first processing region of the raw material design model 80 illustrated in FIG. 50 is processed. By using the same methods as described above, the control section 12c calculates an approximate value of the static rigidity in roughing and an approximate value of the static rigidity in finishing in all processing regions included in a region for which the tool path selected in step S101 is generated through the process of step S112.

After the process of step S112, the control section 12c calculates cutting force on the basis of the spindle rotation speed S and the feed amount fz per tooth of the tool which are temporarily set in step S104, and the axial direction cutting amount Ad and the radial direction cutting amount Rd which are temporarily set in step S105 or step S108 (step S113). Hereinafter, details of a method of calculating cutting force in the process of step S113 will be described.

Cutting power Pc required to calculate cutting force Fc is obtained as in the following Equation 10 by using the axial direction cutting amount Ad temporarily set in step S105 or step S108, the radial direction cutting amount Rd temporarily set in step S105 or step S108, a feed amount F of the tool, and a specific cutting resistance Kc.

$$Pc=(Rd \times Ad \times F \times Kc)/(60 \times 10^6) \text{ [kW]} \tag{10}$$

Here, the feed amount F of the tool is expressed as in the following Equation 11 by using the spindle rotation speed S of the tool temporarily set in step S104, the feed amount fz per tooth of the tool temporarily set in step S104, and the number N of teeth of the tool.

$$F=S \times fz \times N \text{ [mm/min]} \tag{11}$$

Figures 51, 52:
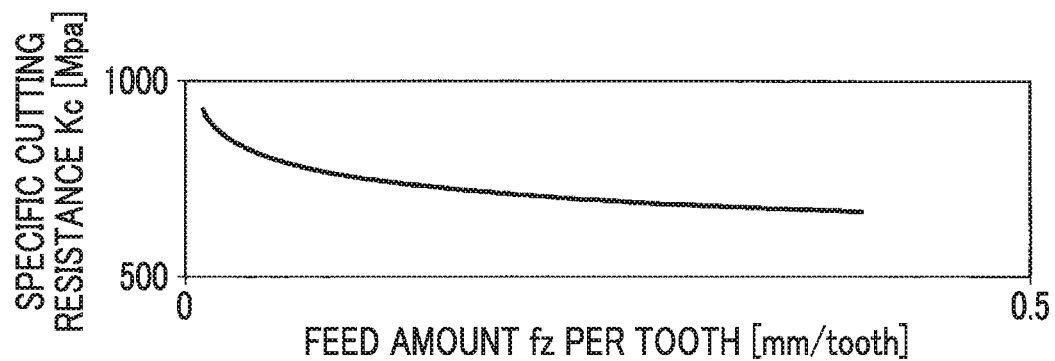
FIG. 51 is a diagram illustrating an example of a relationship between a feed amount per tooth and a specific cutting resistance.
FIG. 52 is a diagram illustrating an example of cutting condition calculation.

FIG. 51 is a diagram illustrating an example of a relationship between the feed amount fz per tooth and the specific cutting resistance Kc. The specific cutting resistance Kc has a relationship of being attenuated according to the feed amount fz per tooth as illustrated in FIG. 51. A relationship between the specific cutting resistance Kc and the feed amount fz per tooth is determined depending on a combination of a tool and a raw material or a material. A representative relationship may be used as a relationship between the specific cutting resistance Kc and the feed amount fz per tooth. In the present embodiment, in a case where the control section 12c has data regarding a relationship determined depending on a combination of a tool and a raw material or a material, the specific cutting resistance Kc may be calculated on the basis of the feed amount fz per tooth by using the relationship. In the present embodiment, in a case where the control section 12c does not have data regarding a relationship determined depending on a combination of a tool and a raw material or a material, the specific cutting resistance Kc may be calculated on the basis of the feed amount fz per tooth by using a relationship which is most appropriate for a combination of a tool and a raw material or a material among representative relationships.

The cutting force Fc is calculated by using the cutting power Pc expressed in Equation 10, and a cutting velocity Vc. The cutting velocity Vc is expressed as in the following Equation 12 by using a tool diameter, that is, a diameter Da of the tool and the spindle rotation speed S of the tool.

$$Vc=\pi Da \times S/1000 \text{ [m/min]} \tag{12}$$

The cutting force Fc is obtained according to the following Equation 13 by using the cutting power Pc expressed in Equation 10 and the cutting velocity Vc expressed in Equation 12.

$$Fc=Pc/Vc=(Rd \times Ad \times fz \times N \times Kc)/\pi Da \text{ [N]} \tag{13}$$

As mentioned above, the control section 12c may calculate the cutting force Fc of the tool through the process of step S113.

After the process of step S113, the control section 12c calculates a tilt amount δ on the basis of the approximate value of the static rigidity in each of roughing and finishing calculated in step S112, and the cutting force Fc calculated in step S113 (step S114). Specifically, in a case where all kinds of approximate values of the static rigidity are collectively indicated by k, the control section 12c calculates the tilt amount δ (unit: μm) according to the following Equation 14 by using the approximate value k of the static rigidity and the cutting force Fc. The tilt amount δ is a ratio between the cutting force Fc and the approximate value k of the static rigidity.

$$\delta=Fc/k \times 1000 \tag{14}$$

After the process of step S114, the control section 12c determines whether or not the tilt amount δ is within a threshold value (step S116). In a case where the tilt amount δ in roughing is determined, the control section 12c determines whether or not the tilt amount δ in roughing is equal to or smaller than a threshold value δr of the tilt amount in roughing. In a case where the tilt amount δ in finishing is determined, the control section 12c determines whether or not the tilt amount δ in finishing is equal to or smaller than a threshold value δf of the tilt amount in finishing which is different from the threshold value δr of the tilt amount in roughing. The threshold value δr of the tilt amount in roughing is greater than the threshold value δf of the tilt amount in finishing. The control section 12c preferably sets a ratio between the threshold value δr of the tilt amount in roughing and the threshold value δf of the tilt amount in finishing to an inverse number of a parameter based on a substance, predefined according to the rigidity of the substance. For example, in a case where the substance is aluminum, the control section 12c preferably sets a ratio between the threshold value δr of the tilt amount in roughing and the threshold value δf of the tilt amount in finishing to 5 which is an inverse number of ⅕. In this case, it is possible to increase a yield of processing, and also to quickly perform processing. Specifically, the threshold value δr of the tilt amount in roughing and the threshold value δf of the tilt amount in finishing are preferably respectively, for example, 100 μm and 20 μm. In the process of step S116, the control section 12c performs separate determinations in roughing and in finishing.

In a case where the tilt amount δ is within the threshold value (Yes in step S116), the control section 12c causes process to proceed to step S121. On the other hand, in a case where the tilt amount δ is not within the threshold value (No in step S116), the control section 12c performs correction of reducing the feed amount fz per tooth, the axial direction cutting amount Ad, and the radial direction cutting amount Rd which are temporarily set (step S117), and performs the processes of step S111 to step S116 on the basis of the corrected feed amount fz per tooth, axial direction cutting amount Ad, and radial direction cutting amount Rd. In a case where the tilt amount δ in one of roughing and finishing is within the threshold value (Yes in step S116), and the tilt amount δ in the other processing is not within the threshold value (No in step S116), the control section 12c performs the process of step S121 in the case where the tilt amount δ in one of roughing and finishing is within the threshold value, and performs the process of the step S117 and the processes of step S111 to step S116 in the case where the tilt amount δ in the other processing is not within the threshold value. The control section 12c repeatedly performs the process of step S117 and the processes of step S111 to step S116 until it is determined that the tilt amount δ is within the threshold value.

In a case where the tilt amount δ is within the threshold value (Yes in step S116), the control section 12c calculates a power ratio counterclockwise-T on the basis of the approximate value of the static rigidity in each of roughing and finishing, calculated in step S112, and the cutting power Pc calculated in step S113 (step S121). Specifically, in a case where all kinds of approximate values of the static rigidity are collectively indicated by k, the control section 12c calculates the power ratio counterclockwise-T according to the following Equation 15 by using the approximate value k of the static rigidity and the cutting power Pc. The power ratio counterclockwise-T is a ratio between the cutting power Pc and the approximate value k of the static rigidity.

$$\text{counterclockwise-}T = Pc/k \times 1000 \quad (15)$$

After the process of step S121, the control section 12c determines whether or not the power ratio counterclockwise-T is within a threshold value (step S122). In a case where the power ratio counterclockwise-T in roughing is determined, the control section 12c determines whether or not the power ratio counterclockwise-T in roughing is equal to or less than a threshold value counterclockwise-Tr of the power ratio in roughing. In a case where the power ratio counterclockwise-T in finishing is determined, the control section 12c determines whether or not the power ratio counterclockwise-T in finishing is equal to or less than a threshold value counterclockwise-Tf of the power ratio in finishing, which is different from the threshold value counterclockwise-Tr of the power ratio in roughing. The threshold value counterclockwise-Tr of the power ratio in roughing is greater than the threshold value counterclockwise-Tf of the power ratio in finishing. The control section 12c preferably sets a ratio between the threshold value counterclockwise-Tr of the power ratio in roughing and the threshold value counterclockwise-Tf of the power ratio in finishing to an inverse number of a parameter based on a substance, predefined according to the rigidity of the substance. For example, in a case where the substance is aluminum, the control section 12c preferably sets a ratio between the threshold value counterclockwise-Tr of the power ratio in roughing and the threshold value counterclockwise-Tf of the power ratio in finishing to 5 which is an inverse number of ⅕. In this case, it is possible to increase a yield of processing, and also to quickly perform processing. Specifically, the threshold value counterclockwise-Tr of the power ratio in roughing and the threshold value counterclockwise-Tf of the power ratio in finishing are preferably respectively, for example, 0.6 and 0.12. In the process of step S122, the control section 12c performs separate determinations in roughing and in finishing.

In a case where the power ratio counterclockwise-T is within the threshold value (Yes in step S122), the control section 12c generates a tool path for the region selected in step S101 on the basis of the temporarily set conditions (step S125), and causes the process to proceed to step S126. On the other hand, in a case where the power ratio counterclockwise-T is not within the threshold value (No in step S122), the control section 12c performs correction of adding 1 to the condition serial number n attached to the combination of the spindle rotation speed S and the feed amount fz per tooth of the selected tool (step S123), and performs the processes of step S111 to step S122 on the basis of the corrected spindle rotation speed S and feed amount fz per tooth. In a case where the power ratio counterclockwise-T in one of roughing and finishing is within the threshold value (Yes in step S122), and the power ratio counterclockwise-T in the other processing is not within the threshold value (No in step S122), the control section 12c performs the process of step S125 in the case where the power ratio counterclockwise-T in one of roughing and finishing is within the threshold value, and performs the process of step S123 and the processes of step S111 to step S122 in the case where the power ratio counterclockwise-T in the other processing is not within the threshold value. The control section 12c repeatedly performs the process of step S123 and the processes of step S111 to step S122 until it is determined that the power ratio counterclockwise-T is within the threshold value.

FIG. 52 is a diagram illustrating an example of cutting condition calculation. In a case where a tool path for the region selected in step S101 is generated, as illustrated in FIG. 52, the control section 12c determines the axial direction cutting amount Ad and the radial direction cutting amount Rd in each of roughing and finishing, and determines a plate thickness and a height of a processing region in a raw material before roughing, a plate thickness and a height of the processing region after roughing and finishing, and a plate thickness and a height of a processing region in a material after finishing.

After the process of step S125, the control section 12c determines whether or not tool paths have been generated for all regions (step S126). Specifically, the control section 12c determines whether or not tool paths have been generated for all elements by using the cutting conduction setting element among the elements read in step S64. In a case where tool paths have been generated for all regions (Yes in step S126), the control section 12c finishes the process of tool path generation step S66, and causes the process to proceed to tool path connection step S67 illustrated in FIG. 28. On the other hand, in a case where tool paths have not been generated for all regions (No in step S126), the control section 12c causes the process to proceed to step S101, selects a region for which a tool path is not generated (step S101), performs the processes of step S102 to step S125 on the selected new region as described above, and then performs the process of step S126 thereon. The control section 12c repeatedly performs the processes of step S101 to step S126 until tool paths for all regions are generated.

Referring to FIG. 28 again, after the process of step S66, the control section 12c connects the tool paths generated for the respective elements in step S66, so as to create the numerical control program 19 (step S67). Specifically, the control section 12c connects the tool paths generated for the respective elements in step S66 on the basis of the processing order included in the tool path generation element created in step S78, so as to create the numerical control program 19. In other words, the control section 12c connects tool paths corresponding to elements far from the grip portion v and tool paths corresponding to elements close thereto to each other in this order. The control section 12c connects a tool path corresponding to an element including the flange, a tool path corresponding to an element including the cross part, and a tool path corresponding to an element including the main plate portion to each other in this order. The control section 12c connects a tool path corresponding to an element including an end surface along a direction orthogonal to the axial direction and a tool path corresponding to an element including a surface along the axial direction to each other in this order. With respect to the tool path corresponding the element including the cross part and the tool path corresponding to the element including the main plate portion, the control section 12c may sequentially connect the tool paths corresponding to the elements to each other as a whole in an order of being far from the grip portion v.

After the process of step S67, the control section 12c verifies whether or not the raw material or the material, a grip member gripping the raw material or the material, and a tool processing the raw material or the material physically interfere with each other in a case where the numerical control program 19 created in step S67 is executed by the control section 13c of the machining device 13 (step S69). In a case where it is determined that physical interference occurs in the process of step S69, the control section 12c corrects the numerical control program 19 such that the physical interference does not occur. In a case where it is determined that physical interference does not occur in the process of step S69, the control section 12c verifies that physical interference does not occur without correcting the numerical control program 19. After the process of step S69, the control section 12c performs a post-process which is a process of enabling the numerical control program 19 to be executed by the control section 13c of the machining device 13 on the numerical control program 19, and acquires the numerical control program 19 which can be executed by the control section 13c of the machining device 13. Consequently, the control section 12c finishes a series of flows of the numerical control program generation method.

In the numerical control program generation system 12, the numerical control program generation program 16, and the numerical control program generation method processed thereby according to the present embodiment, the control section 12c uses an element regarding a shape of a material created in element creation step S62 for tool path generation step S66 of a tool path in which a route of a processing operation is coded, through element reading step S64. Thus, in the numerical control program generation system 12, the numerical control program generation program 16, and the numerical control program generation method processed thereby according to the present embodiment, a cutting condition corresponding to a processing shape can be set, and thus it is possible to generate a tool path in which a route of a processing operation is coded according to the processing shape.

In the numerical control program generation system 12, the numerical control program generation program 16, and the numerical control program generation method processed thereby according to the present embodiment, the control section 12c may compare the material design model 70 with the similar material design model 74, and create an element by correlating corresponding portions of the material design model 70 and the similar material design model 74 with each other, in element creation step S62, read a similarity and a difference between the correlated portions in element creation step S62 in element reading step S64, and use a tool path generated on the basis of the similar material design model 74 as a tool path corresponding to an element including the similarity, and generate a tool path to which a tool path generated on the basis of the similar material design model 74 is changed according to the difference, as a tool path corresponding to an element including the difference, in the tool path generation step S66. Thus, in the numerical control program generation system 12, the numerical control program generation program 16, and the numerical control program generation method processed thereby according to the present embodiment, it is possible to highly accurately create the numerical control program 19 regarding processing of a material having a large number of considerably similar shapes.

In the numerical control program generation system 12, the numerical control program generation program 16, and the numerical control program generation method processed thereby according to the present embodiment, the control section 12c may select the similar material design model 74 in element creation step S62 on the basis of at least one of the raw material used for the material, the type and a size of a shape of the material design model 70, an angle of a flange provided in the material design model 70, the extent of change in the plate thickness $t_f$ of the flange, and the presence or absence of the mouse hole MH. Thus, in the numerical control program generation system 12, the numerical control program generation program 16, and the numerical control program generation method processed thereby according to the present embodiment, it is possible to select the similar material design model 74 with high accuracy.

In the numerical control program generation system 12, the numerical control program generation program 16, and the numerical control program generation method processed thereby according to the present embodiment, in the element creation step S62, the control section 12c may extract surface elements included in the raw material or the material, set a surface element including a straight line corresponding to the longest distance between two points as the first reference surface 76 among the surface elements, set a surface element including a straight line corresponding to the longest distance between two points as the second reference surface 77 among surface elements orthogonal to the first reference surface 76, create the coordinate axes 78 having an intersection line between the first reference surface 76 and the second reference surface 77 as an X axis and one straight line orthogonal to the first reference surface 76 as a Z axis, and automatically create an element of the raw material or the material by using the created coordinate axes 78 as references. Therefore, in the numerical control program generation system 12, the numerical control program generation program 16, and the numerical control program generation method processed thereby according to the present embodiment, it is possible to automatically create an element with high accuracy.

In the numerical control program generation system 12, the numerical control program generation program 16, and the numerical control program generation method processed thereby according to the present embodiment, in element creation step S62, the control section 12c may set surface elements, end part elements, an cross part element where two or more surface elements cross each other, and set some surface elements and cross part elements influenced by the rigidity of the raw material or the material, as elements for generating a tool path by using the cutting conduction setting elements which are elements for setting conditions for a processing operation. Therefore, in the numerical control program generation system 12, the numerical control program generation program 16, and the numerical control program generation method processed thereby according to the present embodiment, it is possible to efficiently set a cutting condition for only an element for which the cutting condition is required to be set, according to a processing shape.

In the numerical control program generation system 12, the numerical control program generation program 16, and the numerical control program generation method processed thereby according to the present embodiment, the control section 12c may read information regarding whether or not an element is set as an element for which a tool path is generated by using the cutting conduction setting elements in element reading step S64, and create cutting conditions on the basis of the cutting conduction setting elements with respect to an element set in the cutting conduction setting elements, and generate a tool path satisfying the cutting conditions, in tool path generation step S66. Therefore, in the numerical control program generation system 12, the numerical control program generation program 16, and the numerical control program generation method processed thereby according to the present embodiment, it is possible to efficiently set a cutting condition for only an element for which the cutting condition is required to be set, according to a processing shape.

In the numerical control program generation system 12, the numerical control program generation program 16, and the numerical control program generation method processed thereby according to the present embodiment, in tool path generation step S66, the control section 12c may generate cutting conditions on the basis of the power ratio counterclockwise-T which is a ratio between the cutting power Pc of a tool used for machining and the approximate value k of the static rigidity of an element, and the tilt amount δ which is a ratio between the cutting force Fc and the approximate value k of the static rigidity. Thus, in the numerical control program generation system 12, the numerical control program generation program 16, and the numerical control program generation method processed thereby according to the present embodiment, it is possible to efficiently set a cutting condition for only an element for which the cutting condition is required to be set, according to a processing shape. In the numerical control program generation system 12, the numerical control program generation program 16, and the numerical control program generation method processed thereby according to the present embodiment, it is possible to set a cutting condition causing a high yield and also to set a cutting condition causing quick processing.

In the numerical control program generation system 12, the numerical control program generation program 16, and the numerical control program generation method processed thereby according to the present embodiment, in tool path connection step S67, the control section 12c may connect tool paths corresponding to elements far from the grip portion v to be gripped when the raw material or the material is processed and tool paths corresponding to elements close thereto to each other in this order. Thus, in the numerical control program generation system 12, the numerical control program generation program 16, and the numerical control program generation method processed thereby according to the present embodiment, it is possible to generate the numerical control program 19 causing a high yield of processing of a material.

In the numerical control program generation system 12, the numerical control program generation program 16, and the numerical control program generation method processed thereby according to the present embodiment, the control section 12c may verify whether or not the raw material or the material, a grip member gripping the raw material or the material, and a tool processing the raw material or the material physically interfere with each other in a case where the numerical control program 19 is executed by the control section 12c in numerical control program verification step S69 after tool path connection step S67. Thus, it is possible to verify whether or not the numerical control program 19 will be appropriately used before being used for processing of the raw material or the material.

In the element creation method in element creation step S62 according to the present embodiment may be performed such that all plane elements are extracted, a plane element including a straight line corresponding to the longest distance between two points is set as the first reference surface 76 among the plane elements, a plane element including a straight line corresponding to the longest distance between two points is set as the second reference surface 77 among plane elements orthogonal to the first reference surface 76, the coordinate axes 78 having an intersection line between the first reference surface 76 and the second reference surface 77 as an X axis and one straight line orthogonal to the first reference surface 76 as a Z axis are created, and an element of the raw material or the material is created by using the created coordinate axes 78 as references. Thus, in the element creation method performed in element creation step S62 according to the present embodiment, it is possible to automatically create an element of a material with high accuracy.

Figure 53:
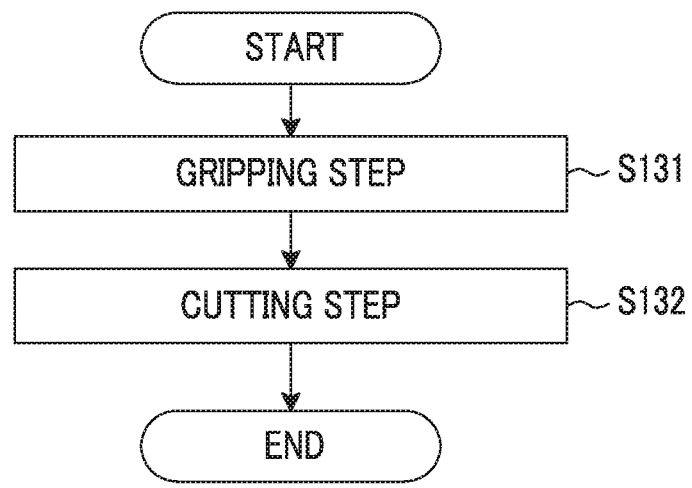
FIG. 53 is a flowchart illustrating an example of a flow of a processing method.

Hereinafter, a description will be made of operations of the machining device 13 and the numerical control program 19. FIG. 53 is a flowchart illustrating an example of a flow of a processing method. The processing method is a process method performed by the control section 13c reading and executing the numerical control program 19 in the machining device 13. The processing method will be described with reference to FIG. 53. The processing method includes, as illustrated in FIG. 53, gripping step S131 and cutting step S132. Hereinafter, gripping step S131 and cutting step S132 will be respectively simply referred to as step S131 and step S132 as appropriate.

Figure 54:
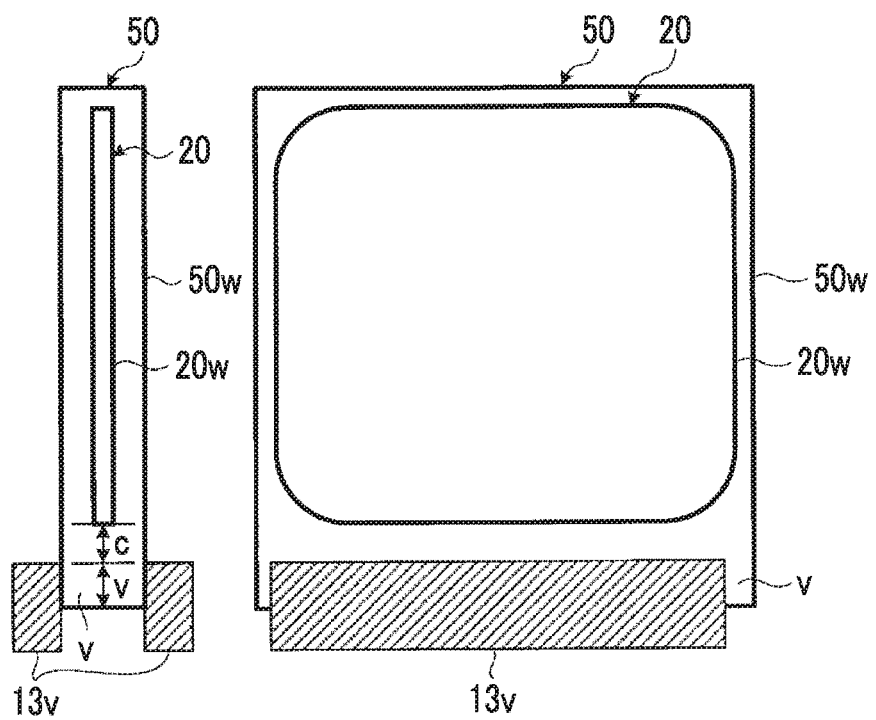
FIG. 54 is a side view illustrating an example of a gripping step.
Figure 55:
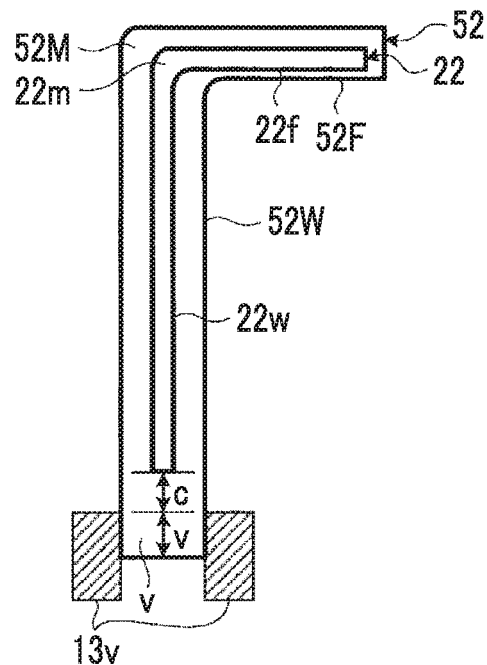
FIG. 55 is a side view illustrating an example of a gripping step.
Figure 56:
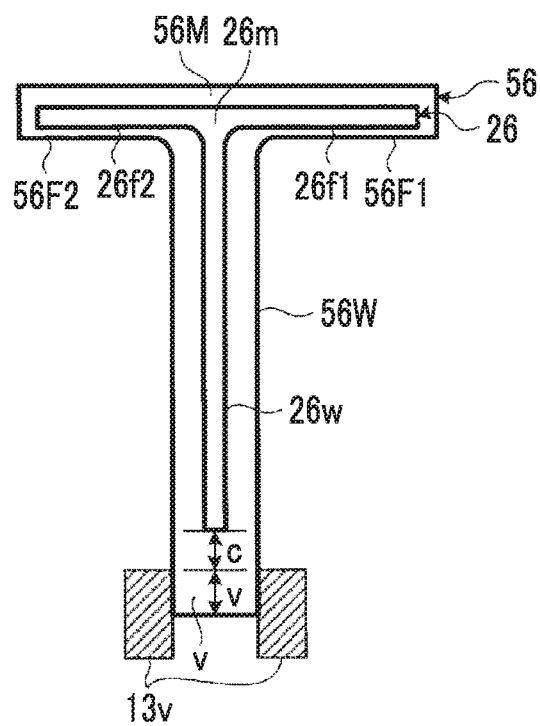
FIG. 56 is a side view illustrating an example of a gripping step.
Figure 57:
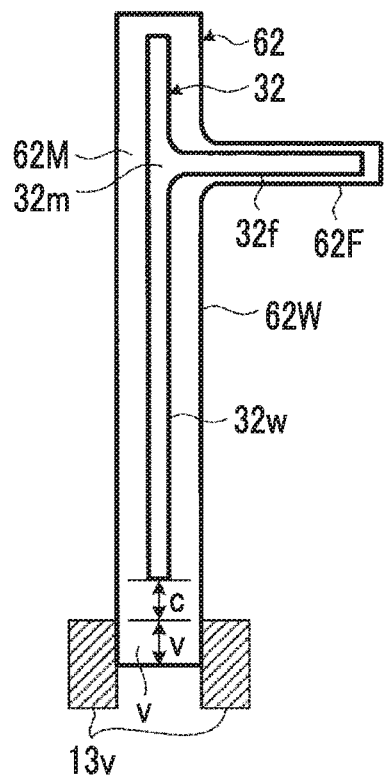
FIG. 57 is a side view illustrating an example of a gripping step.
Figure 58:
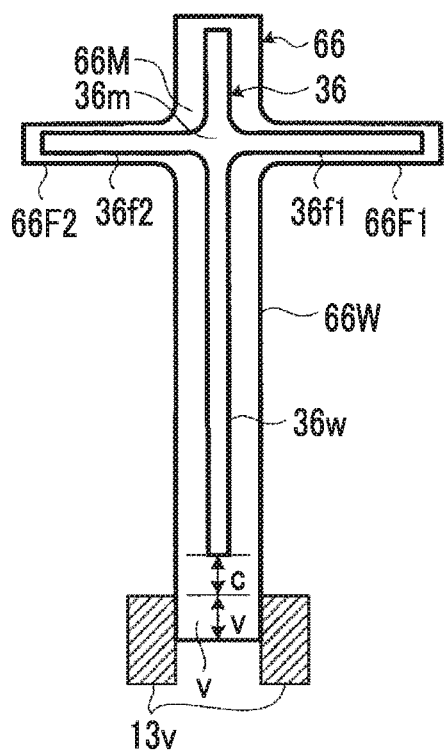
FIG. 58 is a side view illustrating an example of a gripping step.

FIG. 54 is a side view illustrating a state in which the raw material 50 is gripped as an example of gripping step S131. FIG. 55 is a side view illustrating a state in which the raw material 52 is gripped as an example of gripping step S131. FIG. 56 is a side view illustrating a state in which the raw material 56 is gripped as an example of gripping step S131. FIG. 57 is a side view illustrating a state in which the raw material 62 is gripped as an example of gripping step S131. FIG. 58 is a side view illustrating a state in which the raw material 66 is gripped as an example of gripping step S131. Each of the raw material 50, the raw material 52, the raw material 56, the raw material 62, and the raw material 66 is gripped to be sandwiched between grip members 13v of the machining device 13 in the plate thickness direction of the main plate portion at the grip portion v as illustrated in FIGS. 54, 55, 56, 57, and 58.

In the raw material shape determination system 11, the control section 13c causes the raw material to be sandwiched between the grip members 13v of the machining device 13 at the grip portion v in the plate thickness direction of the main plate raw material portion, the raw material being determined by the control section 11c reading and executing the raw material shape determination program 15 (step S131). Consequently, the main plate raw material portion of the raw material gripped between the grip members 13v is directed upward in the vertical direction with respect to the grip portion v. The grip portion v gripped between the grip members 13v is a fixed end of the raw material, and the main plate raw material portion and the flange raw material portion of the raw material not gripped between the grip members 13v are free ends of the raw material. Thus, even if the raw material gripped in the above-described way is subjected to processing, residual stress is not accumulated in the raw material, and thus residual stress accumulated in a material obtained through the processing is considerably reduced.

After the process of step S131, the control section 13c causes the machining device 13 to cut the raw material gripped between the grip members 13v of the machining device (step S132). The control section 13c causes the machining device 13 to cut the raw material in the order of tool paths incorporated into the numerical control program 19.

Figure 59:
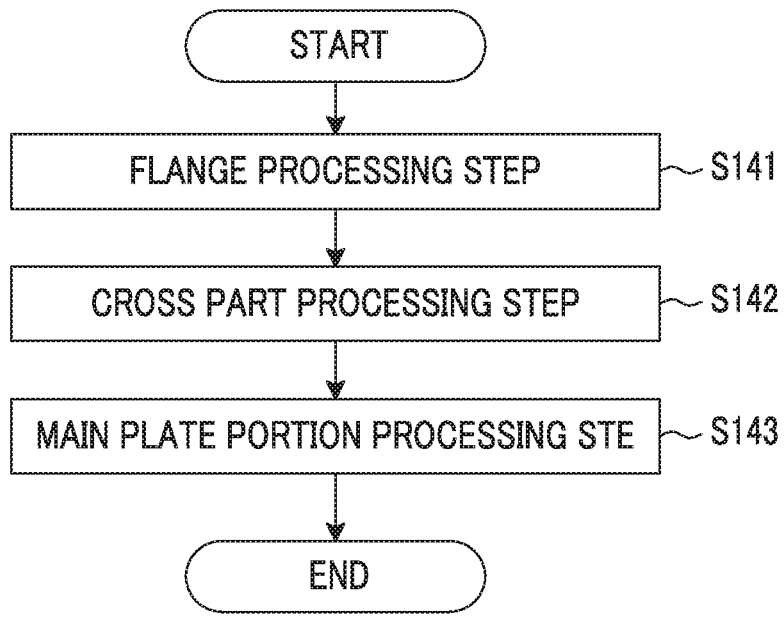
FIG. 59 is a flowchart illustrating a detailed example of a flow of a cutting step.

Hereinafter, details of cutting step S132 will be described. FIG. 59 is a flowchart illustrating a detailed example of a flow of cutting step S132. As illustrated in FIG. 59, cutting step S132 includes flange processing step S141, cross part processing step S142, and main plate portion processing step S143. Hereinafter, flange processing step S141, cross part processing step S142, and main plate portion processing step S143 will be respectively simply referred to as step S141, step S142, and step S143 as appropriate.

In cutting step S132, first, the control section 13c causes the machining device 13 to cut the flange raw material portion of the raw material and thus to form a flange (step S141). The control section 13c causes the machining device 13 to sequentially perform cutting from the flange raw material portion related to a flange of which a flange position is far from the grip portion v. The control section 13c causes the machining device 13 to sequentially cut the flange raw material portion from a distal end part far from the main plate raw material portion.

After the process of step S141, the control section 13c causes the machining device 13 to cut the cross raw material portion of the raw material and thus to form a cross part (step S142). The control section 13c causes the machining device 13 to sequentially perform cutting from the cross raw material portion crossing a flange of which a flange position is far from the grip portion v. The control section 13c causes the machining device 13 to sequentially perform cutting from a side of the cross raw material portion far from the main plate raw material portion.

After the process of step S142, the control section 13c causes the machining device 13 to cut the main plate raw material portion of the raw material and thus to form a main plate portion (step S143). The control section 13c causes the machining device 13 to sequentially perform cutting from a side of the main plate raw material portion far from the grip portion v. The control section 13c may cause the machining device 13 to sequentially perform cutting from a side of the whole of the cross raw material portion and the main plate raw material portion far from the grip portion v with respect to processing of the cross raw material portion and processing of the main plate raw material portion.

Figure 60:
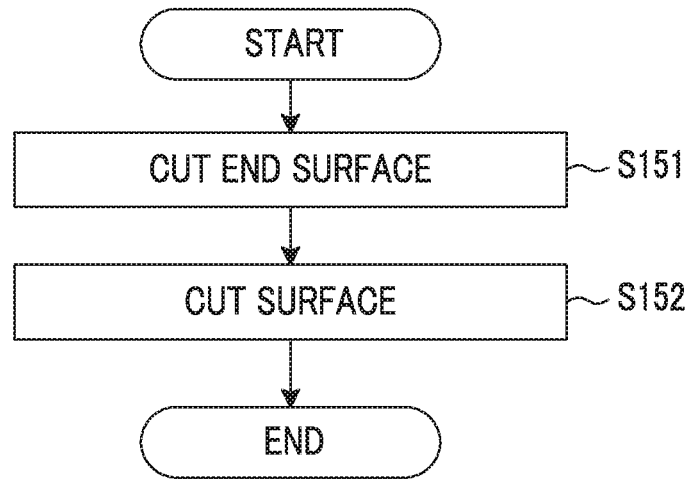
FIG. 60 is a flowchart illustrating another detailed example of a flow of a cutting step.

FIG. 60 is a flowchart illustrating another detailed example of a flow of cutting step S132. As illustrated in FIG. 60, cutting step S132 includes end surface cutting step S151 and surface cutting step S152. Hereinafter, end surface cutting step S151 and surface cutting step S152 will be respectively simply referred to as step S151 and step S152 as appropriate.

In cutting step S132, first, the control section 13c causes the machining device 13 to cut end surfaces at both ends of the raw material in the axial direction (step S151). The control section 13c may cause the machining device 13 to cut end surfaces at both ends of the flange raw material portion in the axial direction, end surfaces at both ends of the cross raw material portion in the axial direction, and end surfaces at both ends of the main plate raw material portion in the axial direction separately three times, or at one time.

After the process of step S151, the control section 13c causes the machining device 13 to cut a surface element along the x axis direction of the raw material (step S152). The control section 13c may cause the machining device 13 to cut surface elements on both sides along the axial direction of the flange raw material portion, complex curved elements on both sides along the axial direction of the cross raw material portion, and surface elements at both ends along the axial direction of the main plate raw material portion, according to the order of step S141, step S142, and step S143.

After the process of cutting step S132, the control section 13c processes a cutting portion of the raw material to a plurality of tab shapes corresponding to a cutout shape for easy separation, and then cuts a portion between the material and the grip portion v. In the above-described way, the material is processed from the raw material according to a processing method which is a process method performed by the control section 13c reading and executing the numerical control program 19 in the machining device 13.

In the machining device 13, the numerical control program 19, and the processing method performed thereby according to the present embodiment, a raw material which is determined in the raw material shape determination system 11, the raw material shape determination program 15, and the raw material shape determination method performed thereby according to the present embodiment is processed, and thus a material is obtained. In the machining device 13, the numerical control program 19, and the processing method performed thereby according to the present embodiment, the numerical control program 19 is generated in the numerical control program generation system 12, the numerical control program generation program 16, and the numerical control program generation method according to the present embodiment. Thus, in the machining device 13, the numerical control program 19, and the processing method performed thereby according to the present embodiment, it is possible to perform processing capable of reducing residual stress accumulated in a raw material or a material from a raw material shape which is as small as possible, and thus to perform causing a high yield efficiently, with high accuracy, and quickly.

In the machining device 13, the numerical control program 19, and the processing method performed thereby according to the present embodiment, flange processing step S141, cross part processing step S142, and main plate portion processing step S143 are performed in this order, and thus processing is sequentially performed from a portion far from the grip portion v toward a portion close thereto. Therefore, an approximate value of static rigidity of a portion closer to the grip portion v than a processing region is not reduced during processing, and thus it is possible to perform processing causing a higher yield.

In the machining device 13, the numerical control program 19, and the processing method performed thereby according to the present embodiment, end surface cutting step S151 and surface cutting step S152 are performed in this order, and thus it is possible to perform processing more quickly and more efficiently.

In the machining device 13, the numerical control program 19, and the processing method performed thereby according to the present embodiment, as incorporated into the numerical control program 19, processing is performed such that, in both of flange processing step S141 and cross part processing step S142, during processing, a ratio between a height of the flange raw material portion or the main plate raw material portion and a plate thickness of the flange raw material portion or the main plate raw material portion is equal to or less than an inverse number of a parameter based on a substance, predefined according to the rigidity of the substance, for example, equal to or less than 5 which is an inverse number of ⅕ (parameter) in a case where the substance is aluminum. Thus, in the machining device 13, the numerical control program 19, and the processing method performed thereby according to the present embodiment, it is possible to more quickly perform processing causing a high yield.

In the machining device 13, the numerical control program 19, and the processing method performed thereby according to the present embodiment, as incorporated into the numerical control program 19, in any one of flange processing step S141, cross part processing step S142, and main plate portion processing step S143, roughing which is cutting for making a raw material close to a shape of a material is performed, and finishing which is cutting for finishing the raw material to the shape of the material is performed after the roughing. In the machining device 13, the numerical control program 19, and the processing method performed thereby according to the present embodiment, it is possible to perform processing more efficiently, more quickly, and with higher accuracy.

In the machining device 13, the numerical control program 19, and the processing method performed thereby according to the present embodiment, as incorporated into the numerical control program 19, processing is performed such that a ratio between a processing margin of roughing and a processing margin of finishing is equal to or less than an inverse number of a parameter based on a substance, predefined according to the rigidity of the substance, for example, equal to or less than 5 which is an inverse number of ⅕ (parameter) in a case where the substance is aluminum.

Thus, in the machining device 13, the numerical control program 19, and the processing method performed thereby according to the present embodiment, it is possible to perform processing more efficiently, more quickly, and with higher accuracy.

Figure 61:
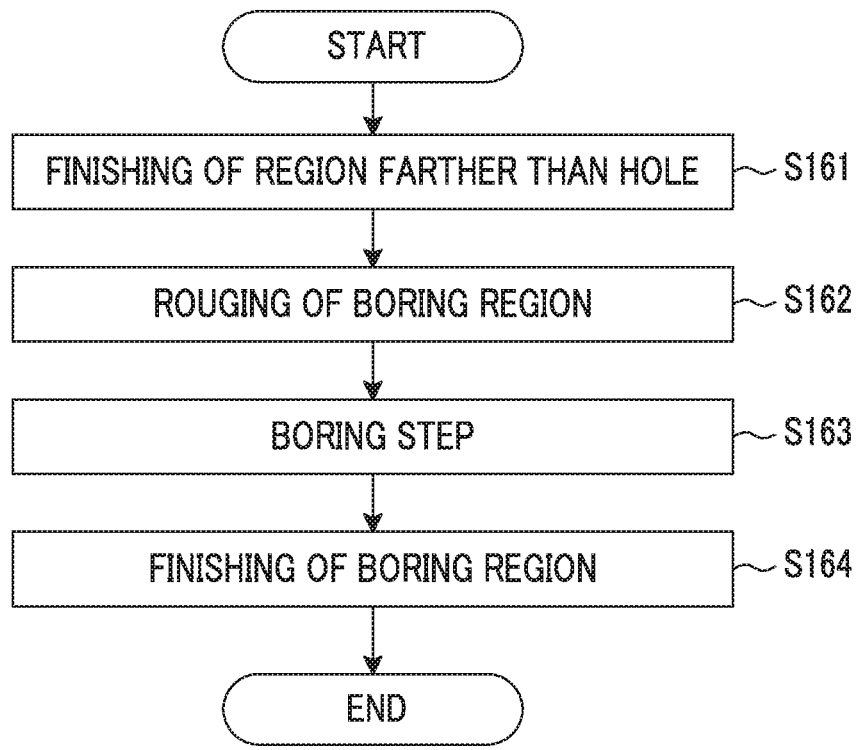
FIG. 61 is a flowchart illustrating a detailed example of a flow of a processing method including a boring step.

Hereinafter, a description will be made of a processing method in a case of including a boring element exemplified in the flange boring element EL3 and the main plate portion boring element EL6 illustrated in FIG. 44. FIG. 61 is a flowchart illustrating a detailed example of a flow of a processing method including boring step S163. The processing method in a case of including a boring element includes, as illustrated in FIG. 61, finishing-before-boring step S161, boring region roughing step S162, boring step S163, and boring region finishing step S164. Hereinafter, finishing-before-boring step S161, boring region roughing step S162, boring step S163, and boring region finishing step S164 will be respectively simply referred to as step S161, step S162, step S163, and step S164 as appropriate.

Figure 62:
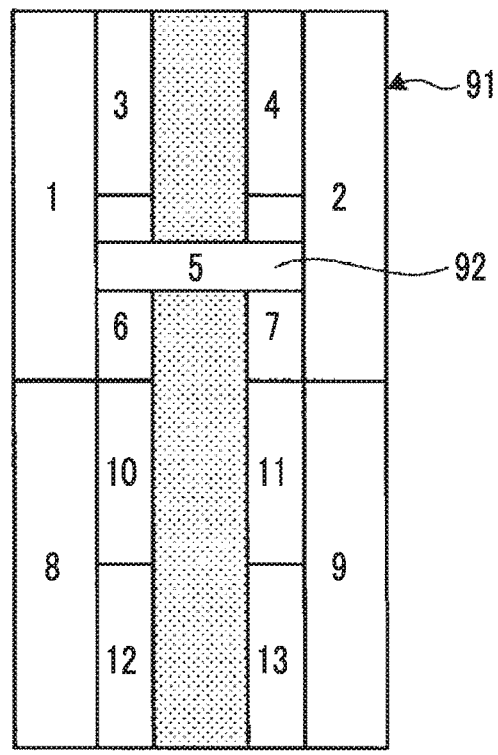
FIG. 62 is a diagram illustrating an example of an order of processing of a main plate raw material portion including a boring part.
Figure 63:
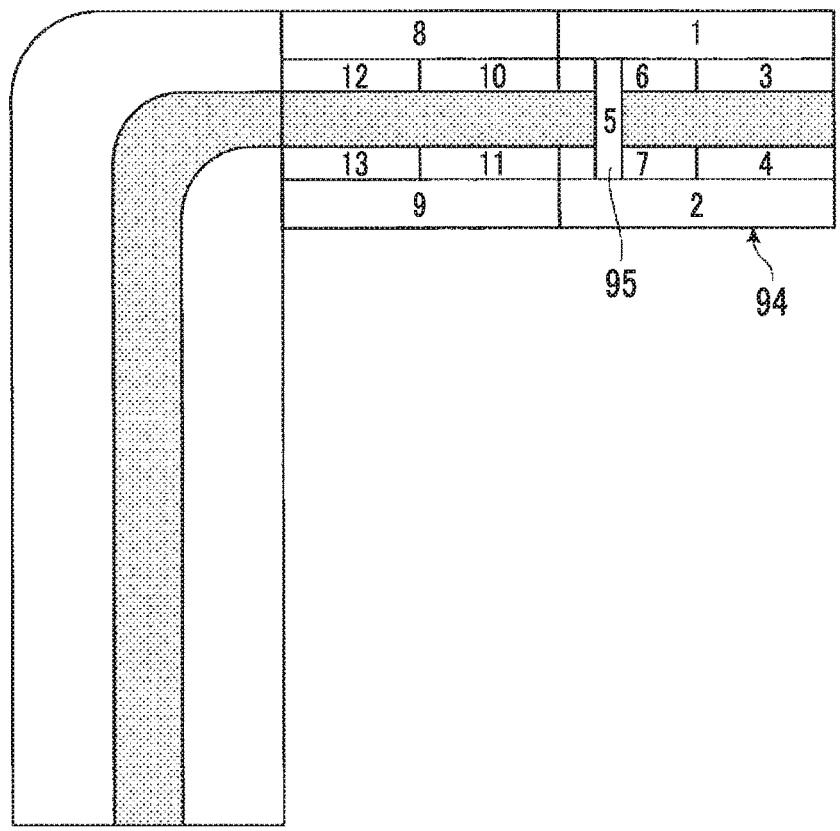
FIG. 63 is a diagram illustrating an example of an order of processing of a flange raw material portion including a boring part.

FIG. 62 is a diagram illustrating an example of a processing order of a main plate raw material portion 91 including a boring part 92. FIG. 63 is a diagram illustrating an example of a processing order of a flange raw material portion 94 including a boring part 95. In FIGS. 62 and 63, the grip portion v is provided on the lower side in the drawing surface although not illustrated. The control section 13c causes the machining device 13 to cut the main plate raw material portion 91 in an order of numerical values illustrated in FIG. 63, for example, from a farther side from the grip portion v toward a closer side thereto, that is, from the upper side in the drawing surface toward the lower side. The control section 13c causes the machining device 13 to cut the flange raw material portion 94 in an order of numerical values illustrated in FIG. 62, that is, from a farther side from the main plate portion toward a closer side thereto.

In the processing method in a case of including the boring element exemplified in the main plate portion boring element EL6 illustrated in FIG. 44, in a case where there is a processing region which is farther from the grip portion v than the boring part 92, that is, there is a processing region which is on a more upper side in the drawing surface of FIG. 62 than the main plate raw material portion 91 illustrated in FIG. 62, the control section 13c causes the machining device 13 to finish the processing region (step S161). In a case where there is no processing region which is farther from the grip portion v than the boring part 92, that is, there is no processing region which is on a more upper side in the drawing surface of FIG. 62 than the main plate raw material portion 91 illustrated in FIG. 62, the control section 13c may omit the process of step S161.

After the process of step S161, the control section 13c causes the machining device 13 to perform roughing on regions including the boring part 92, that is, regions of Nos. 1 and 2 illustrated in FIG. 62 (step S162). After the process of step S162, in a case where there are regions which are farther from the grip portion v than the boring part 92, that is, there are regions of Nos. 3 and 4 illustrated in FIG. 62, the control section 13c causes the machining device 13 to finish the regions of Nos. 3 and 4. Thereafter, the control section 13c causes the machining device 13 to bore the boring part 92, that is, a region of No. 5 illustrated in FIG. 62 (step S163). After the process of step S163, the control section 13c causes the machining device 13 to finish regions including the boring region, that is, regions of Nos. 6 and 7 illustrated in FIG. 62 (step S164). After the process of step S164, the control section 13c causes the machining device 13 to perform processing on Nos. 8 to 13 illustrated in FIG. 62 in the same manner as in the above-described processing.

In the processing method in a case of including the boring element exemplified in the flange boring element EL3 illustrated in FIG. 44, in a case where there is a processing region which is farther from the main plate portion and the grip portion v than the boring part 95, that is, there is a processing region which is located further toward the right side in the drawing surface of FIG. 63 than the flange raw material portion 94 illustrated in FIG. 63, the control section 13c causes the machining device 13 to finish the processing region (step S161). In a case where there is a processing region which is farther from the main plate portion and the grip portion v than the boring part 95, that is, there is no processing region which is located further toward the right side in the drawing surface of FIG. 63 than the flange raw material portion 94 illustrated in FIG. 63, the control section 13c may omit the process of step S161.

After the process of step S161, the control section 13c causes the machining device 13 to perform roughing on regions including the boring part 95, that is, regions of Nos. 1 and 2 illustrated in FIG. 63 (step S162). After the process of step S162, in a case where there are regions which are farther from the main plate portion and the grip portion v than the boring part 95, that is, there are regions of Nos. 3 and 4 illustrated in FIG. 63, the control section 13c causes the machining device 13 to finish the regions of Nos. 3 and 4. Thereafter, the control section 13c causes the machining device 13 to bore the boring part 95, that is, a region of No. 5 illustrated in FIG. 63 (step S163). After the process of step S163, the control section 13c causes the machining device 13 to finish regions including the boring region, that is, regions of Nos. 6 and 7 illustrated in FIG. 63 (step S164). After the process of step S164, the control section 13c causes the machining device 13 to perform processing on Nos. 8 to 13 illustrated in FIG. 63 in the same manner as in the above-described processing.

In the processing method in a case of including a boring element, boring step S163 is performed after boring region roughing step S162 for roughing on a boring region is performed and before boring region finishing step S164 for finishing on the boring region is performed. Thus, in boring step S163, boring is not required to be performed on a roughing region, and a surface which may be roughened in boring step S163 can be finished to a desired shape in boring region finishing step S164. Therefore, in the processing method in a case of including a boring element, it is possible to perform boring quickly and with high accuracy.

In the processing method in a case of including a boring element, boring step S163 is performed after finishing-before-boring step S161 for finishing on a region farther from the grip portion than a boring region is performed and before boring region finishing step S164 for finishing on the boring region. Thus, in boring step S163, it is possible to prevent a reduction in the static rigidity during finishing-before-boring step S161. Therefore, in the processing method in a case of including a boring element, it is possible to also perform processing quickly and with high accuracy with respect to processing on a region farther from a grip portion than a boring region.

Figure 64:
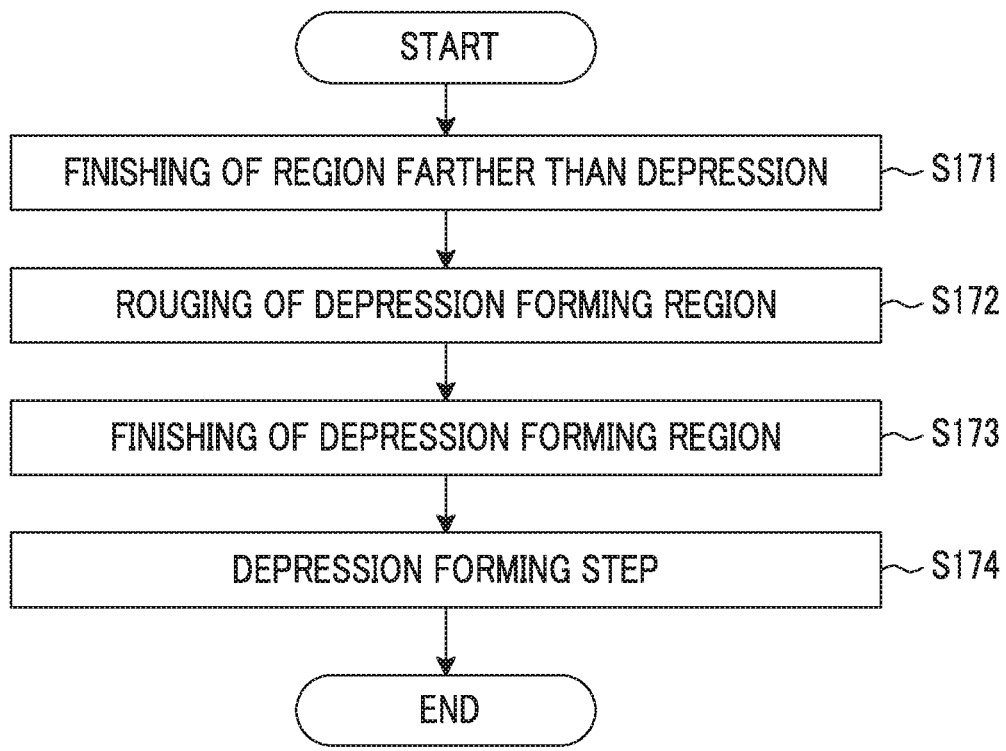
FIG. 64 is a flowchart illustrating a detailed example of a flow of a processing method including a depression forming step.

Hereinafter, a description will be made of a processing method in a case of including a depression forming element. FIG. 64 is a flowchart illustrating a detailed example of a flow of a processing method including depression forming step S174. A processing method in a case of including a depression forming element includes, as illustrated in FIG. 64, finishing-before-depression-formation step S171, depression forming region roughing step S172, depression forming region finishing step S173, and depression forming step S174. Hereinafter, finishing-before-depression-formation step S171, depression forming region roughing step S172, depression forming region finishing step S173, and depression forming step S174 will be respectively simply referred to as step S171, step S172, step S173, and step S174 as appropriate.

Figure 65:
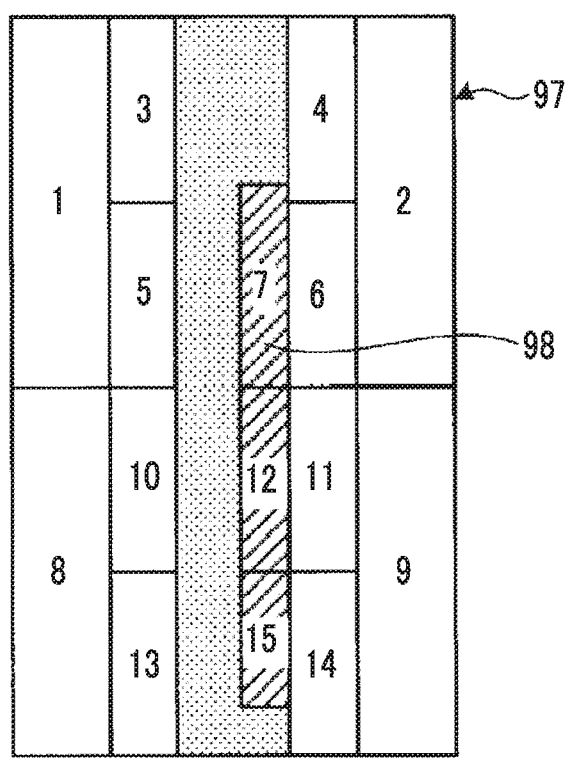
FIG. 65 is a diagram illustrating an example of an order of processing of a portion including a depression forming part.

FIG. 65 is a diagram illustrating an example of a processing order of a main plate raw material portion 97 including a depression forming part 98. In FIG. 65, the grip portion v is provided on the lower side in the drawing surface. The control section 13c causes the machining device 13 to cut the main plate raw material portion 97 in an order of numerical values illustrated in FIG. 65, for example, from a farther side from the grip portion v toward a closer side thereto, that is, from the upper side in the drawing surface toward the lower side.

In the processing method in a case of including a depression forming element, in a case where there is a processing region which is farther from the grip portion v than the depression forming part 98, that is, there is a processing region which is on a more upper side in the drawing surface of FIG. 65 than the main plate raw material portion 97 illustrated in FIG. 65, the control section 13c causes the machining device 13 to finish the processing region (step S171). In a case where there is no processing region which is farther from the grip portion v than the depression forming part 98, that is, there is no processing region which is on a more upper side in the drawing surface of FIG. 65 than the main plate raw material portion 97 illustrated in FIG. 65, the control section 13c may omit the process of step S171.

After the process of step S171, the control section 13c causes the machining device 13 to perform roughing on some regions including the depression forming part 98, that is, regions of Nos. 1 and 2 illustrated in FIG. 65 (step S172). After the process of step S172, in a case where there are regions which are farther from the grip portion v than the depression forming part 98, the control section 13c causes the machining device 13 to finish the regions. Thereafter, the control section 13c causes the machining device 13 to finish some regions including the depression forming part 98, that is, regions of Nos. 3, 4, 5, and 6 illustrated in FIG. 65 (step S173). After the process of step S173, the control section 13c causes the machining device 13 to form a depression in a part of the depression forming part 98, that is, a region of No. 7 illustrated in FIG. 65 (step S174). The control section 13c may not be required to cause the machining device 13 to form a depression in a part of the depression forming part 98, that is, the region of No. 7 illustrated in FIG. 65 in a single stage, and may cause the machining device 13 to separately form a depression in a plurality of stages.

The depression is formed in the region of No. 7 illustrated in FIG. 65 through a series of processes of step S171 to step S174, and then the control section 13c returns to step S172, and causes the machining device 13 to perform roughing on some regions including the depression forming part 98, that is, regions of Nos. 8 and 9 illustrated in FIG. 65 (step S172). After the process of step S172, in a case where there are regions which are farther from the grip portion v than the depression forming part 98, the control section 13c causes the machining device 13 to finish the regions. Thereafter, the control section 13c causes the machining device 13 to finish some regions including the depression forming part 98, that is, regions of Nos. 10, 11, 12, and 13 illustrated in FIG. 65 (step S173). After the process of step S173, the control section 13c causes the machining device 13 to sequentially form a depression in a part of the depression forming part 98, that is, regions of No. 12 and 15 illustrated in FIG. 65 (step S174). The control section 13c may not be required to cause the machining device 13 to form a depression in a part of the depression forming part 98, that is, the regions of No. 12 and 15 illustrated in FIG. 65 in two stages, and may cause the machining device 13 to separately form a depression in three or more stages.

In the processing method in a case of including a depression forming element, depression forming step S174 is performed after depression forming region finishing step S173 in accordance with processing pitches in finishing on a region including the depression forming part 98, that is, processing pitches of Nos. 3 to 6 and 10 to 14 illustrated in FIG. 65. Thus, in depression forming step S174, it is possible to prevent a reduction in the static rigidity during finishing-before-depression-formation step S171, depression forming region roughing step S172, and depression forming region finishing step S173. Therefore, in the processing method in a case of including a depression forming element, it is possible to also perform processing quickly and with high accuracy with respect to processing on a region farther from a grip portion than a depression forming region.

REFERENCE SIGNS LIST

10 MATERIAL PROCESSING SYSTEM
11 RAW MATERIAL SHAPE DETERMINATION SYSTEM
11c, 12c, AND 13c CONTROL SECTION
12 NUMERICAL CONTROL PROGRAM GENERATION SYSTEM
13 MACHINING DEVICE
15 RAW MATERIAL SHAPE DETERMINATION PROGRAM
16 NUMERICAL CONTROL PROGRAM GENERATION PROGRAM
17 COMPUTER AIDED DESIGN PROGRAM
18 COMPUTER AIDED MANUFACTURING PROGRAM
19 NUMERICAL CONTROL PROGRAM
20, 22, 24, 26, 28, 32, 36, AND 38 MATERIAL
20w, 22w, 24w, 26w, 28w, 32w, 34w, 36w, AND 38w MAIN PLATE PORTION
22f, 24f, 26f1, 26f2, 28f1, 28f2, 32f, 34f, 36f1, 36f2, 38f1, AND 38f2 FLANGE
22m, 24m, 26m, 28m, 32m, 34m, 36m, AND 38m CROSS PART
41 CURVED PORTION
42 TAPERED PORTION
43 AND 44 STEP PORTION
50, 52, 54, 56, 58, 62, 64, 66, AND 68 RAW MATERIAL
50W, 52W, 54W, 56W, 58W, 62W, 64W, 66W, AND 68W MAIN PLATE RAW MATERIAL PORTION
52F, 54F, 56F1, 56F2, 58F1, 58F2, 62F, 64F, 66F1, 66F2, 168F1, AND 68F2 FLANGE RAW MATERIAL PORTION
52M, 54M, 56M, 58M, 62M, 64M, 66M, AND 68M CROSS RAW MATERIAL PART
70 MATERIAL DESIGN MODEL
72 IDENTIFICATION CONDITION
74 SIMILAR MATERIAL DESIGN MODEL
76 FIRST REFERENCE SURFACE
77 SECOND REFERENCE SURFACE
78 COORDINATE AXIS
79 MODEL ELEMENT NAME
80 RAW MATERIAL DESIGN MODEL
82 ELEMENT DIVISION METHOD
83 roughing TOOL CONDITION
84 FINISHING TOOL CONDITION
91 AND 97 MAIN PLATE RAW MATERIAL PORTION
92 AND 95 BORING PART
94 FLANGE RAW MATERIAL PORTION
98 DEPRESSION FORMING PART

The invention claimed is:

1. A method for material processing by determining a shape of a raw material used for processing of a material having a main plate portion which has a flat shape, is formed to extend along an axial direction, and includes a surface element including a straight line corresponding to the longest distance between two points of the main plate portion, and at least one flange which is formed to extend in the axial direction, and is provided to extend in a direction intersecting the surface element from the main plate portion, the method performed by a computer and comprising:
a material information acquisition step of acquiring information regarding a shape of the material;
a flange classification step of classifying the flange on the basis of the acquired information regarding the shape of the material, wherein, in the flange classification step, the flange present on one surface side at one end part of the main plate portion is classified as an L type flange, the flange present on both surface sides at one end part of the main plate portion is classified as a T type flange, the flange present on one surface side other than end parts of the main plate portion is classified as a counterclockwise-T type flange, and the flange present on both surface sides other than the end parts of the main plate portion is classified as a "+" type flange;
a grip portion setting step of setting a grip portion to be gripped during processing of the material at one end part of the main plate portion on the basis of the acquired information regarding the shape of the material and classification information of the flange in the flange classification step;
a raw material shape calculation step of calculating a shape of the raw material on the basis of the information regarding the shape of the material acquired in the material information acquisition step, the classification information of the flange in the flange classification step, and setting information of the grip portion in the grip portion setting step; and
a controlling step of controlling a cutting of the raw material into the shape of the material, said cutting including removing the grip portion.

2. The method according to claim 1,
wherein, in the grip portion setting step, in a case where the L type flange or the T type flange is provided at both end parts of the main plate portion, the grip portion is set at one end part of the main plate portion; in a case where the L type flange or the T type flange is provided at one end part of the main plate portion, the grip portion is set at an end part of the main plate portion not having the L type flange or the T type flange; and, in a case where the L type flange or the T type flange is not provided, the grip portion is set at an end part of the main plate portion farthest from the "+" type flange, or at an end part of the main plate portion on a side on which an angle formed between the counterclockwise-T type flange and the main plate portion is a right angle or an obtuse angle.

3. The method according to claim 1,
wherein, in the raw material shape calculation step, a shape of the raw material is calculated on the basis of a height, a width, and a length in the axial direction of the main plate portion, the classification information of the flange, a flange position which is a position of a basal end part of the flange in the main plate portion, a flange angle which is an angle formed between the main plate portion and the flange, a flange height which is a length from the main plate portion to a distal end part of the flange, a width and a length in the axial direction of the flange, and a position where the grip portion is set.

4. The method according to claim 3,
wherein the raw material shape calculation step includes
a main plate portion raw material height calculation step of calculating a main plate portion raw material height which is a length extending in a direction orthogonal to the axial direction along the main plate portion in a main plate raw material portion which is included in the raw material and will be processed to the main plate portion, on the basis of a sum of a height of the main plate portion, a height of an excess margin which is an outer peripheral margin, a height of the grip portion, and a height of a cutting portion provided between an end part of the main plate portion and the grip portion,
a main plate portion raw material length calculation step of calculating a main plate portion raw material length which is a length extending in the axial direction along the main plate portion in the main plate raw material portion, on the basis of a sum of a length of the main plate portion in the axial direction and twice the length of the excess margin,
a main plate portion raw material plate thickness calculation step of calculating a main plate portion raw material plate thickness which is a length extending in a direction orthogonal to the main plate portion in the main plate raw material portion, as a length equal to or more than a product of a value obtained by subtracting the height of the grip portion from the main plate portion raw material height, and a predetermined ratio determined depending on a substance of the raw material,
a flange raw material height calculation step of calculating a flange raw material height which is a length extending in a direction orthogonal to the axial direction along the flange in a flange raw material portion which is included in the raw material and will be processed to the flange, on the basis of a sum of a height of the flange and the height of the excess margin,
a flange raw material length calculation step of calculating a flange raw material length which is a length extending in the axial direction along the flange in the flange raw material portion, on the basis of a sum of a length of the flange in the axial direction and twice the length of the excess margin, and
a flange raw material plate thickness calculation step of calculating a flange raw material plate thickness which is a length extending in a direction orthogonal to the flange in the flange raw material portion, as a length equal to or more than a product of the flange raw material height and the predetermined ratio.

5. The method according to claim 4,
wherein the raw material shape calculation step further includes a flange raw material plate thickness correction step of leaving the excess margin on an end part side of the main plate portion in the flange by correcting the flange raw material plate thickness in a case where the flange is an L type flange or a T type flange.

6. The method according to claim 4,
wherein the raw material shape calculation step further includes
a raw material height calculation step of calculating a raw material height which is a height of the raw material on the basis of the main plate portion raw material height, the flange position, a sine product of the flange raw material height and the flange angle, and a cosine product of the flange raw material plate thickness and the flange angle,
a raw material length calculation step of calculating a larger length of the main plate portion raw material length and the flange raw material length as a raw material length which is a length of the raw material, and
a raw material width calculation step of calculating a raw material width which is a width of the raw material on the basis of the main plate portion raw material plate thickness, a cosine product of the flange raw material height and the flange angle, and a sine product of the flange raw material plate thickness and the flange angle.

7. The method according to claim 1,
wherein the raw material shape calculation step further includes a correction step of correcting a shape of the raw material by using a thickness of the thickest portion of the main plate portion or the flange as a width of the main plate portion or the flange in a case where the main plate portion or the flange includes any one of a curved portion, a tapered portion, and a step portion.

8. A processing method, comprising:
a determining step of determining a shape of a raw material used for processing of a material having a main plate portion which has a flat shape, is formed to extend along an axial direction, and includes a surface element including a straight line corresponding to the longest distance between two points of the main plate portion, and at least one flange which is formed to extend in the axial direction, and is provided to extend in a direction intersecting the surface element from the main plate portion, the determining step comprising:
a material information acquisition step of acquiring information regarding a shape of the material;
a flange classification step of classifying the flange on the basis of the acquired information regarding the shape of the material, wherein, in the flange classification step, the flange present on one surface side at one end part of the main plate portion is classified as an L type flange, the flange present on both surface sides at one end part of the main plate portion is classified as a T type flange, the flange present on one surface side other than end parts of the main plate portion is classified as a counterclockwise-T type flange, and the flange present on both surface sides other than the end parts of the main plate portion is classified as a "+" type flange;
a grip portion setting step of setting a grip portion to be gripped during processing of the material at one end part of the main plate portion on the basis of the acquired information regarding the shape of the material and classification information of the flange in the flange classification step; and
a raw material shape calculation step of calculating a shape of the raw material on the basis of the information regarding the shape of the material acquired in the material information acquisition step, the classification information of the flange in the flange classification step, and setting information of the grip portion in the grip portion setting step;

a gripping step of gripping the raw material determined in the determining step at the grip portion; and a cutting step of cutting the raw material into the shape of the material in an order of a portion closer to the grip portion from a portion farther from the grip portion, said cutting including removing the grip portion.

9. The processing method according to claim 8,
wherein the cutting step includes
a flange processing step of forming the flange by cutting a flange raw material portion which is included in the raw material and will be processed to the flange,
a cross part processing step of forming a cross part between the flange and the main plate portion by cutting a cross raw material portion which is a portion where the flange raw material portion crosses a main plate raw material portion which is included in the raw material and is to be processed to the main plate portion after the flange processing step, and
a main plate portion processing step of forming the main plate portion by cutting the main plate raw material portion after the cross part processing step.

10. The processing method according to claim 9,
wherein, in all of the flange processing step, the cross part processing step, and the main plate portion processing step, end surfaces at both ends in the axial direction are cut, and then a surface along the axial direction is cut.

11. The processing method according to claim 9,
wherein, in both of the flange processing step and the main plate portion processing step, during processing, a ratio of a plate thickness of the flange raw material portion or the main plate raw material portion to a height of the flange raw material portion or the main plate raw material portion is determined based on a substance of the raw material.

12. The processing method according to according to claim 9,
wherein, in all of the flange processing step, the cross part processing step, and the main plate portion processing step,
roughing, which is cutting for causing the raw material to approach a shape of the material, is performed, and
finishing, in which a rotational speed of a tool, a processing margin, and a processing pitch are all smaller than in the roughing and which is cutting for finishing the raw material to the shape of the material, is performed after the roughing.

13. The processing method according to claim 12,
wherein a ratio of a processing margin in the finishing to a processing margin in the roughing is determined based on a substance of the raw material.

14. The processing method according to claim 12, further comprising:
a boring step of making a hole in the raw material,
wherein the boring step is performed after performing the roughing on a region in which the hole is made and before performing the finishing on the region in which the hole is made.

15. The processing method according to claim 12, further comprising:
a boring step of making a hole in the raw material,
wherein the boring step is performed after performing the finishing on a region farther from the grip portion than a region in which the hole is made and before performing the finishing on the region in which the hole is made.

16. The processing method according to claim 12, further comprising:
a depression forming step of forming a depression in the raw material,
wherein the depression forming step is sequentially performed after the finishing in accordance with a processing pitch in the finishing on a region in which the depression is formed.

17. A system for material processing by determining a shape of a raw material used for processing of a material having a main plate portion which has a flat shape, is formed to extend along an axial direction, and includes a surface element including a straight line corresponding to the longest distance between two points of the main plate portion, and at least one flange which is formed to extend in the axial direction, and is provided to extend in a direction intersecting the surface element from the main plate portion, the system comprising:
a control section,
wherein the control section uses a computer to execute respective steps including
a material information acquisition step of acquiring information regarding a shape of the material,
a flange classification step of classifying the flange on the basis of the acquired information regarding the shape of the material, wherein, in the flange classification step, the flange present on one surface side at one end part of the main plate portion is classified as an L type flange, the flange present on both surface sides at one end part of the main plate portion is classified as a T type flange, the flange present on one surface side other than end parts of the main plate portion is classified as a counterclockwise-T type flange, and the flange present on both surface sides other than the end parts of the main plate portion is classified as a "+" type flange,
a grip portion setting step of setting a grip portion to be gripped during processing of the material at one end part of the main plate portion on the basis of the acquired information regarding the shape of the material and classification information of the flange in the flange classification step,
a raw material shape calculation step of calculating a shape of the raw material on the basis of the information regarding the shape of the material acquired in the material information acquisition step, the classification information of the flange in the flange classification step, and setting information of the grip portion in the grip portion setting step; and
a controlling step of controlling a cutting of the raw material into the shape of the material, said cutting including removing the grip portion.

18. A non-transitory computer readable medium containing a program for material processing by determining a shape of a raw material used for processing of a material having a main plate portion which has a flat shape, is formed to extend along an axial direction, and includes a surface element including a straight line corresponding to the longest distance between two points of the main plate portion, and at least one flange which is formed to extend in the axial direction, and is provided to extend in a direction intersecting the surface element from the main plate portion, the program causing a computer to execute:
a material information acquisition step of acquiring information regarding a shape of the material;

a flange classification step of classifying the flange on the basis of the acquired information regarding the shape of the material, wherein, in the flange classification step, the flange present on one surface side at one end part of the main plate portion is classified as an L type flange, the flange present on both surface sides at one end part of the main plate portion is classified as a T type flange, the flange present on one surface side other than end parts of the main plate portion is classified as a counterclockwise-T type flange, and the flange present on both surface sides other than the end parts of the main plate portion is classified as a "+" type flange;

a grip portion setting step of setting a grip portion to be gripped during processing of the material at one end part of the main plate portion on the basis of the acquired information regarding the shape of the material and classification information of the flange in the flange classification step;

a raw material shape calculation step of calculating a shape of the raw material on the basis of the information regarding the shape of the material acquired in the material information acquisition step, the classification information of the flange in the flange classification step, and setting information of the grip portion in the grip portion setting step; and a controlling step of controlling a cutting of the raw material into the shape of the material, said cutting including removing the grip portion.

* * * * *